United States Patent
Reznicek et al.

(10) Patent No.: US 11,646,372 B2
(45) Date of Patent: May 9, 2023

(54) VERTICAL TRANSISTOR FLOATING BODY ONE TRANSISTOR DRAM MEMORY CELL

(71) Applicant: International Business Machines Corporation, Armonk, NY (US)

(72) Inventors: Alexander Reznicek, Troy, NY (US); Karthik Balakrishnan, Scarsdale, NY (US); Bahman Hekmatshoartabari, White Plains, NY (US); Clint Jason Oteri, East Greenbush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/026,199

(22) Filed: Sep. 19, 2020

(65) Prior Publication Data
US 2022/0093794 A1 Mar. 24, 2022

(51) Int. Cl.
*H01L 29/78* (2006.01)
*H01L 29/161* (2006.01)
(Continued)

(52) U.S. Cl.
CPC .... *H01L 29/7827* (2013.01); *H01L 27/10802* (2013.01); *H01L 27/10805* (2013.01); *H01L 29/161* (2013.01); *H01L 29/66666* (2013.01)

(58) Field of Classification Search
CPC ........... H01L 29/7827; H01L 27/10802; H01L 27/10805; H01L 29/161; H01L 29/66666;
(Continued)

(56) References Cited

U.S. PATENT DOCUMENTS

| 6,454,860 B2 | 9/2002 | Metzner et al. |
| 7,323,380 B2 | 1/2008 | Forbes |

(Continued)

FOREIGN PATENT DOCUMENTS

EP 1056135 A1 * 11/2000 ....... H01L 29/66484

OTHER PUBLICATIONS

International Search Report and the Written Opinion of the International Searching Authority, dated Jan. 10, 2022, International application No. PCT/EP2021/075636.

*Primary Examiner* — Edward Chin
(74) *Attorney, Agent, or Firm* — Daniel P. Morris; David Mattheis; Lou Percello, Attorney, PLLC

(57) ABSTRACT

A Vertical Field Effect Transistor (VFET) and/or a one transistor dynamic random access memory 1T DRAM that has a substrate with a horizontal substrate surface, a source disposed on the horizontal substrate surface, a drain, and a channel. The channel has a channel top, a channel bottom, a first channel side, a second channel side, and two channel ends. The channel top is connected to the drain. The channel bottom is connected to the source. The channel is vertical and perpendicular to the substrate surface.

A first gate stack interfaces with the first channel side and a second gate stack interfaces with the second channel side. A single external gate connection electrically connects the first gate stack and the second gate stack A gate bias (voltage) applied on the single external gate connection biases the first channel side in accumulation and biases the second channel side in inversion. The first gate stack is made of a first high-k dielectric layer and a first gate metal layer. The second gate stack is made of a second high-k dielectric layer and a second gate metal layer. The single external gate electrical connection is made to the first gate metal layer and the second gate metal layer. The first and second channel side can be made of the same or different materials. The first and second gate metal layer can be made of the same or different materials.

One of the channel ends forms a floating body region, i.e. a capacitance, used by the 1T DRAM.

20 Claims, 40 Drawing Sheets

(51) Int. Cl.
*H01L 29/66* (2006.01)
*H01L 27/108* (2006.01)

(58) Field of Classification Search
CPC .............. H01L 29/1033; H01L 29/0649; H01L 29/0692; H01L 29/7828; H01L 29/7831; H01L 29/7841
See application file for complete search history.

(56) References Cited

U.S. PATENT DOCUMENTS

| | | | |
|---|---|---|---|
| 7,999,313 B2 * | 8/2011 | Kim | H01L 27/10802 257/E21.336 |
| 8,063,404 B2 | 11/2011 | Renn | |
| 8,202,781 B2 | 6/2012 | Kim | |
| 8,501,629 B2 | 8/2013 | Tang et al. | |
| 8,859,359 B2 | 10/2014 | Tang et al. | |
| 9,293,185 B2 | 3/2016 | Gonzalez et al. | |
| 9,419,078 B2 * | 8/2016 | Cheng | H01L 21/26586 |
| 9,508,854 B2 | 11/2016 | Biswas et al. | |
| 9,559,216 B2 | 1/2017 | Banna et al. | |
| 9,799,761 B2 | 10/2017 | Or-Bach et al. | |
| 9,806,173 B2 | 10/2017 | Balakrishnan et al. | |
| 10,008,511 B2 | 1/2018 | Lee | |
| 10,008,596 B2 | 6/2018 | Balakrishnan et al. | |
| 11,139,296 B2 * | 10/2021 | Sharma | H01L 21/823807 |
| 11,158,598 B1 * | 10/2021 | Or-Bach | H01L 25/50 |
| 2012/0161229 A1 * | 6/2012 | Kwon | H01L 27/108 438/270 |
| 2016/0086970 A1 * | 3/2016 | Peng | H01L 27/11582 257/324 |
| 2016/0118463 A1 * | 4/2016 | Cheng | H01L 29/785 257/192 |
| 2019/0067459 A1 * | 2/2019 | Balakrishnan | H01L 27/10802 |
| 2019/0189625 A1 * | 6/2019 | Cheng | H01L 29/42364 |
| 2019/0371802 A1 * | 12/2019 | Morris | H01L 28/60 |
| 2020/0251474 A1 * | 8/2020 | Reznicek | H01L 29/42392 |
| 2021/0143284 A1 * | 5/2021 | Karda | H01L 29/6675 |

\* cited by examiner

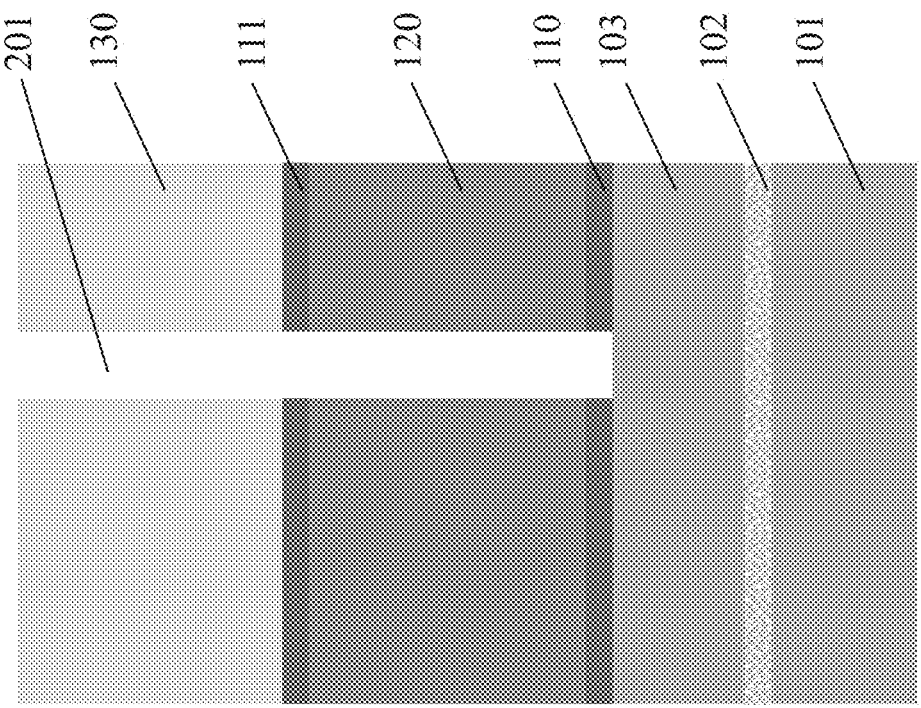

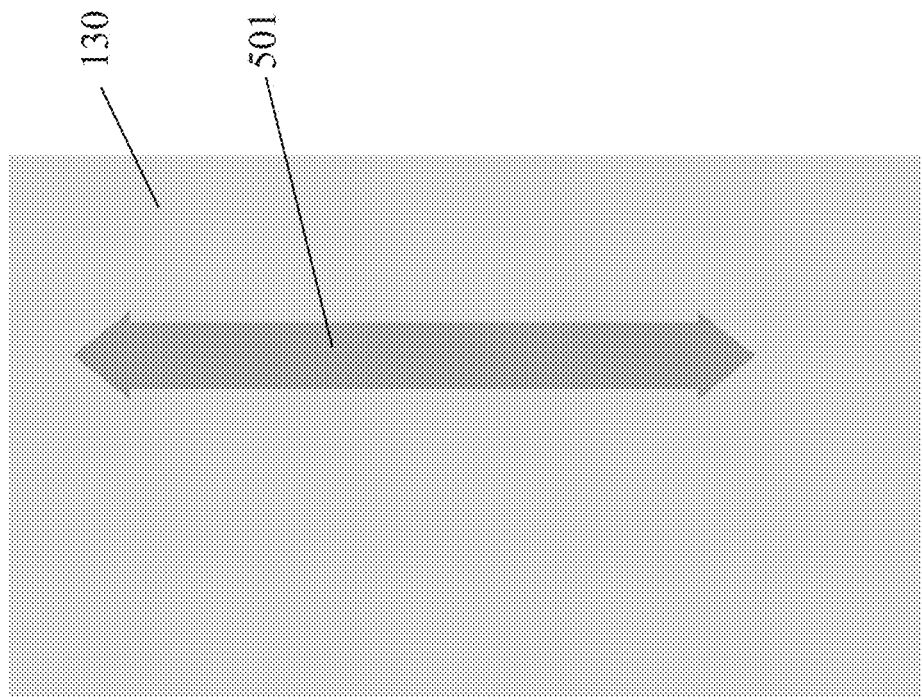
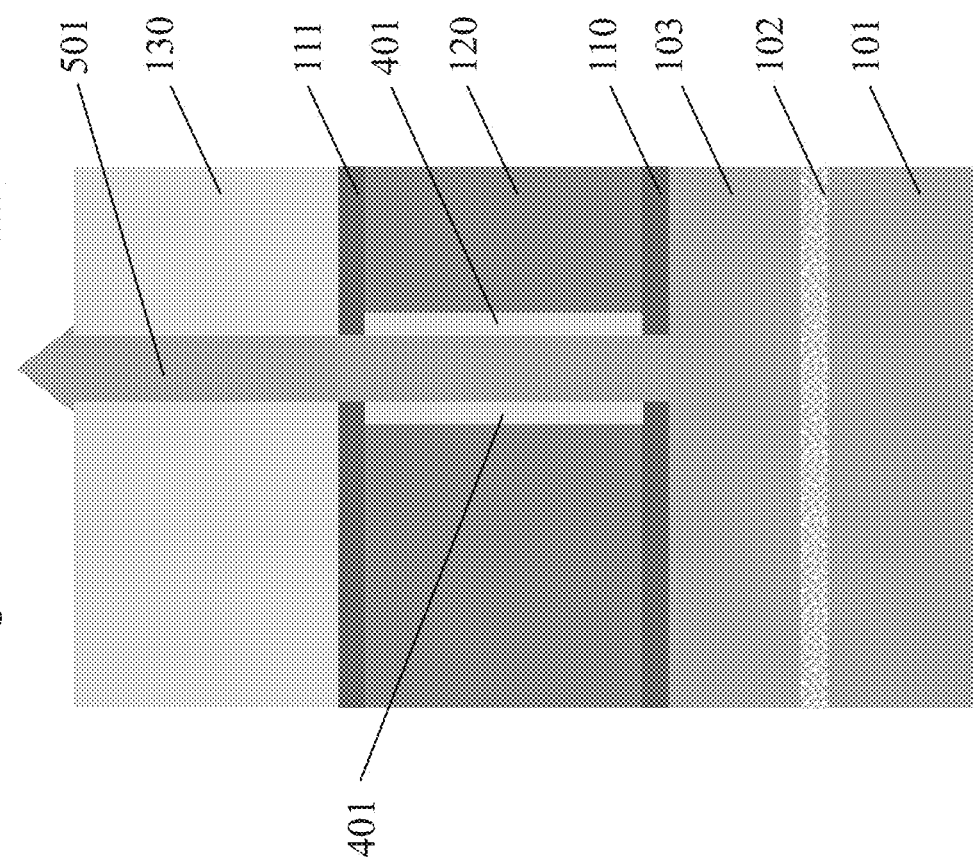
Figure 5A
Figure 5B

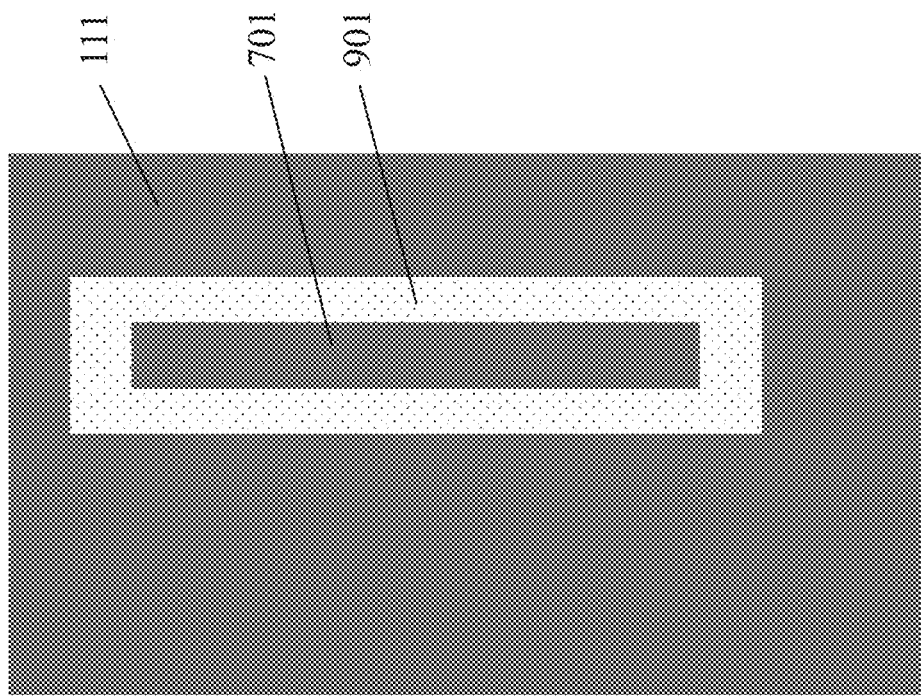
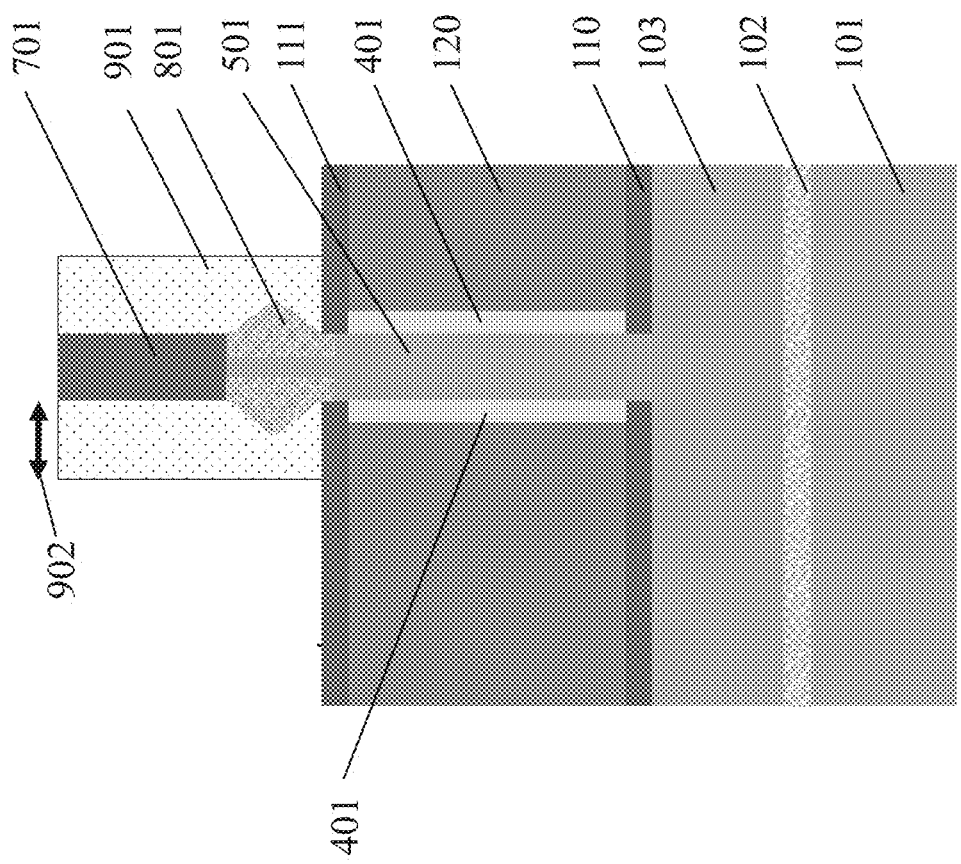
Figure 9A
Figure 9B

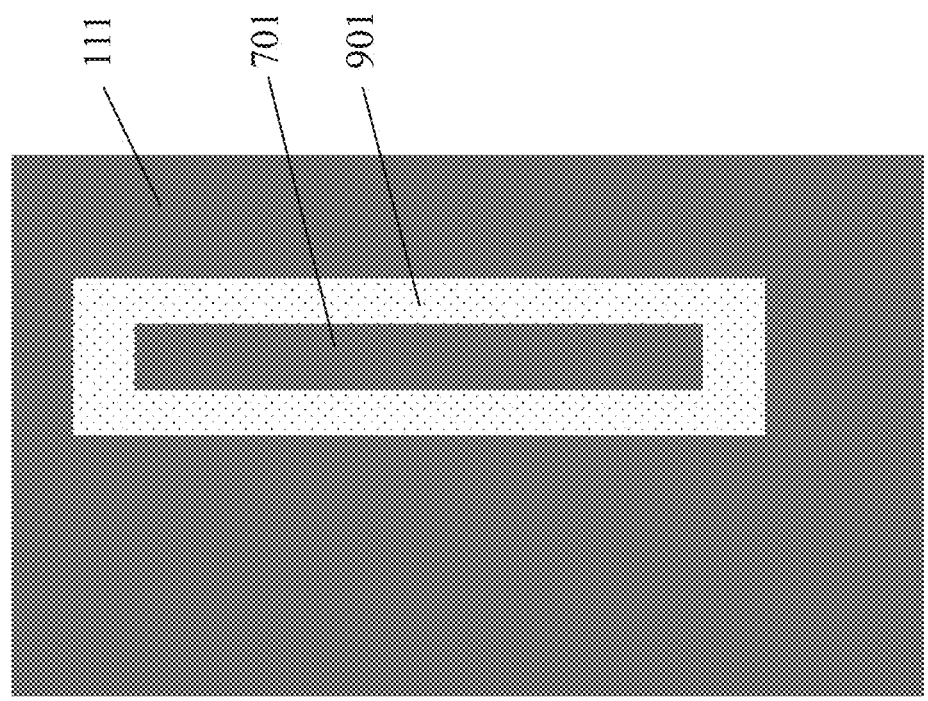
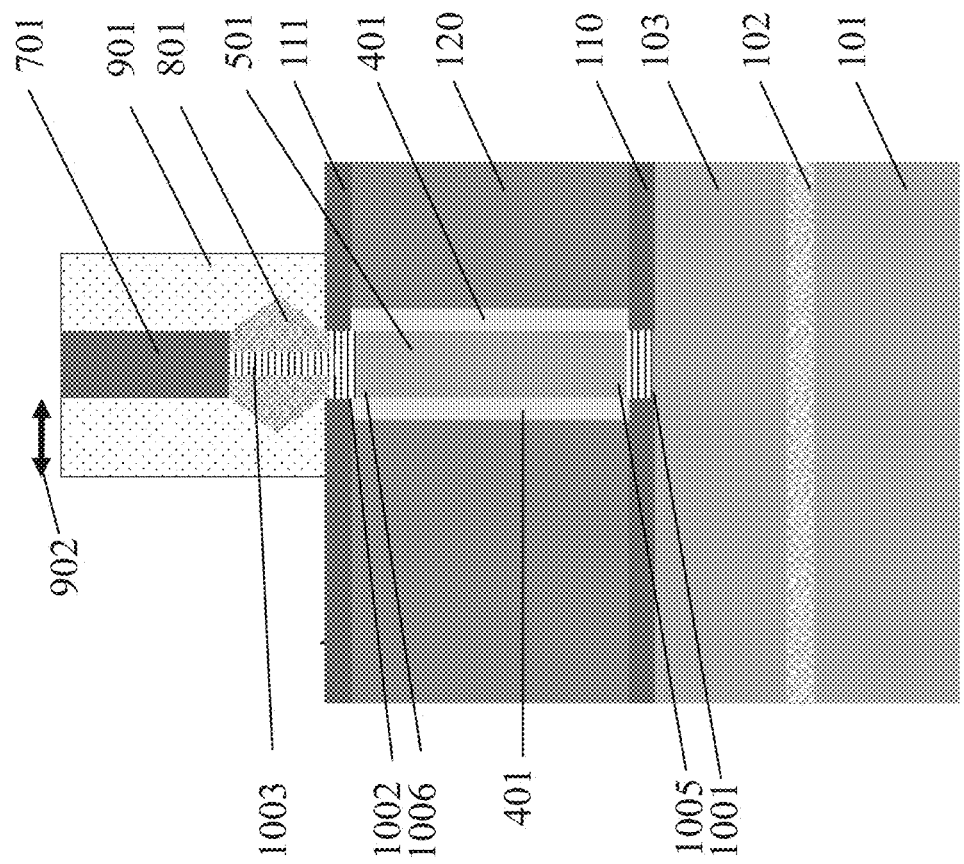
Figure 10A
Figure 10B

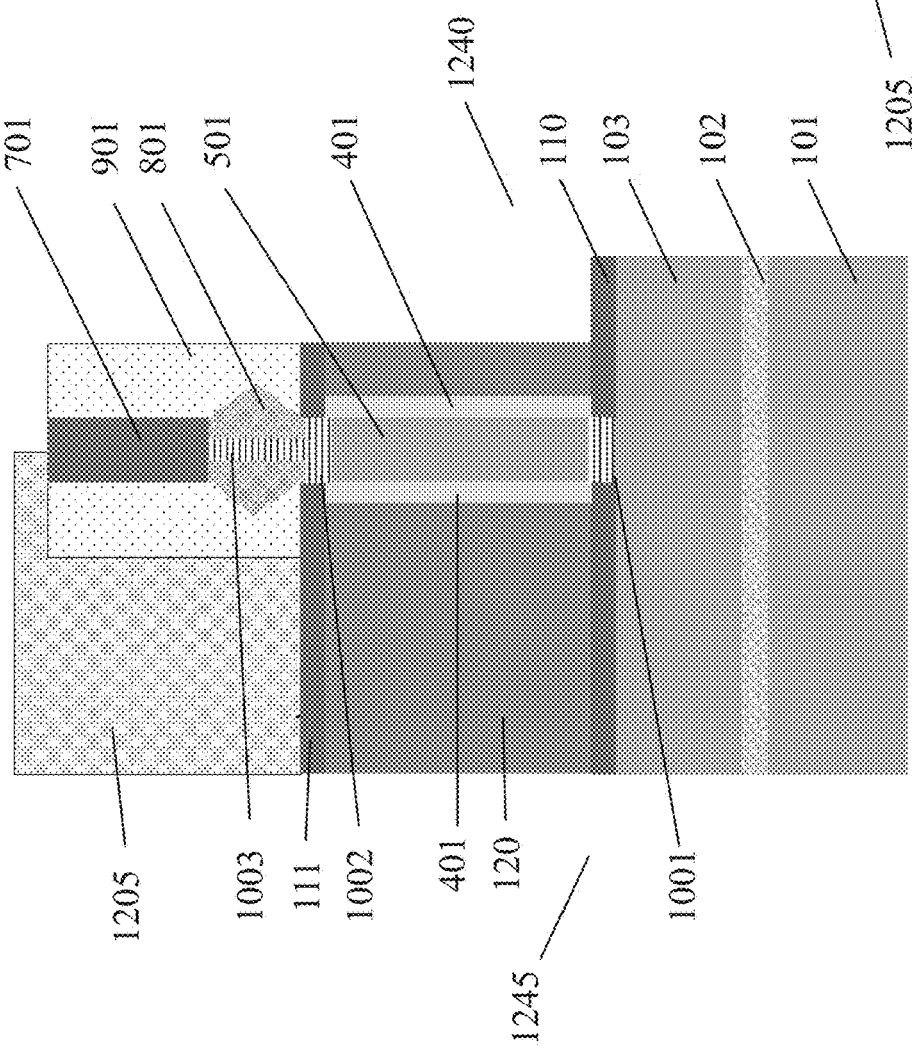
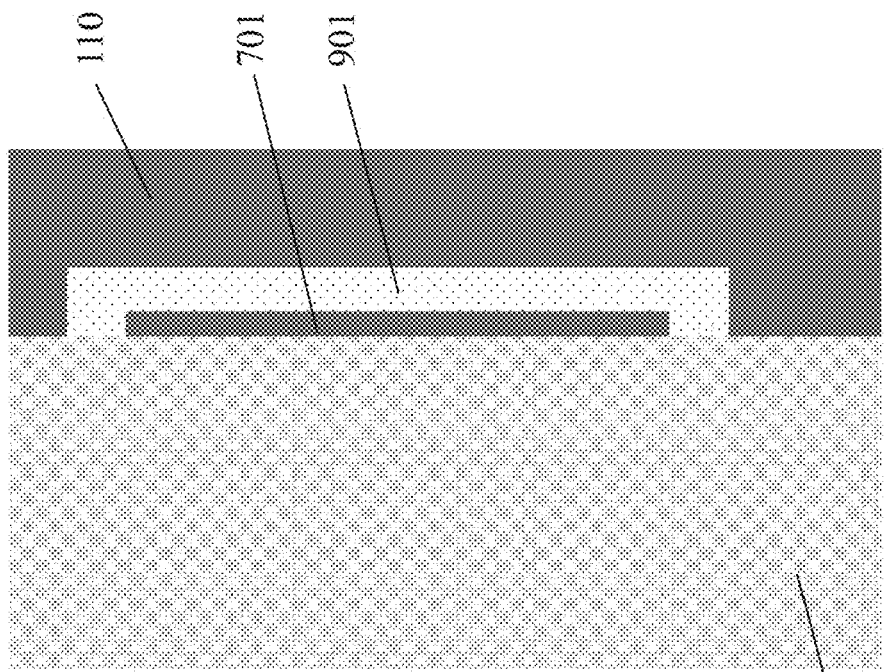
Figure 13A
Figure 13B

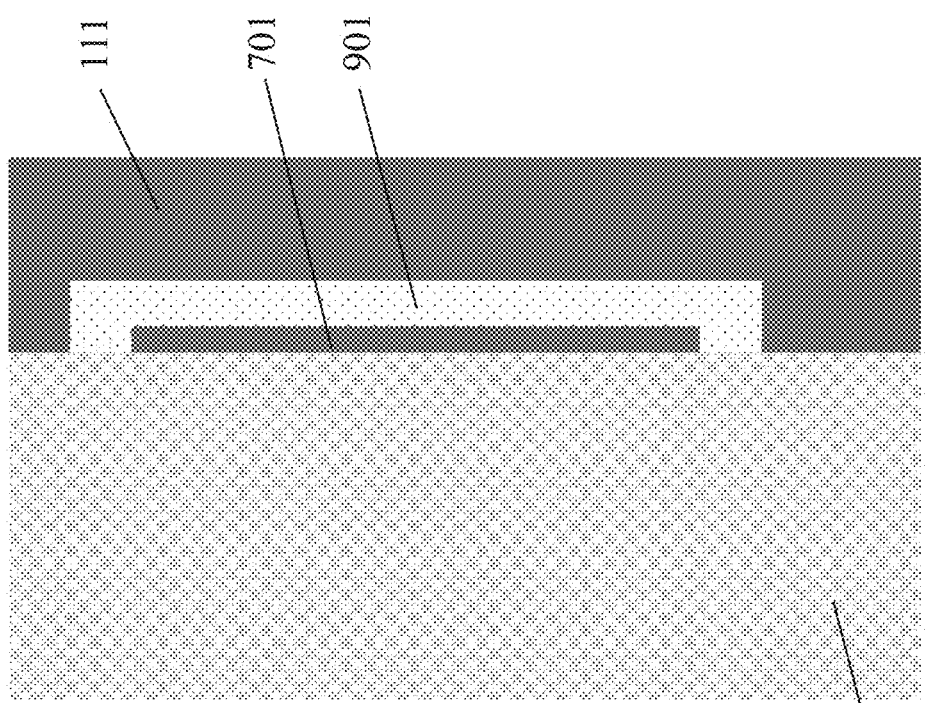
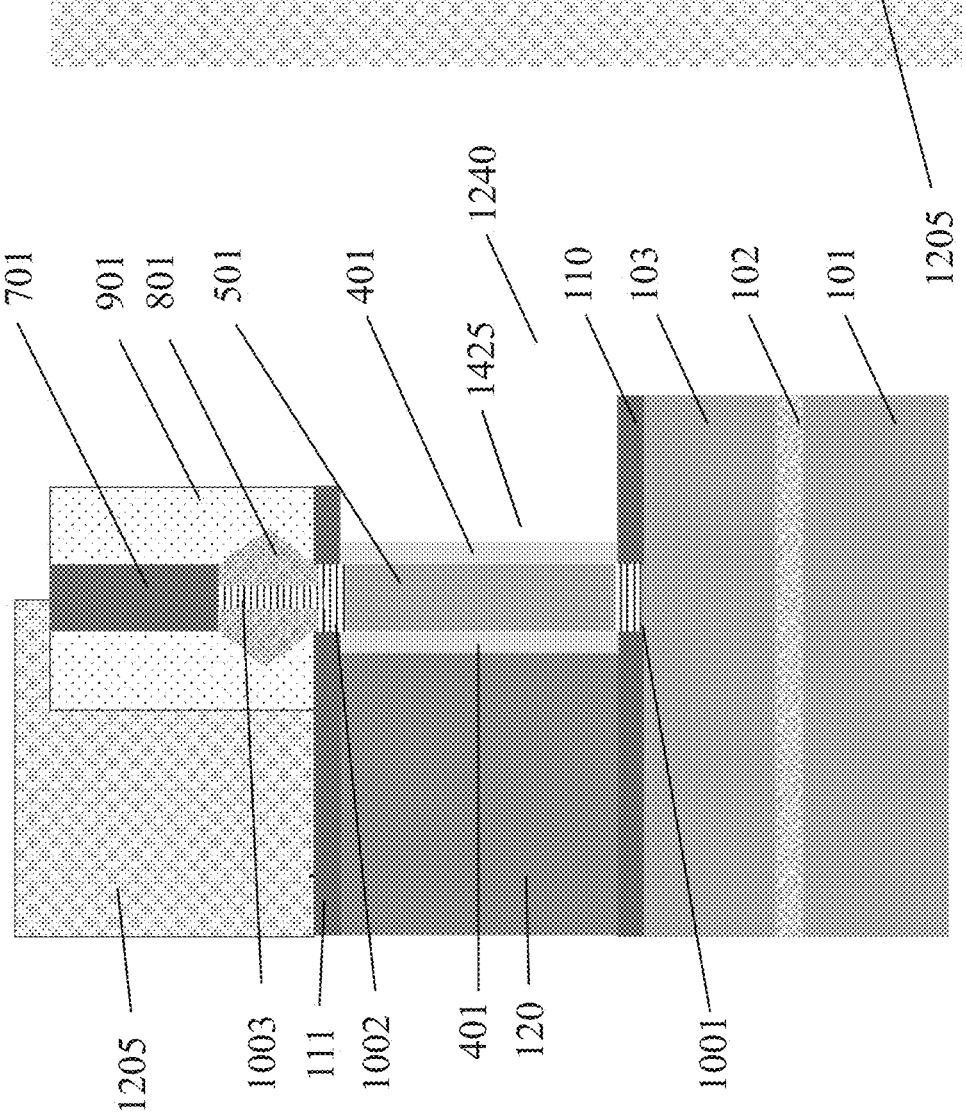

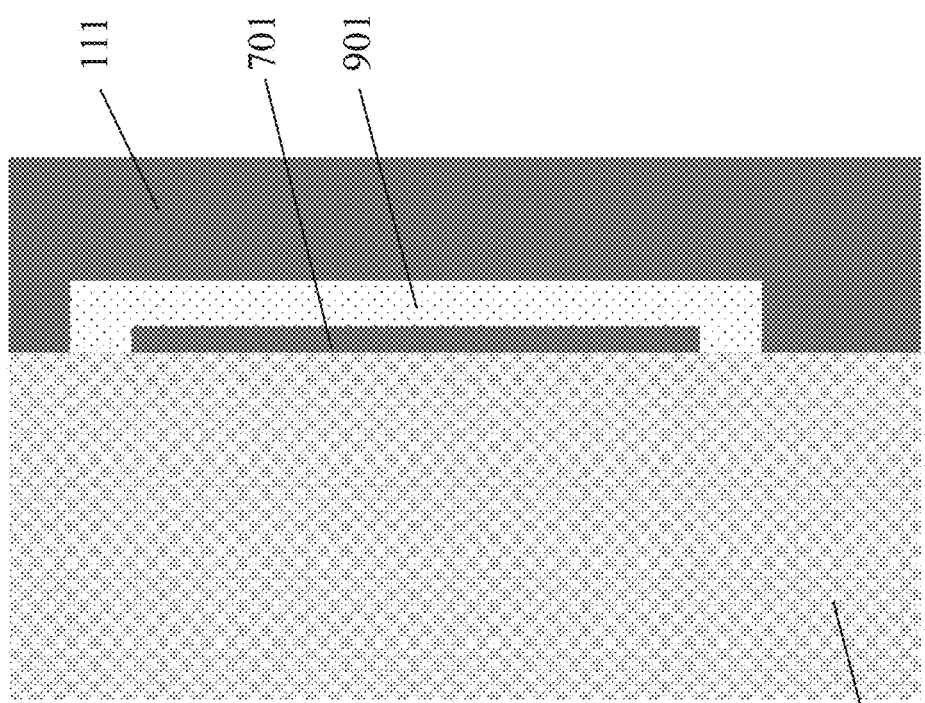
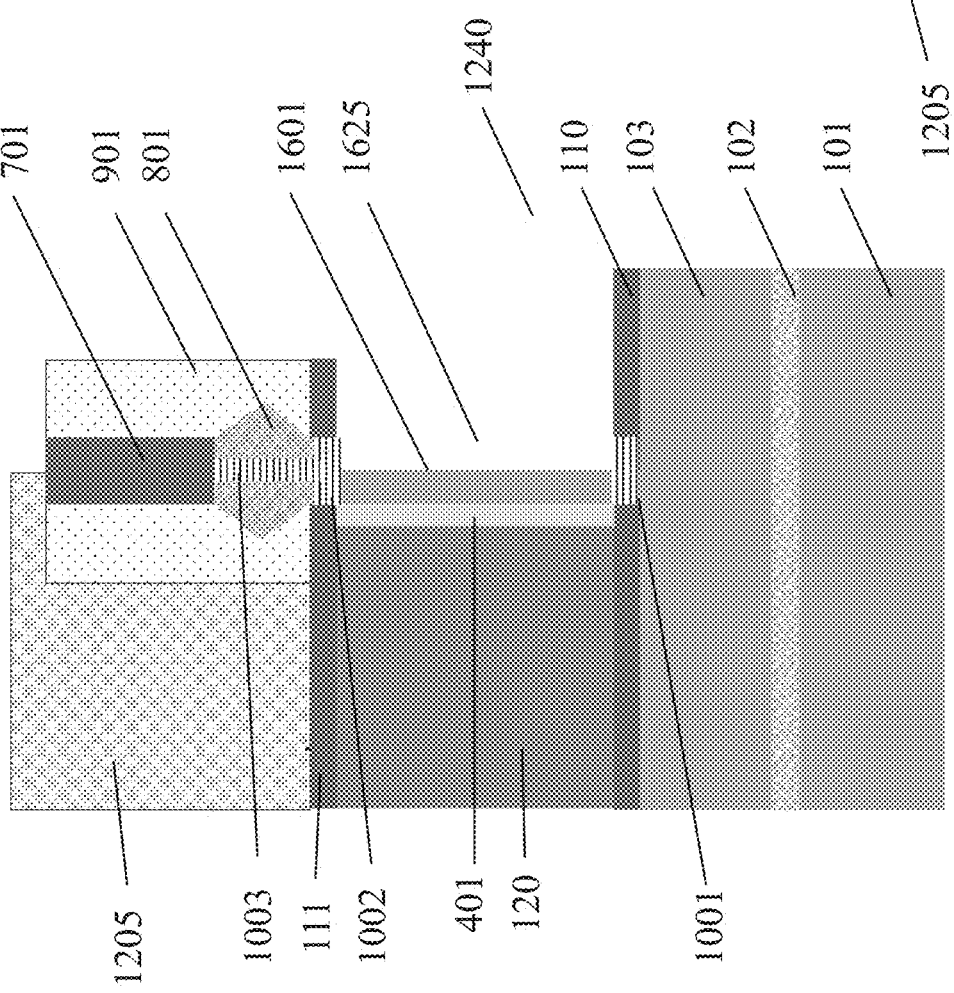

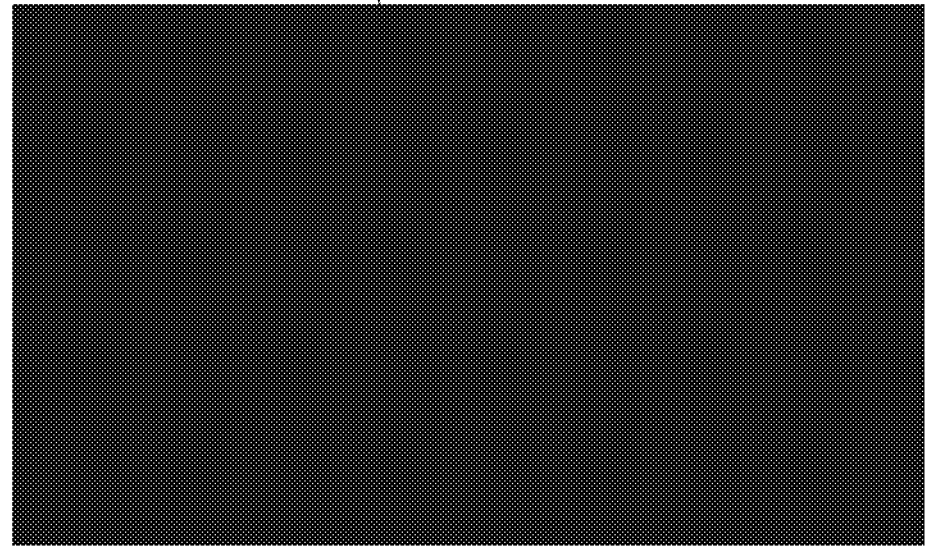
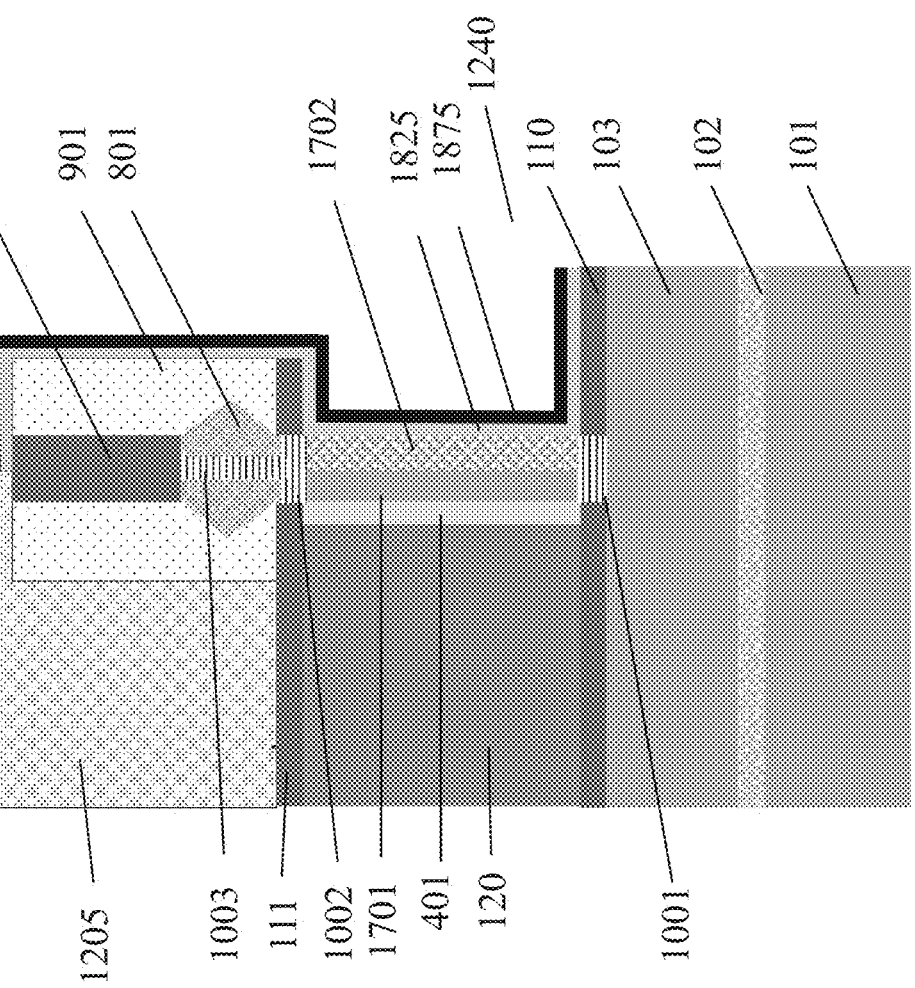

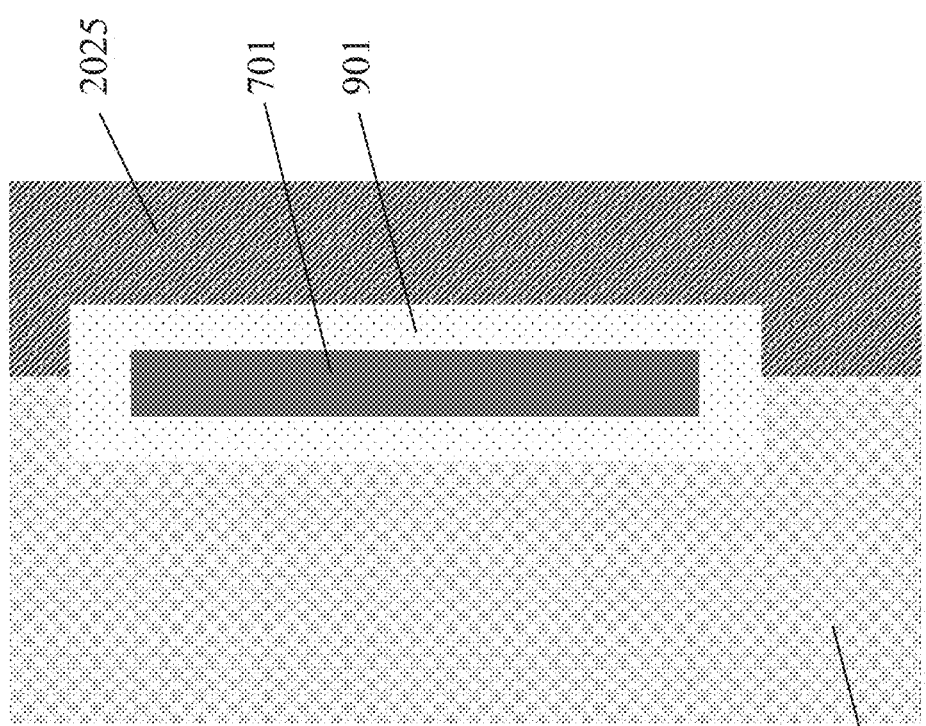
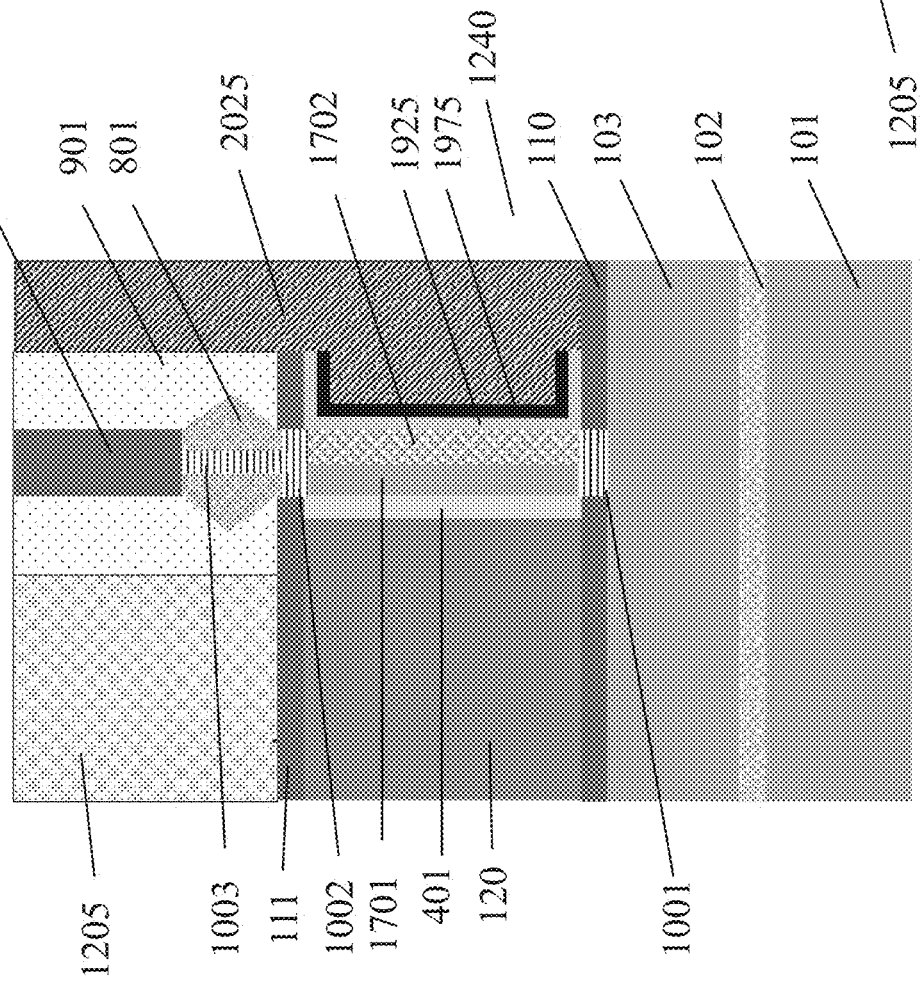

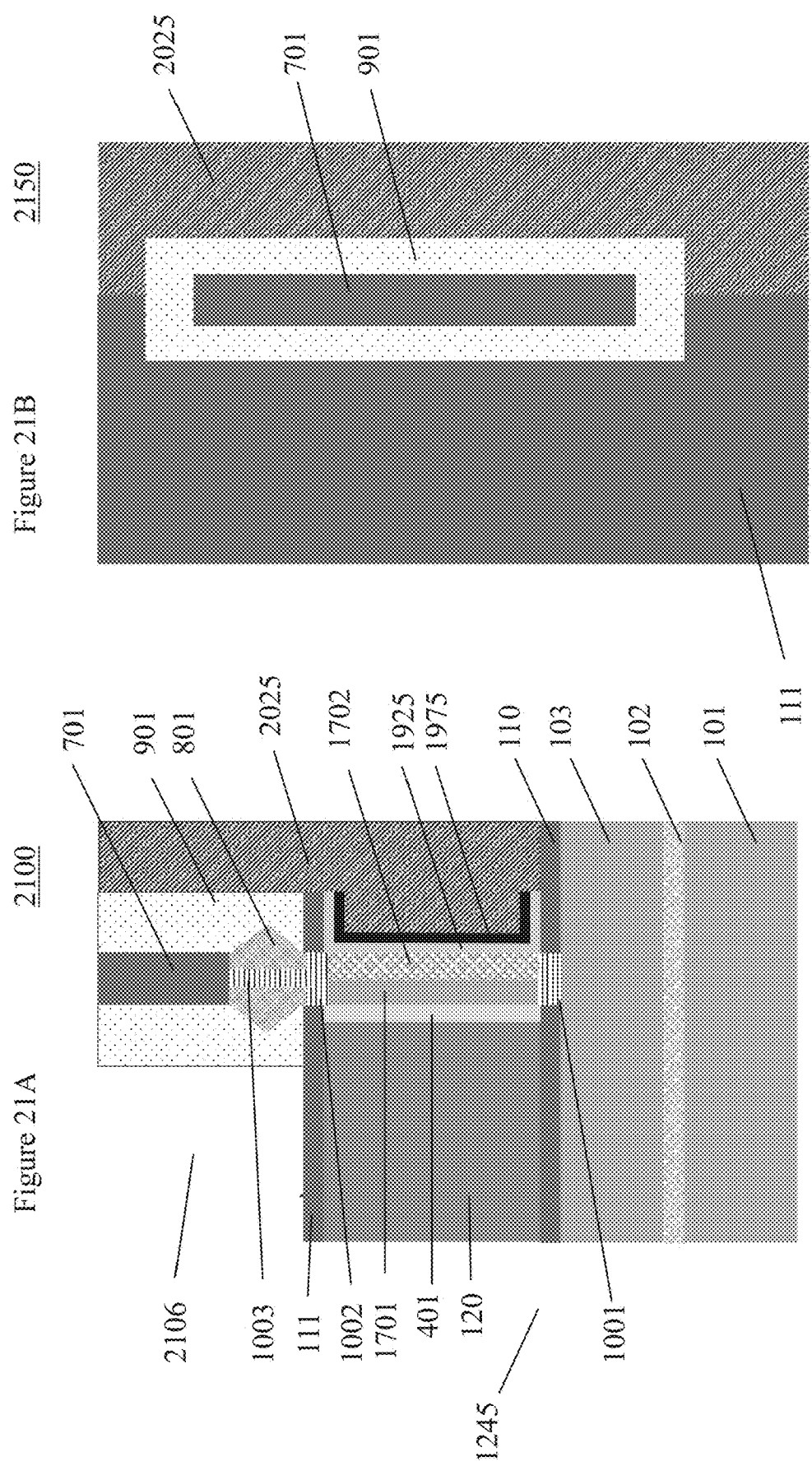

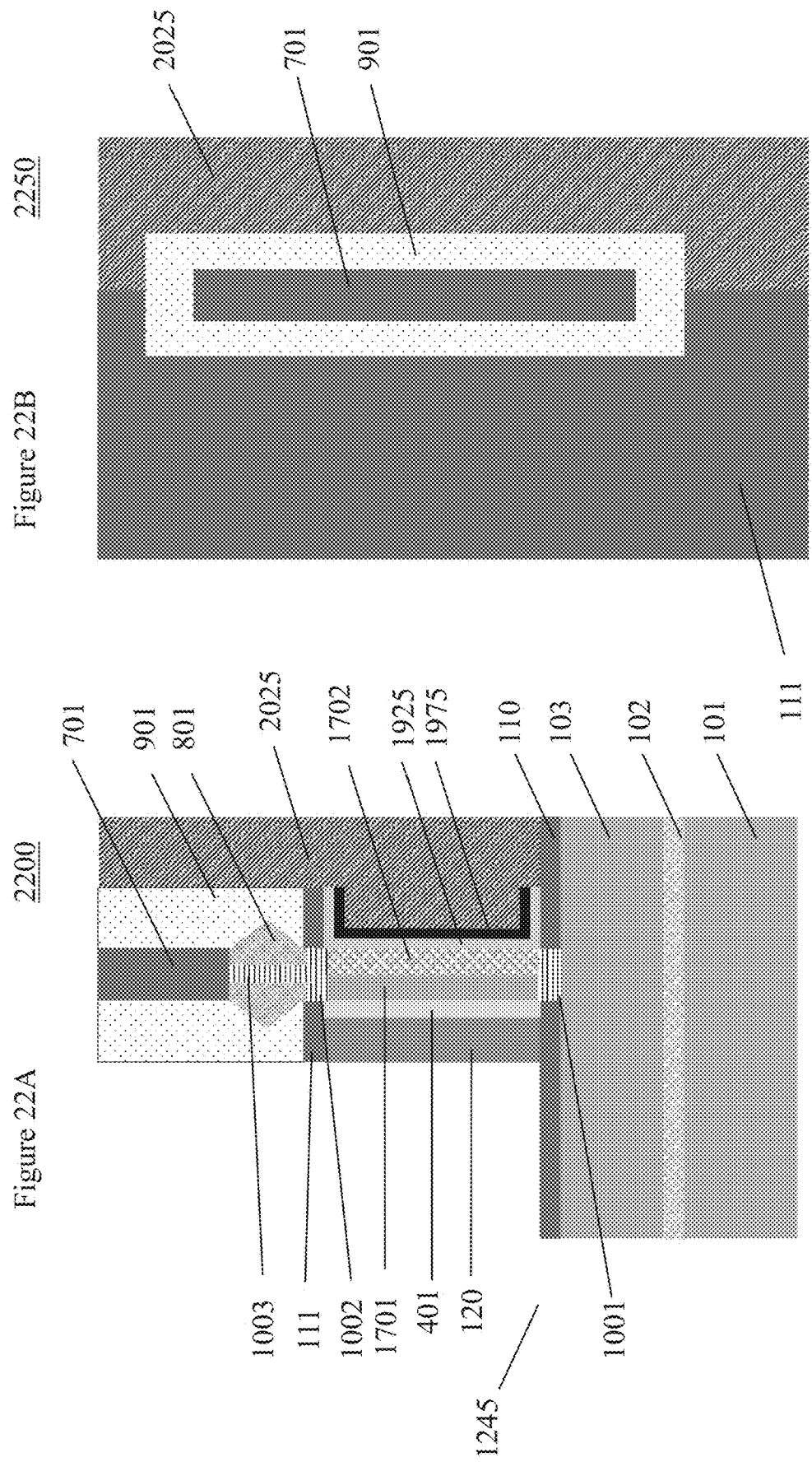

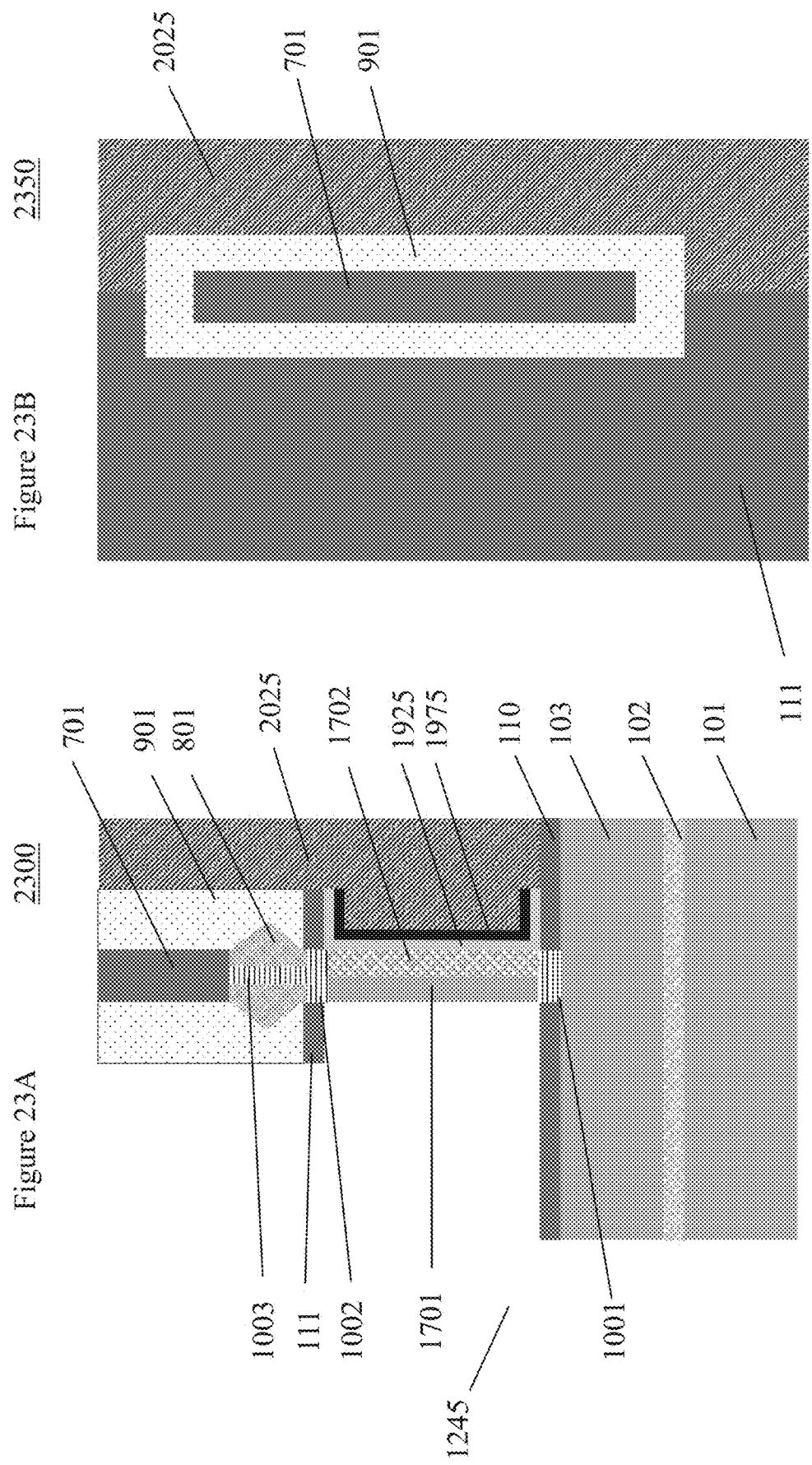

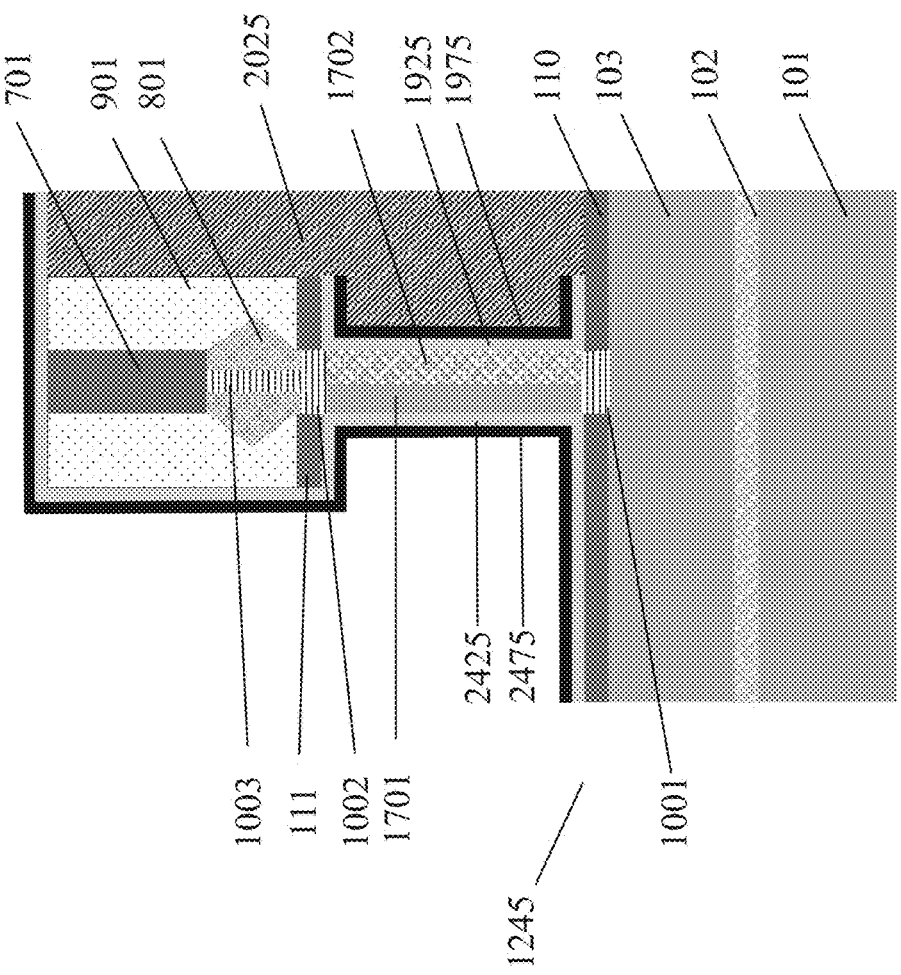
Figure 24B
Figure 24A

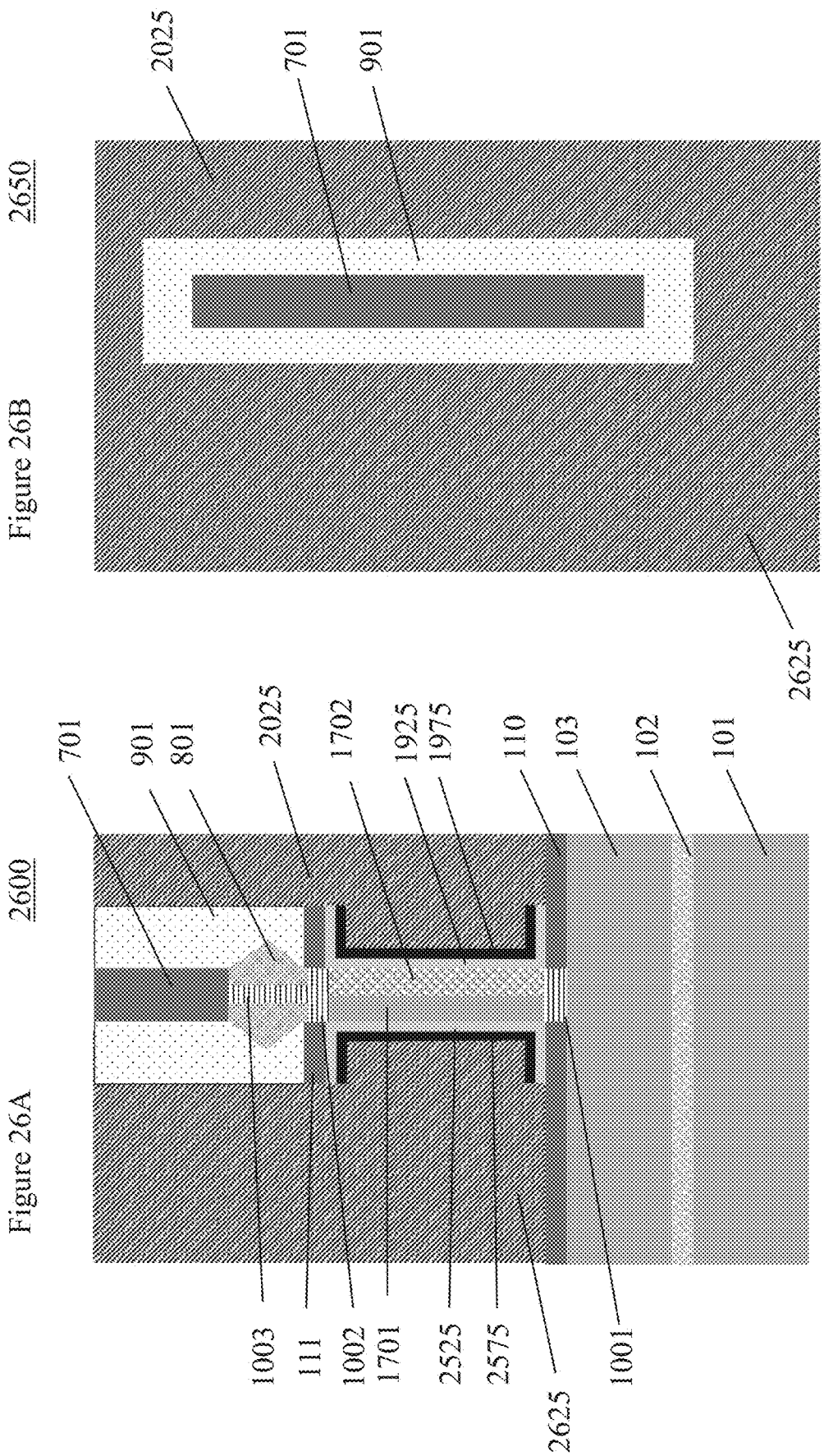

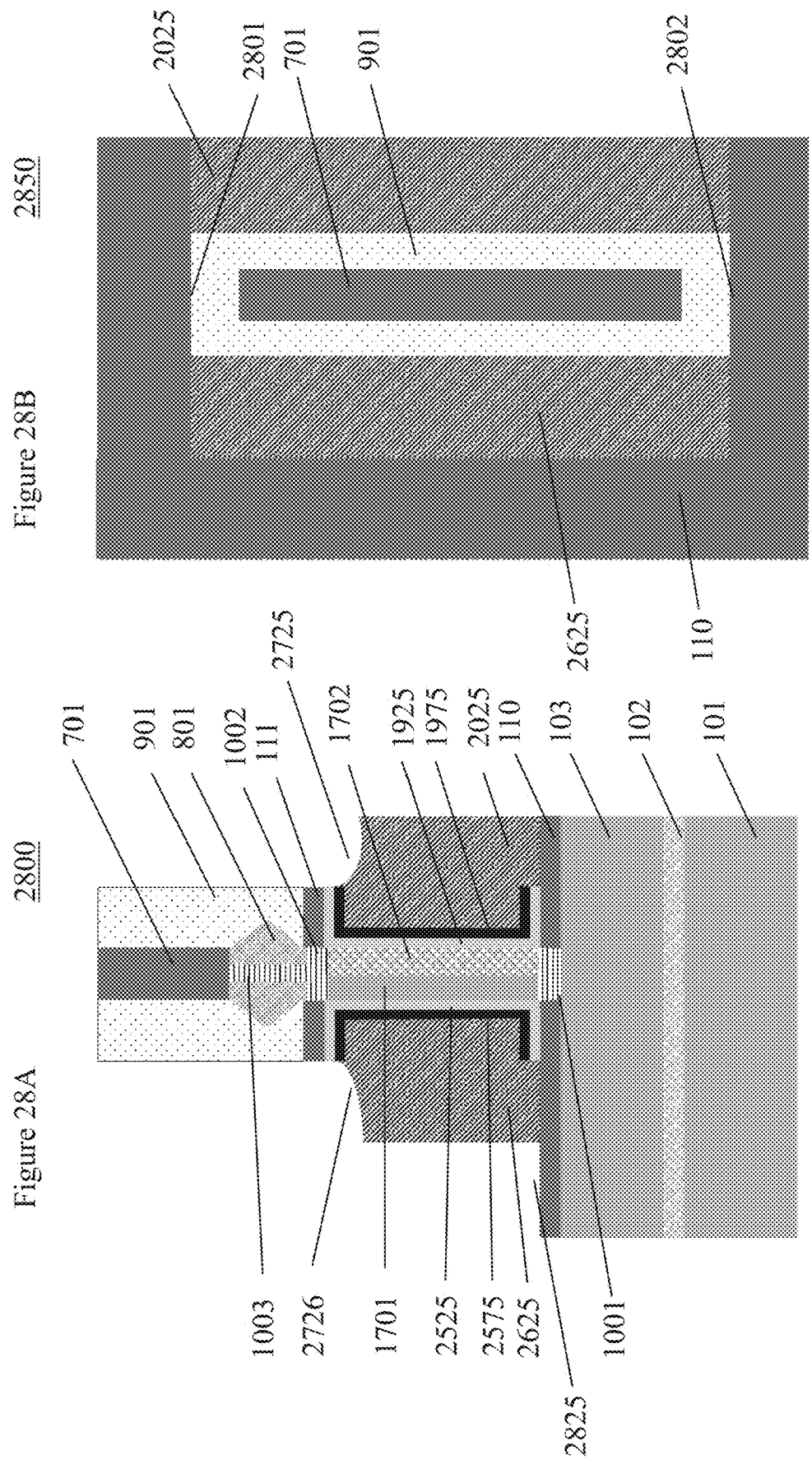

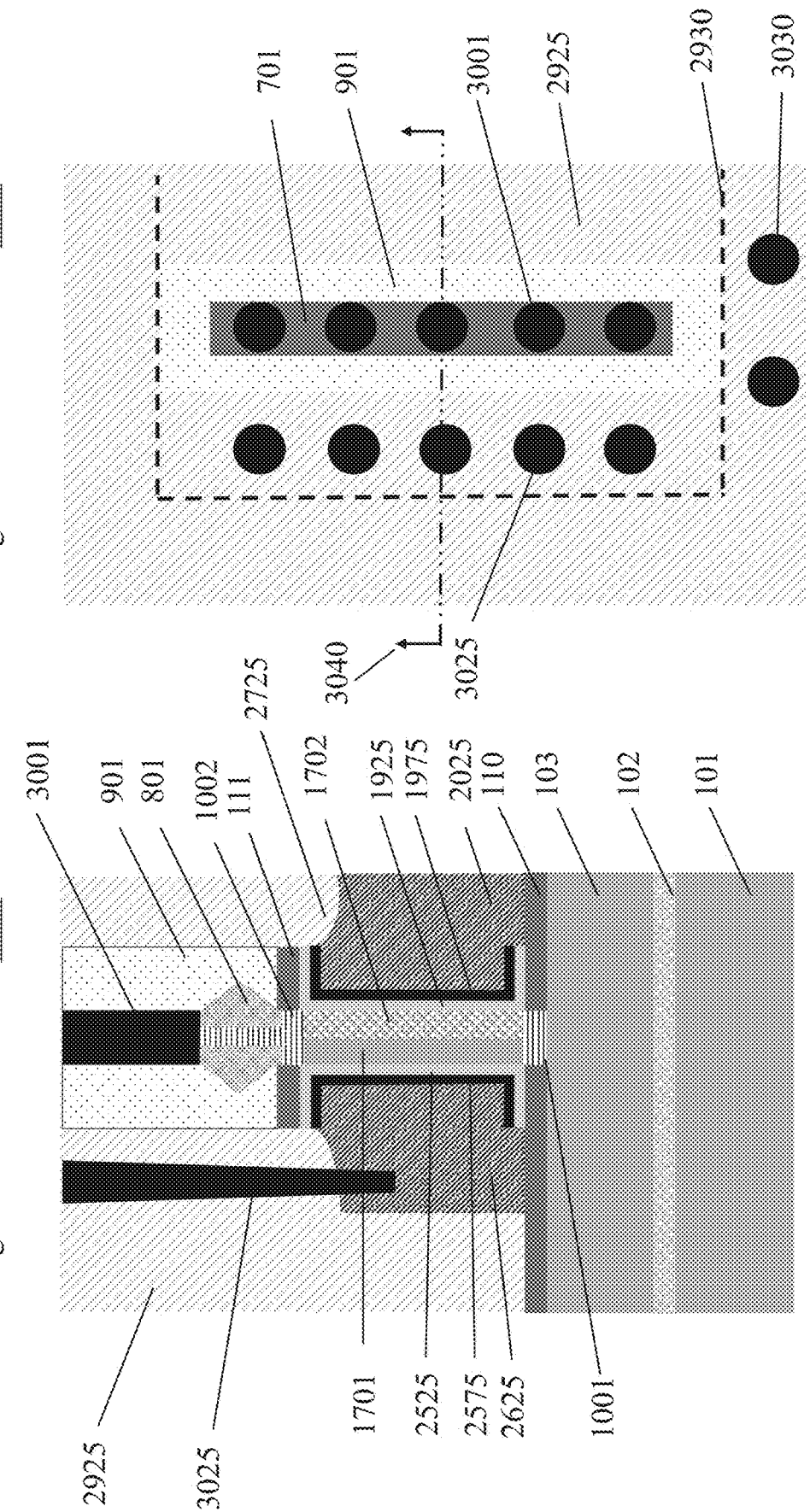

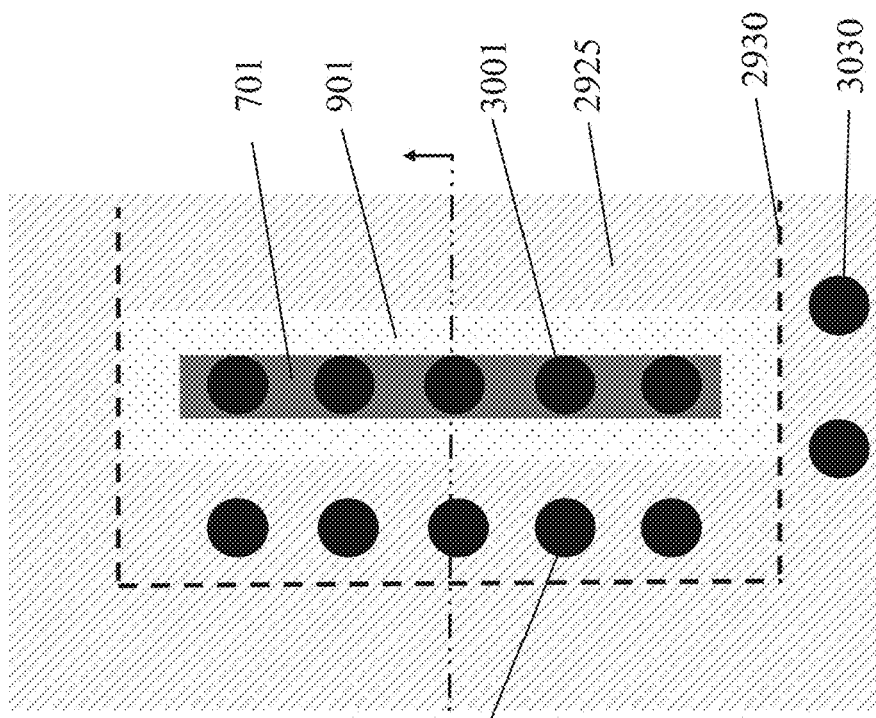
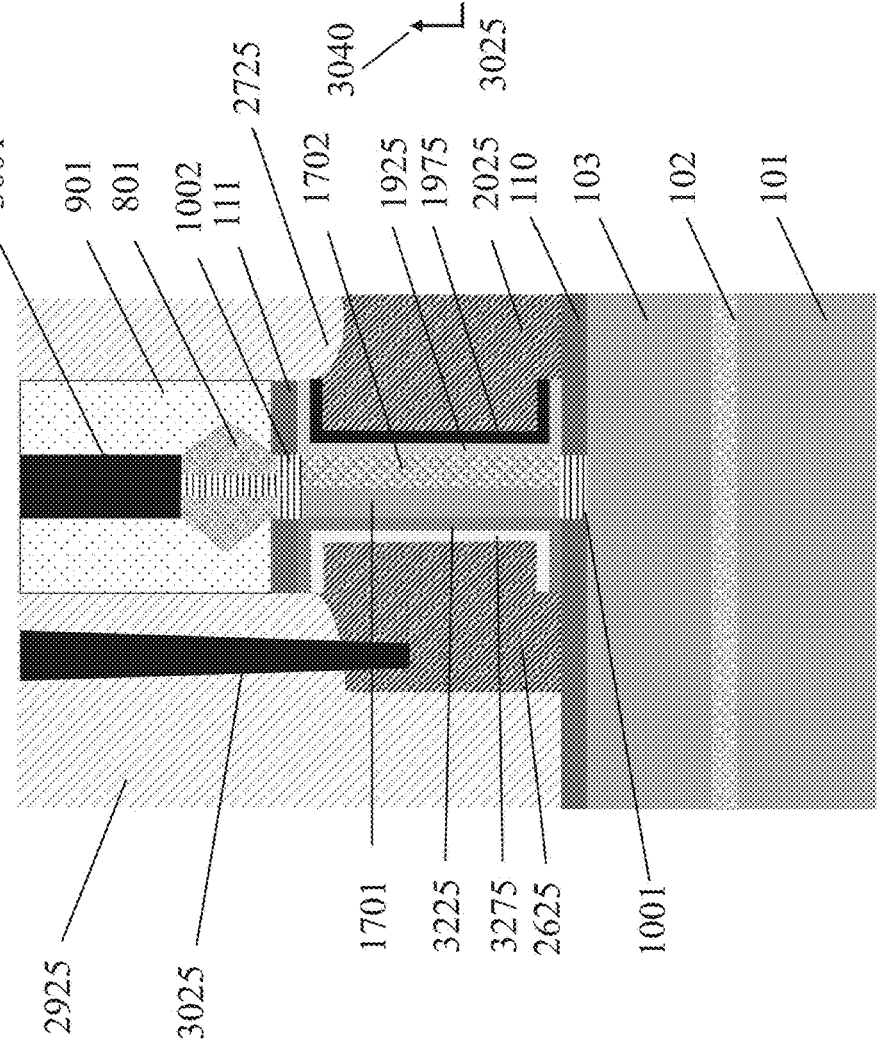
Figure 32A
Figure 32B

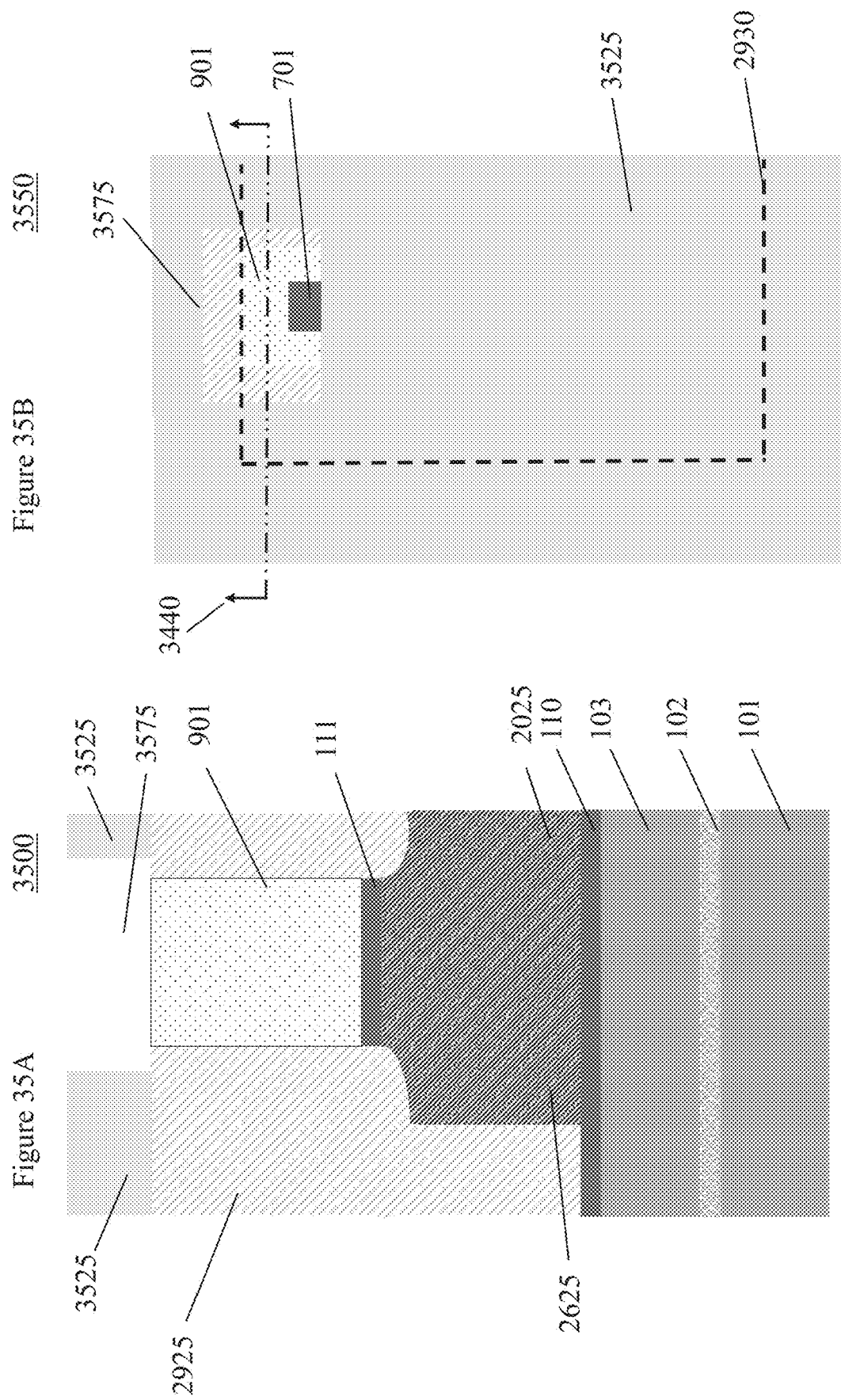

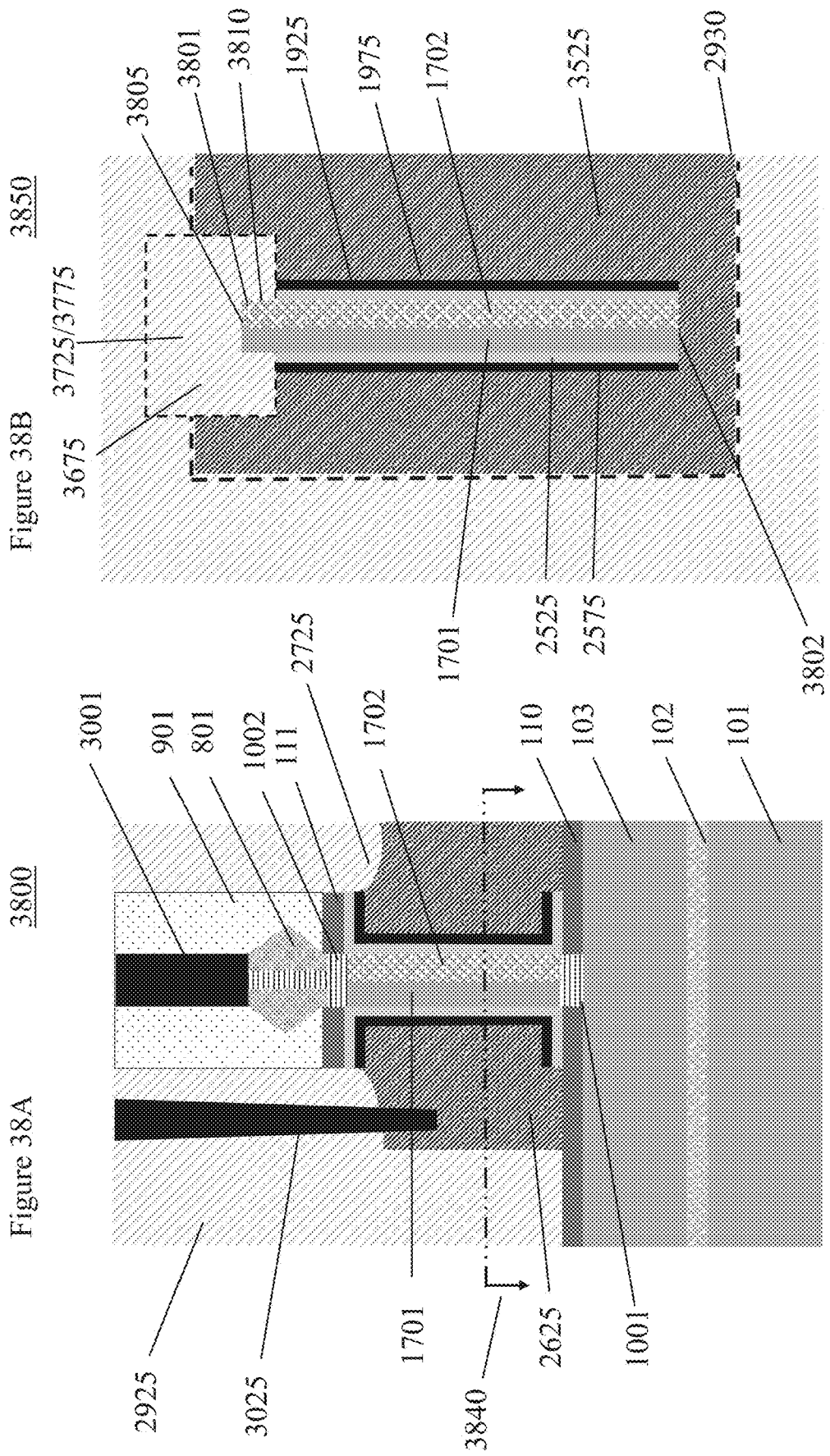

US 11,646,372 B2

VERTICAL TRANSISTOR FLOATING BODY ONE TRANSISTOR DRAM MEMORY CELL

BACKGROUND

The present invention relates to semiconductor vertical transistors. More specifically, the invention relates to vertical transistors used in memory cells.

In some One-transistor Dynamic Random-Access Memory (1T DRAM) a bit of data is stored in a capacitive region controlled by the transistor. Rather than the capacitance being a separate capacitor element, a parasitic body capacitance of the device stores a charge, a so-called floating body effect. The charge stored causes a detectable shift in the device threshold voltage, the minimum gate-to-source voltage required to create a conducting path between the transistor source and drain. The voltage shift is used to represent a bit of memory.

In some embodiments, a DRAM floating body memory can be implemented by having two separate gate contacts. The separate gates bias one side of the transistor channel in inversion and the other side in accumulation. However, this structure is cumbersome for many device architectures. Two parallel gate contacts take up space which becomes less available as the pitch of these device become smaller, e.g. for 42 nanometer and smaller pitch devices.

There is a need for a vertical transistor used in a 1T DRAM cell that can be biased with a single gate contact that can bias one side of the transistor channel in inversion and the other side in accumulation.

SUMMARY

Embodiments of the present invention include a Vertical Field Effect Transistor (VFET) and/or a one transistor dynamic random access memory 1T DRAM that has a substrate with a horizontal substrate surface, a source disposed on the horizontal substrate surface, a drain, and a channel. The channel has a channel top, a channel bottom, a first channel side, a second channel side, and two channel ends. The channel top is connected to the drain. The channel bottom is connected to the source. The channel is vertical and perpendicular to the substrate surface. The functions of the source and drain, and their connections, can be reversed, e.g. substituted for one another.

A first gate stack interfaces with the first channel side and a second gate stack interfaces with the second channel side. A single external gate connection electrically connects the first gate stack and the second gate stack. A gate bias (voltage) applied on the single external gate connection biases the first channel side in accumulation and biases the second channel side in inversion. The first gate stack is made of a first high-k dielectric layer and a first gate metal layer. The second gate stack is made of a second high-k dielectric layer and a second gate metal layer. The single external gate electrical connection is made to the first gate metal layer and the second gate metal layer.

One of the channel ends forms a floating body region, i.e. a capacitance, used by the 1T DRAM.

One embodiment of the invention has the channel first side and the channel second side made of different materials with the first and second gate stack made of the same materials.

Another embodiment of the invention has the channel first side and the channel second side made of different materials with the first and second gate stack made of the different materials.

Another embodiment of the invention has the channel first side and the channel second side made of the same material with the first and second gate stack made of the different materials.

Methods of making the devices are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

FIG. 3A is a cross section after opening the bottom spacer to expose a portion of a top surface of the bottom S/D.

FIG. 3B is a top view showing the exposed portion of the bottom S/D at the bottom of the etched trench.

FIG. 5A is a cross section after an epitaxial growth of a channel within the trench.

FIG. 5B is a top view showing the top of the epitaxially grown channel.

FIG. 9A is a cross section after forming a top protective spacer.

FIG. 9B is a top view showing the top of the top spacer, fill nitride, and top protective spacer.

FIG. 10A is a cross section after forming of a p-n junction at each end of the channel.

FIG. 10B is a top view showing the top of the top spacer, fill nitride, and top protective spacer, as in FIG. 9B.

FIG. 13A is a cross section after performing a reactive ion etch (RIE) to remove the exposed top spacer and exposed dummy gate, stopping at bottom spacer.

FIG. 13B is a top view after the RIE.

FIG. 14A is a cross section after pulling the exposed part of the dummy gate on the second side.

FIG. 14B is a top view after pulling the exposed part of the dummy gate.

FIG. 16A is a cross section after laterally recessing the channel on the second side.

FIG. 16B is a top view after the lateral channel recess.

FIG. 18A is a cross section after depositing a second gate stack, including a second high-k dielectric layer and a second gate metal layer.

FIG. 18B is a top view after depositing the second gate stack.

FIG. 20A is a cross section after a metal fill of the second side followed by a CMP.

FIG. 20B is a top view after the metal fill followed by the CMP.

FIG. 21A is a cross section after removing a first mask side.

FIG. 21B is a top view after removing the first mask side.

FIG. 22A is a cross section after a RIE of the exposed portion of the top spacer and the exposed portion of the dummy gate.

FIG. 22B is a top view after the RIE.

FIG. 23A is a cross section after the dummy gate is pulled and the oxide is etched away on the channel first side.

FIG. 23B is a top view after the dummy gate is pulled and the oxide is etched away on the channel first side.

FIG. 24A is a cross section after depositing a first gate stack, including a first high-k dielectric layer and a first gate metal layer.

FIG. 24B is a top view after depositing the first gate stack.

FIG. 26A is a cross section after a first side metal fill followed by a CMP.

FIG. 26B is a top view after the first side metal fill followed by the CMP.

FIG. 28A is a cross section after a gate lithography and RIE removes some of the first side metal fill.

FIG. 28B is a top view after the gate lithography and RIE removes some of the first side metal fill.

FIG. 30A is a cross section after the forming the external connections to a first embodiment of the completed device with two different channel sides and the first and second gate stacks made with the same materials.

FIG. 30B is a top view after the forming the external connections to the first embodiment of the completed device.

FIG. 32A is a cross section of a completed second embodiment of the device created by continuing the flow process after replacing the steps shown in FIG. 24A to create a device with different first and second gate stacks and two different channel sides.

FIG. 32B is a top view of the second embodiment in FIG. 31A with different first and second gate stacks and two different channel sides.

FIG. 35A is a cross section after the deposition of a floating-body mask with a floating-body window opening.

FIG. 35B is a top view showing the floating-body mask with the floating-body window opening.

FIG. 38A is a cross section of a completed device with a channel end forming a floating-body region.

FIG. 38B is a top view showing the channel end and floating-body region of the structure in FIG. 38A at a lower cross-section view.

FIG. 39A is a cross section showing a higher cross-section view of the structure in

FIG. 38A.

DETAILED DESCRIPTION

Figure 1B:
FIG. 1B is a top view of a top surface of the layered structure.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Various embodiments of a novel Vertical Field Effect Transistor (VFET) are disclosed. Embodiments include the VFET used as a 1T DRAM floating body memory device.

The VFET has a channel with two sides, a channel first side and a channel second side. There is a first gate stack disposed on the channel first side and a second gate stack disposed on the channel second side. The first gate stack has a first high-k dielectric layer and a first gate metal layer. The second gate stack has a second high-k dielectric layer and a second gate metal layer. The channel has a first and second channel end. The first and second gate stack (i.e. the first gate metal layer and second gate metal layer of the respective gate stack) are electrically connected to single external gate contact with one or more external gate contact connection points.

The VFET is configured so that the channel first side and the channel second side can be biased oppositely even though there is a single external gate contact. For example, the channel first side is biased in inversion while the channel second side is biased in accumulation by the same gate voltage applied to the single external gate contact, or vice versa.

Various embodiments of the device and methods of making the device are disclosed.

In one embodiment, the first and second gate stacks are made of the same materials, but the channel first side and a channel second side are made of different materials.

In another embodiment, the channel first side and a channel second side are made of the same material, i.e. the channel is made of a single material, but the first and second gate stacks (e.g., the first and second gate metal layers) are made of different materials.

In another embodiment, the channel first side and a channel second side are made of different materials and the first and second gate stacks (e.g. the first and second gate metal layers) are made of different materials.

Embodiments of 1T DRAM floating body memory devices are disclosed with a body floating-body region at either a first or second channel end.

In one 1T DRAM embodiment, the channel with different materials in the channel first side and the channel second side has a first (or alternatively a second) channel end that transitions into the floating-body region. The floating-body region(s) creates the capacitance used in the 1T DRAM. Alternative embodiments of each of these structures can be made where the channel is made of a single material, i.e. the first and second side are made of the same material.

Each VFET structure is made by a controlled process, adaptable from conventional vertical transistor flow for fabricating such a structure.

The asymmetric channel VFETs, i.e. the VFET embodiments with the channel first side and a channel second side made of different materials, can induce a threshold voltage, Vt, difference between the channel first and second side of at least 500 milliVolts (mV).

The single external gate contact is all that is required to oppositely bias the channel first and second sides in accumulation and inversion, respectively. Removing the need for a second gate contact allows for tighter pitch spacing of the devices. In addition, the single external gate contact conveniently forms a word line that can be used in memory structures, Refer now to the Figures.

Figure 1A:
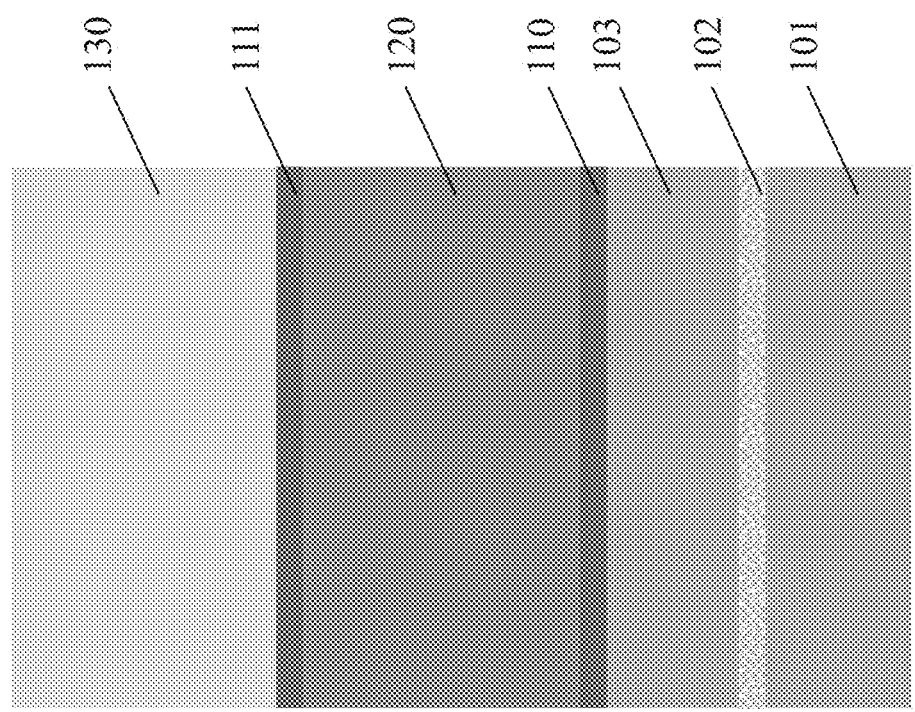
FIG. 1A is a cross section of a layered structure including a bottom source/drain (S/D) layer, a bottom spacer, dummy gate layer, a top spacer, and a dielectric capping layer.

FIG. 1A is a cross section of a layered structure 100 including a bottom source/drain (S/D) layer 103, a bottom spacer 110, a dummy gate layer (dummy gate) 120, a top spacer 111, and a dielectric capping layer (or top oxide layer) 130. FIG. 1B is a top view 150 of a top surface 130 of the layered structure.

The bottom S/D layer 103 is on a substrate 101 (e.g. a bulk substrate). The substrate 101 includes one or more semiconductor materials. Non-limiting examples of suitable substrate 101 materials include Si (silicon), strained Si, Si:C (carbon doped silicon), Ge (germanium), SiGe (silicon germanium), SiGe:C (carbon doped silicon-germanium), Si alloys, Ge alloys, III-V semiconductor materials (e.g., GaAs (gallium arsenide), InAs (indium arsenide), InP (indium phosphide), Indium Gallium Arsenide (InGaAs), or aluminum arsenide (AlAs)), II-VI materials (e.g., CdSe (cadmium selenide), CdS (cadmium sulfide), CdTe (cadmium telluride), ZnSe (zinc selenide), ZnS (zinc sulfide), or ZnTe (zinc telluride)), or any combination thereof. In an exemplary embodiment, the substrate 101 includes germanium so that the channel region has both electron and hole mobility properties.

The bottom S/D layer 103 can be a doped S/D (source) 103 arranged on the substrate 101 over a counter-doped layer 102. The doped source 103 and the counter-doped layer 102 are formed on the substrate 101 incorporating dopants into the substrate 101 or forming an epitaxial growth on the substrate 101. The doped source 103 is heavily doped with a dopant, which may be a p-type dopant (e.g., boron or gallium) or an n-type dopant (e.g., phosphorus or arsenic). The counter-doped layer 102 includes a dopant that is different/opposite to the dopant in the doped source 103. For example, when the doped source 103 includes a p-type dopant, the counter-doped layer 102 includes an n-type dopant, and when the doped source 103 includes an n-type dopant, the counter-doped layer 102 includes a p-type dopant.

The doped source 103 is heavily doped, including a dopant concentration in a range from about $4 \times 10^{40}$ to about $5 \times 10^{21}$ atoms/cm$^3$. The thickness of the counter-doped layer 102 may be in a range from about 20 nanometers (nm) to about 200 nm, or from about 50 nm to about 100 nm. The thickness of the doped source 103 may be in a range from about 50 nm to about 250 nm, or from about 300 nm to about 70 nm.

A bottom spacer 110 is disposed on the source (S/D) 103. A dummy gate 120 is disposed on the bottom spacer 110 and a top spacer is disposed on the dummy gate 120, The bottom spacer 110 and top spacer 111 can be made of an insulating material including, for example, silicon dioxide, silicon nitride, SiBCN, or SiBCN. Other non-limiting examples of materials for the bottom spacer 110 and the top spacer 111 include dielectric oxides (e.g., silicon oxide), dielectric nitrides (e.g., silicon nitride), dielectric oxynitrides, or any combination thereof.

The bottom spacer 110 and top spacer 111 materials are deposited by a deposition process, for example, chemical vapor deposition (CVD) or physical vapor deposition (PVD). The bottom spacer 110 and the top spacer 111 may each have a thickness of about 3 nm to about 15 nm, or of about 5 nm to about 10 nm.

The dummy gate 120 includes a sacrificial gate material, for example, amorphous silicon (aSi) or polycrystalline silicon (polysilicon). The sacrificial material may be deposited by a deposition process, including, but not limited to, PVD, CVD, plasma enhanced chemical vapor deposition (PECVD), inductively coupled plasma chemical vapor deposition (ICP CVD), or any combination thereof. The sacrificial material forming the dummy gate 120 has a thickness of about 8 nm to about 100 nm, or from about 10 nm to about 30 nm.

In some embodiments, the dummy gate 120 is made of amorphous silicon, α-Si.

A dielectric capping layer 130 is deposited on the top spacer 111 over the dummy gate 120. Non-limiting examples of materials for the dielectric capping layer 130 materials include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof of the deposition methods used above. The dielectric capping layer 130 has a thickness in a range from about 30 nm to about 200 nm, or from about 50 nm to about 100 nm.

Figure 2B:
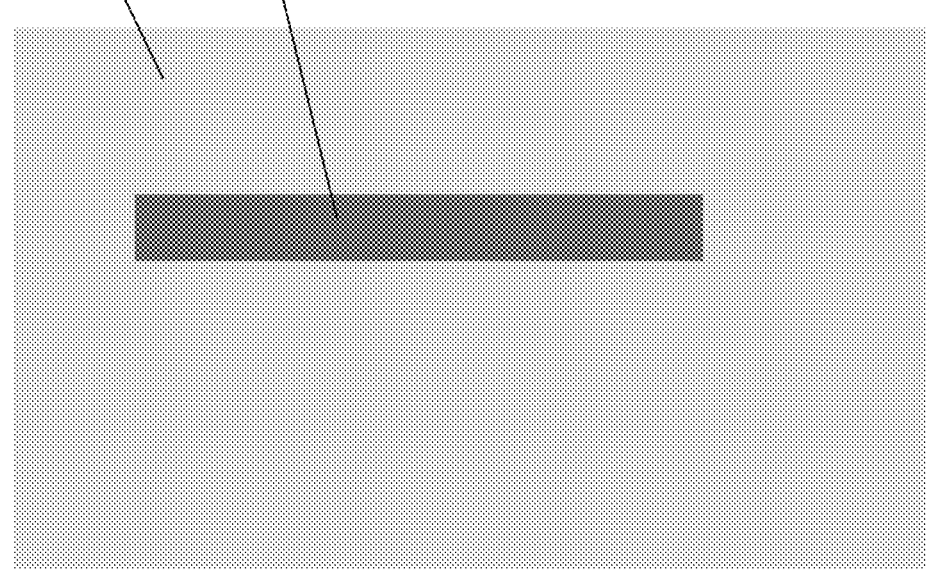
FIG. 2B is a top view showing the bottom of the etched trench.
Figure 2A:
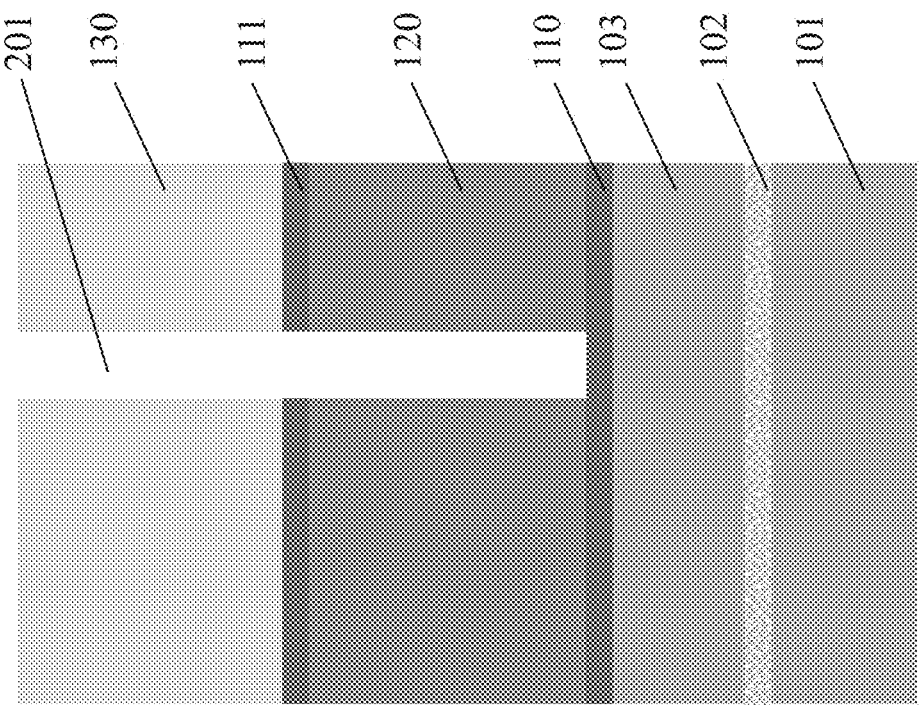
FIG. 2A is a cross section after a trench is etched through the dielectric capping layer, top spacer, and dummy gate layer.

FIG. 2A is a cross section 200 after a trench 201 is etched through the dielectric capping layer (top oxide layer) 130, top spacer 111, and dummy gate 120. FIG. 2B is a top view 250 showing the bottom of the etched trench 110, i.e. the exposed part of a top surface of the bottom spacer 110.

The trench 201 extends from a surface of the dielectric capping layer 130 to the bottom spacer 110, exposing a part of the bottom spacer 110. The trench 201 is formed by performing an etch process that is selective to (will not substantially remove) the bottom spacer 110 material. The etch process may be, for example, a reactive ion etch.

Multiple etching processes can be performed to form an opening/trench within the structure. For example, a first etching process is performed to remove a portion of the dielectric capping layer 130 selective to the material of the top spacer 111. A second etching process is then performed to remove a portion of the top spacer 111, which underlies the portion of the trench 201 formed from the first etching process, selective to the material of the dummy gate 120. A third etching process is then performed to remove a portion of the dummy gate 120, which underlies the portion of the trench 201 formed from the second etching process, selective to the material of the bottom spacer 110. The resulting trench 201 extends through a top surface of the dielectric capping layer 130 down to a top surface of an exposed portion of the bottom spacer 110. The width of the trench 201 may be about 3 nm to about 20 nm, or about 5 nm to about 10 nm. The depth of the trench 201 may be about 50 nm to about 300 nm, or from about 100 nm to about 200 nm.

FIG. 3A is a cross section 300 after opening the bottom spacer to expose a portion of a top surface of the bottom S/D (source) 103. FIG. 3B is a top view 350 showing the exposed portion of the bottom S/D (source) 103 at the bottom of the etched trench 201.

The bottom spacer 110 may etched using a process that is selective to (will not substantially remove) the doped source 103 material. The bottom spacer 110 may be etched by, for example, a reactive ion etch (RIE). The exposed portion of the bottom spacer 110 is removed by an etching process to expose a portion of the underlying source 103 layer. Etching by using the dielectric capping layer 130 as mask creates a self-aligned trench 201 which facilitates the formation of a self-aligned epitaxially grown in the trench 201, as described below in the description of FIG. 5A.

Figure 4B:
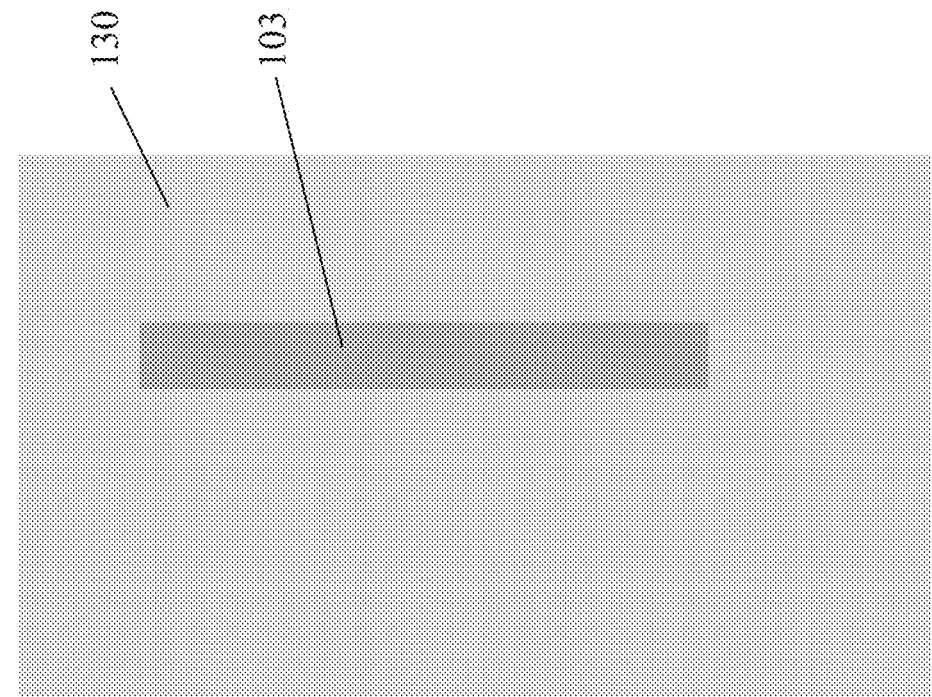
FIG. 4B is a top view showing of the cross section of FIG. 4A.
Figure 4A:
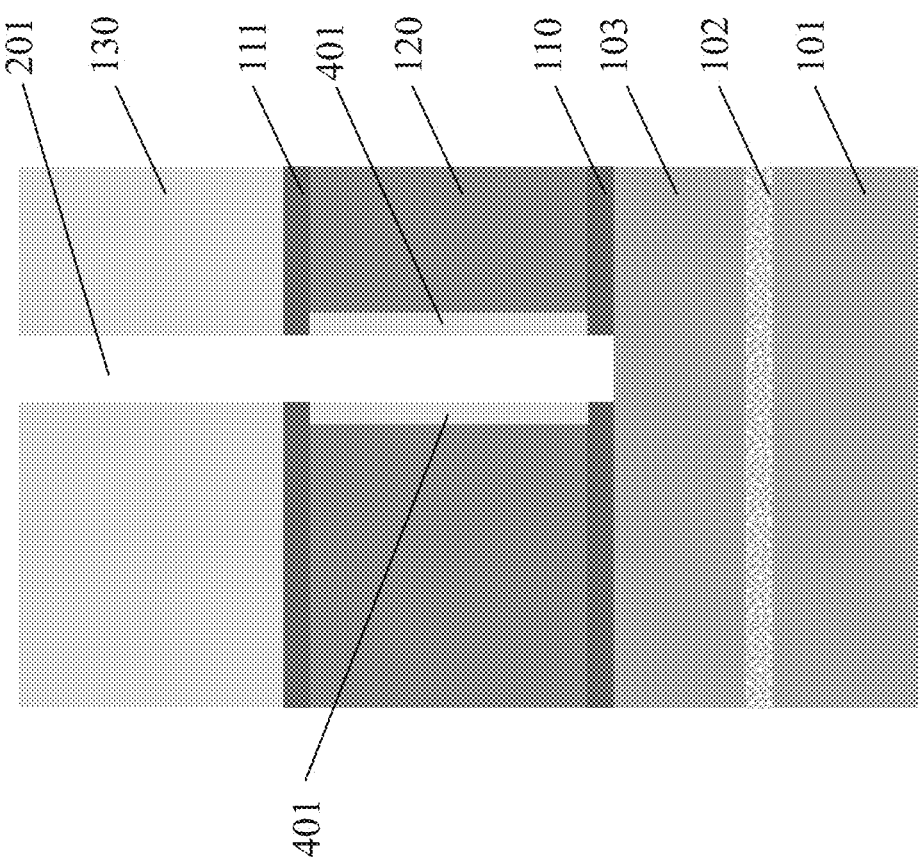
FIG. 4A is a cross section after formation of an oxidized layer on the exposed trench sides of the dummy gate layer.

FIG. 4A is a cross section 400 after formation of an oxidized layer 401 on the exposed trench 201 sides (side wall) of the dummy gate 120. FIG. 4B is a top view 450 of the cross section of FIG. 4A.

A thin layer of oxide 401 is formed along the trench 201 sidewalls. The oxidation may be performed by a plasma oxidation process or other oxidation process that forms the thin oxide 401 layer. A portion of the bottom spacer 110 or the doped source 103 also may be oxidized. Any oxide formed in these regions 110/103 is removed before performing the epitaxial growth in the next step.

FIG. 5A is a cross section after an epitaxial growth 500 of a channel 501 within the trench 201. FIG. 5B is a top view 550 showing the top of the epitaxially grown channel 501.

The channel 501 is an epitaxial layer grown on the exposed doped source 103 and grows within the trench 201. The channel 501 is made of an epitaxial semiconductor material, and the epitaxial growth forms on the semiconductor surface 103. The channel does not grow on other surfaces, such as the oxide 401, bottom spacer 110 or top spacer 111. The epitaxial growth of the channel 501 extends over the dielectric capping layer 130.

The epitaxial grown can be performed by known methods using sources for the epitaxial channel which contain materials like silicon, germanium, or a combination thereof. A gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, or helium can be used.

In some embodiments, the channel 501 is made from silicon.

Figure 6B:
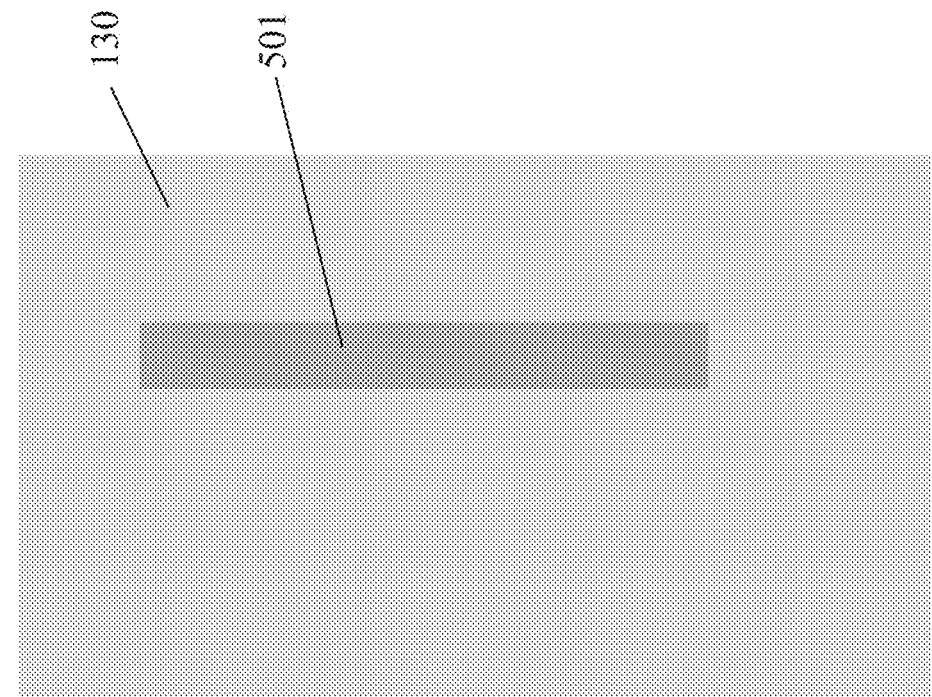
FIG. 6B is a top view showing the top of the epitaxially grown channel after the CMP.
Figure 6A:
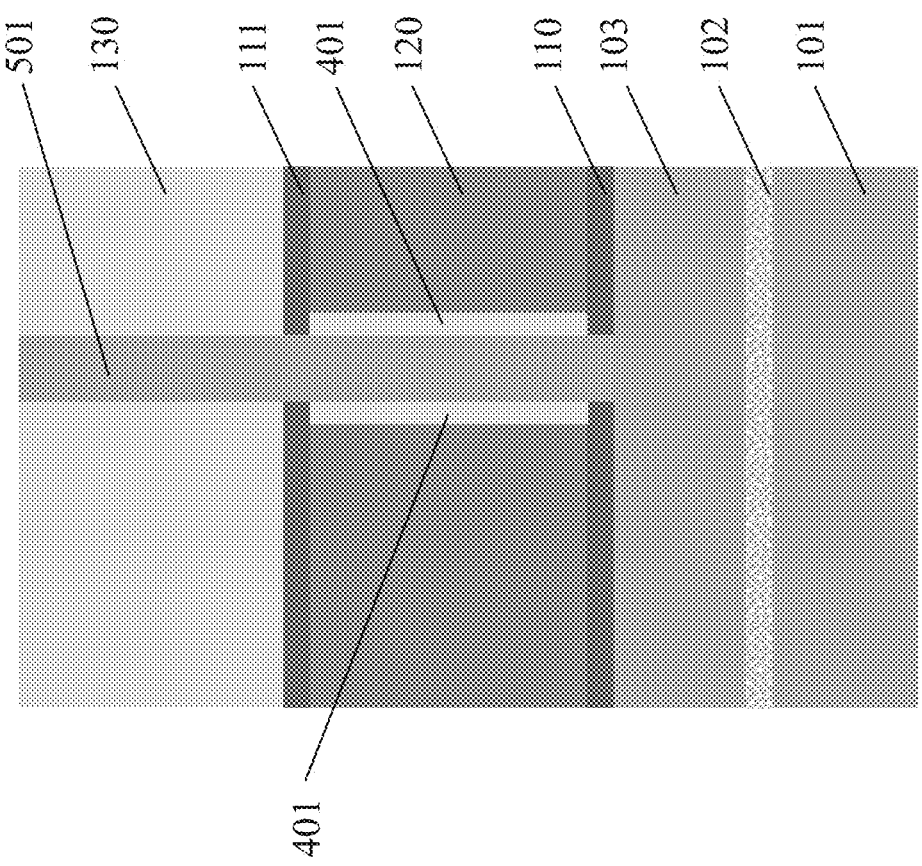
FIG. 6A is a cross section after a Chemical Mechanical Polishing (CMP).

FIG. 6A is a cross section after a Chemical Mechanical Polishing (CMP) 600. FIG. 6B is a top view 650 showing the top of the epitaxially grown channel after the CMP. The CMP planarizes the epitaxial growth in the epitaxial channel 501 to be level with the top of the dielectric capping layer 130. The planarization processes like CMP are known.

Figure 7B:
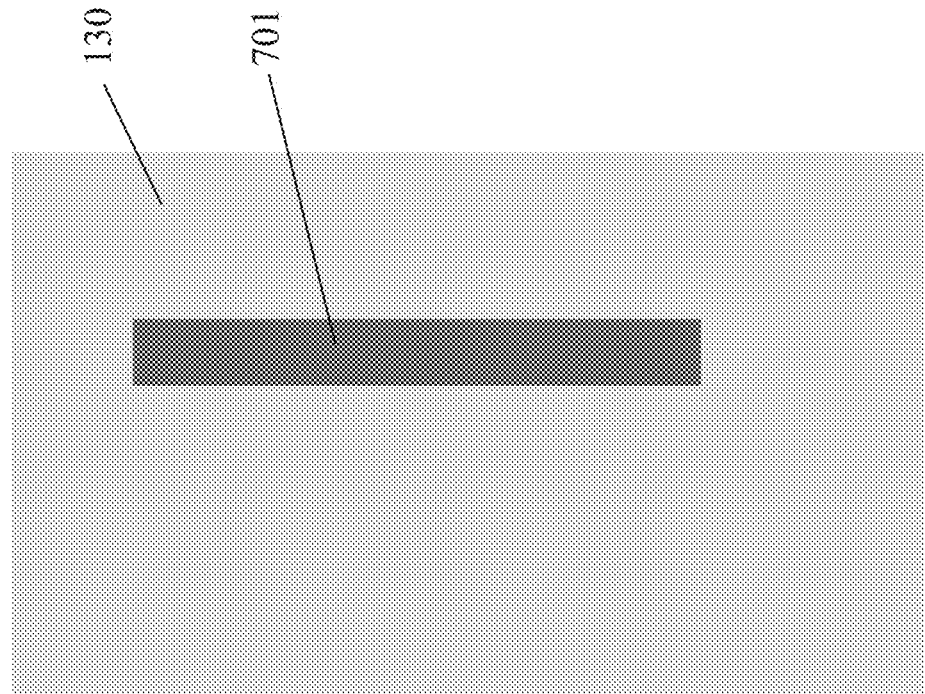
FIG. 7B is a top view showing the top of the dielectric filled recessed top of the channel after the CMP.
Figure 7A:
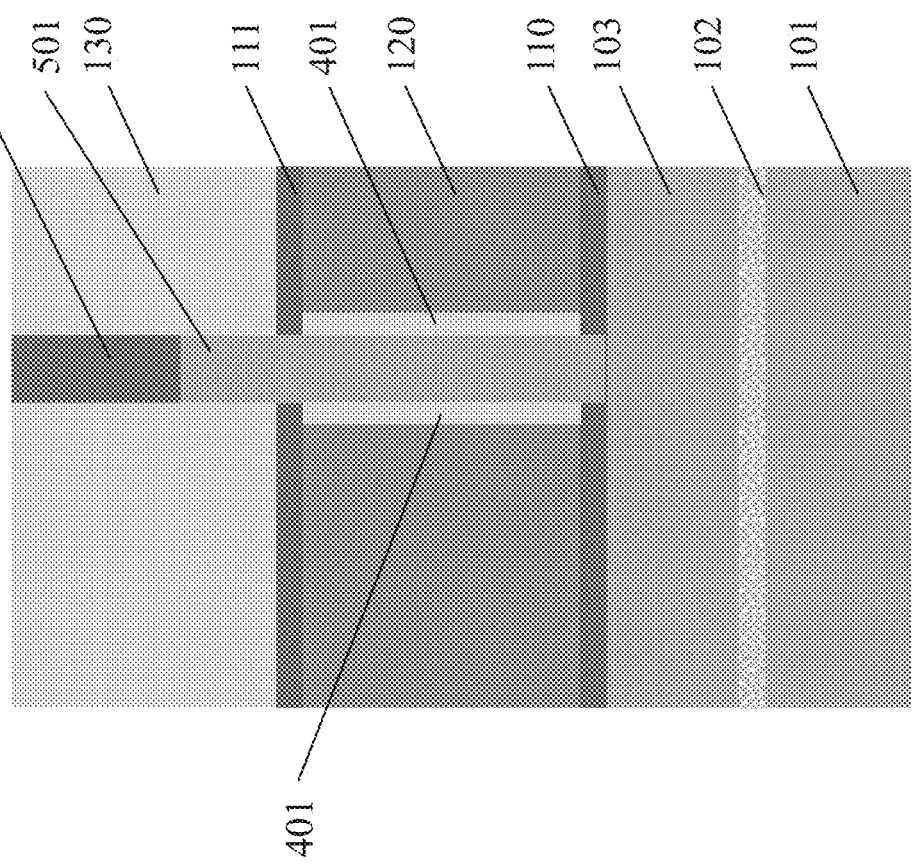
FIG. 7A is a cross section after the channel is recessed and filled with a dielectric (e.g. a nitride) followed by a CMP.

FIG. 7A is a cross section after the channel is partially recessed and filled 700 with a dielectric material (like a nitride) 701 followed by another CMP. FIG. 7B is a top view 750 showing the top of the nitride filled 701 recessed top of the channel 201/701 after the CMP.

The epitaxial channel 501 is partially recessed to a level that is still within the dielectric capping layer 130 and above the top spacer 111. The epitaxial channel 501 is recessed by etching, for example, by a selective RIE or a wet etch process.

The recessed space/opening formed over the recessed epitaxial channel 501 is filled with a dielectric material. The dielectric material 701 may be a dielectric oxide (e.g., silicon oxide), a dielectric nitride (e.g., silicon nitride), a dielectric oxynitride, or any combination thereof. The dielectric material 701 is deposited by a deposition process, for example, CVD or PVD. After deposition, the dielectric 701 is planarized, by for example by a CMP process. The dielectric material 701 forms a dielectric cap.

In some embodiments, the dielectric material 701 is silicon nitride.

Figure 8B:
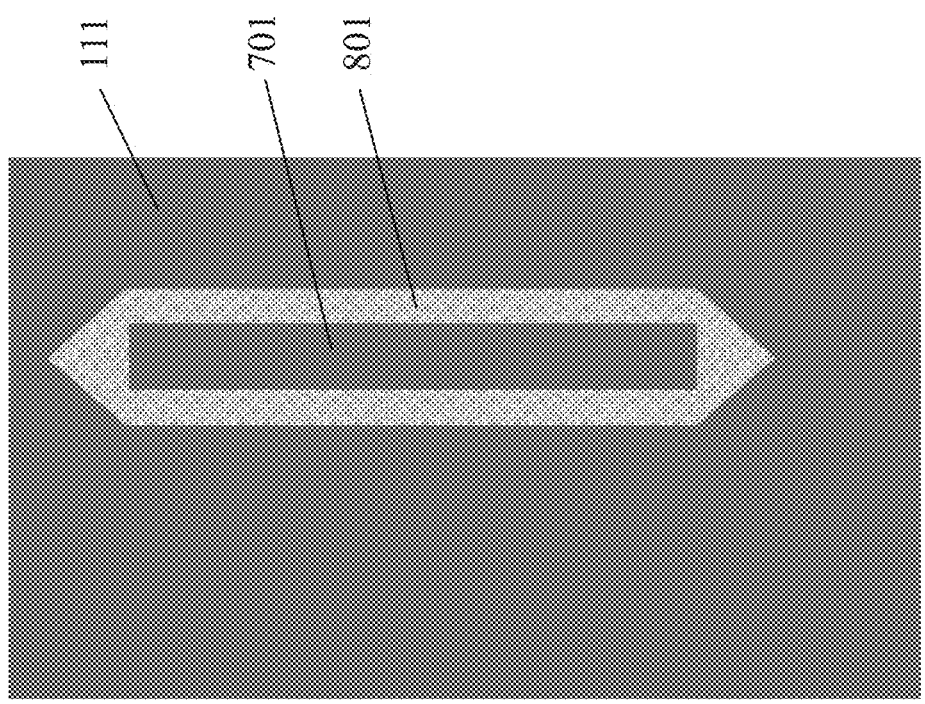
FIG. 8B is a top view showing the top of the top spacer, fill dielectric, top S/D epitaxy.
Figure 8A:
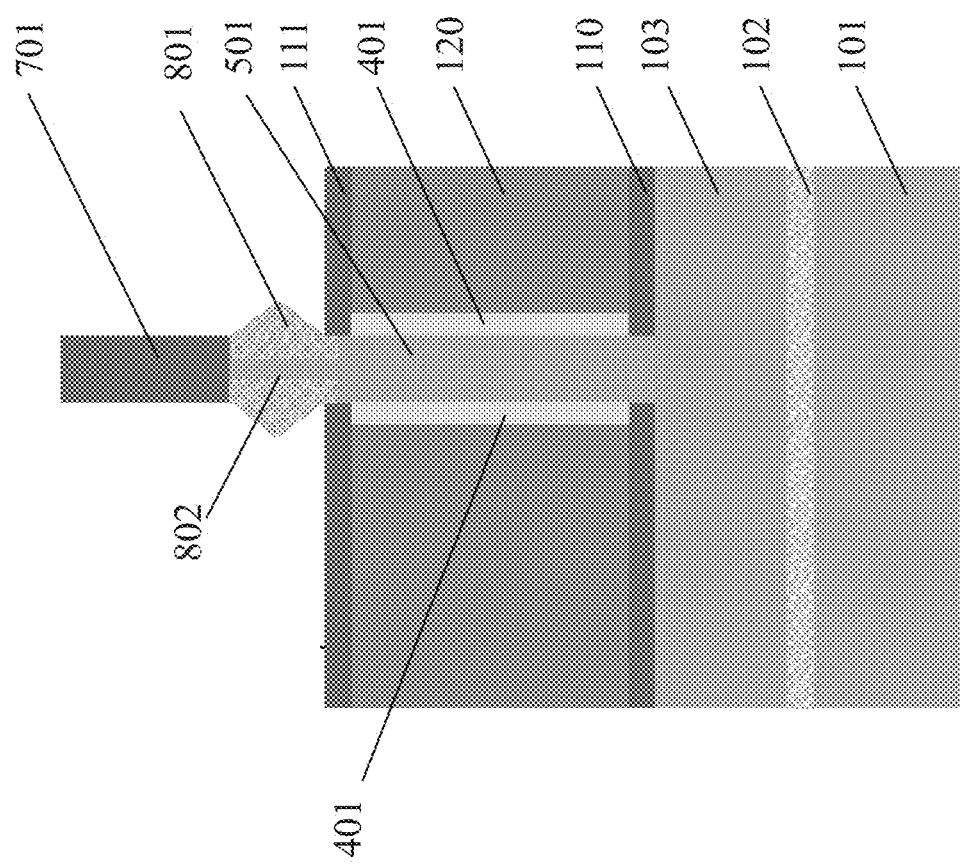
FIG. 8A is a cross section after the dielectric capping layer is removed, a top part of the channel/fin is exposed and laterally recessed, and a top S/D is epitaxial grown.

FIG. 8A is a cross section 800 after the dielectric capping layer 130 is removed, a top part of the channel/fin is exposed and laterally recessed 802, and a top S/D is epitaxial grown 801. FIG. 8B is a top view 850 showing the top of the top spacer, fill dielectric 701, and the top S/D epitaxy 801.

An epitaxial growth 801 on the recessed part 802 of the channel 501 forms a top S/D (Drain) 801. The S/D (Drain) 801 grows on the sides of the recessed part 802 of the channel 501 between the dielectric material 701 and the top spacer 111. Some epitaxial growth 801 can occur in the top spacer 111 and on the dummy gate 120 if there is enough of the channel 501 exposed in those areas by the recessing. The epitaxial growth and doping for the S/D (Drain) can be performed as described for the S/D (Source) as describe above.

The exposed channel 501 between the dielectric material 701 and the top spacer 111 can be recessed by exposure to a selective RIE or wet etch process.

FIG. 9A is a cross section 900 after forming a top protective spacer 901. FIG. 9B is a top view 950 showing a top surface of the top spacer 111, fill dielectric 701, and top protective spacer 901.

The top protective spacer 901 protects the epitaxial grown S/D 801. The top protective spacer 901 is also disposed on a sidewall of the dielectric material 701 an S/D 801. The top protective spacer 901 is made of insulating materials including, for example, dielectric oxides (e.g., silicon oxide), dielectric nitrides (e.g., silicon nitride), dielectric oxynitrides, or any combination thereof.

The top protective spacer 901 can be deposited by a deposition process, for example, CVD or PVD. The top protective spacer 901 material may be etched by a dry etch process, for example, a RIE process, such that it continues to cover the S/D 801 but is removed from regions on the surface of the dielectric material 701 and the top spacer 111. The top protective spacer 901 has a width 902 of about 5 nm to about 50 nm, or from about 6 nm to about 10 nm.

In some embodiments, the top protective spacer 901 is made of a nitride like silicon nitride.

FIG. 10A is a cross section 1000 after forming of a p-n junction 1001/1003 at each end 1005/1006, respectively, of the channel 501. FIG. 10B is a top view 1050 showing the top of the top spacer 111, fill dielectric 701, and top protective spacer 901.

The p-n junctions 1001/1003 are formed by an anneal process.

The structure 1000 is annealed for a time and at a temperature to allow a slight migration of dopants from the top S/D 801 and bottom S/D 103 with a higher concentration of dopants into the channel 501. This migration forms a top junction 1002 and a bottom junction 1001. The heavily doped S/D 103/801 are on one side of each of the respective junctions 1001/1003 and the channel region 501 is on the other side of each of the respective junctions 1005/1006.

Figure 11B:
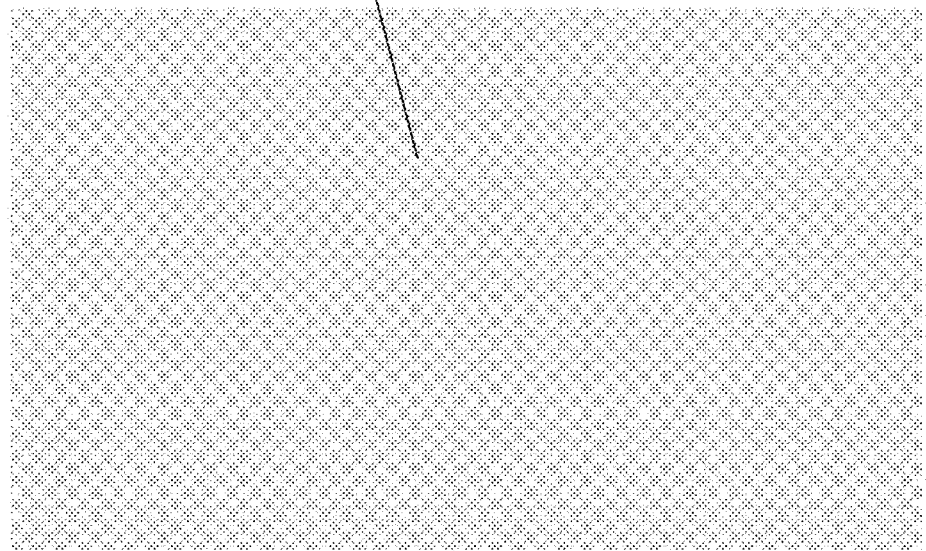
FIG. 11B is a top view showing the top of the mask.
Figure 11A:
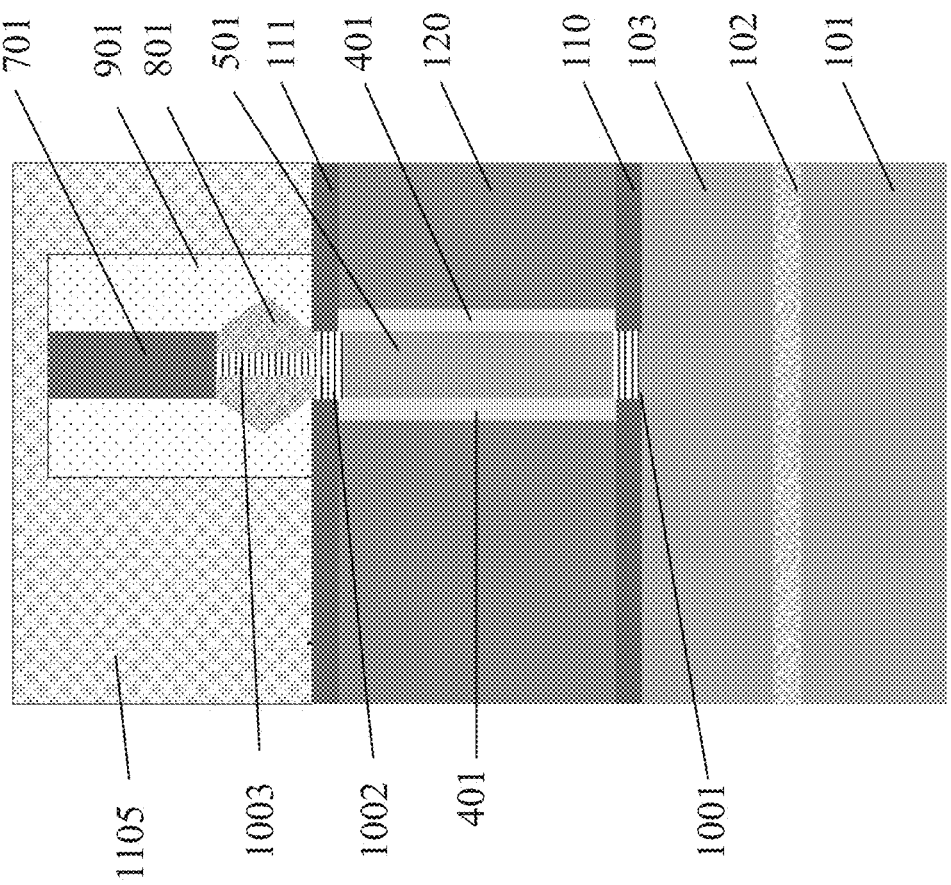
FIG. 11A is a cross section after deposition of a mask.

FIG. 11A is a cross section 1100 after deposition of a mask 1105. FIG. 11B is a top view 1150 showing the top of the mask 1105.

The mask 1105 covers the top spacer 111, fill dielectric 701, and top protective spacer 901. The mask 1105 is made of a dielectric material like those making up the bottom 110 and top spacers. The mask 1105 can be deposited by known techniques.

In some embodiments the mask 1105 is made of silicon dioxide.

Figure 12B:
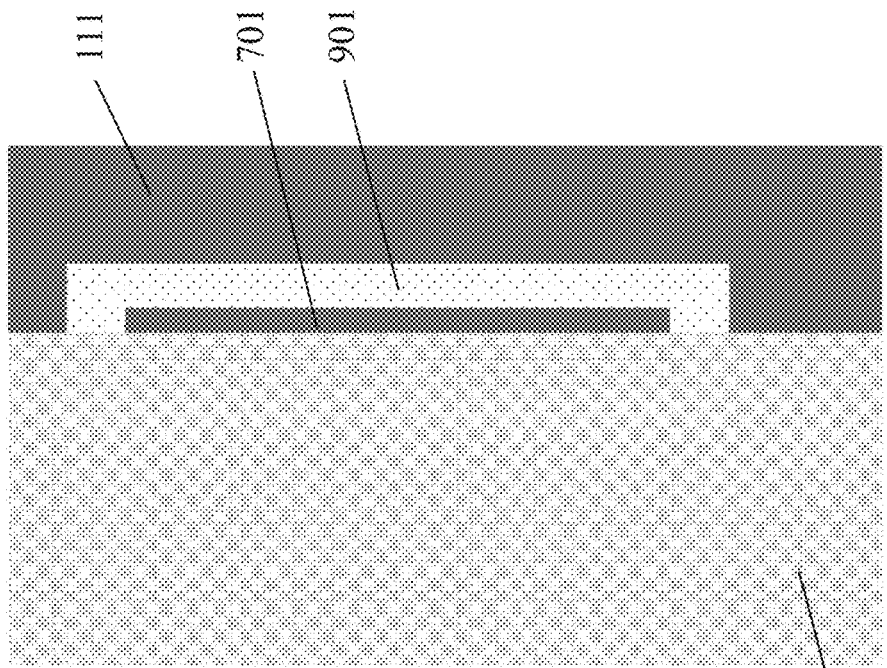
FIG. 12B is a top view showing the top of the mask with the second mask side open.
Figure 12A:
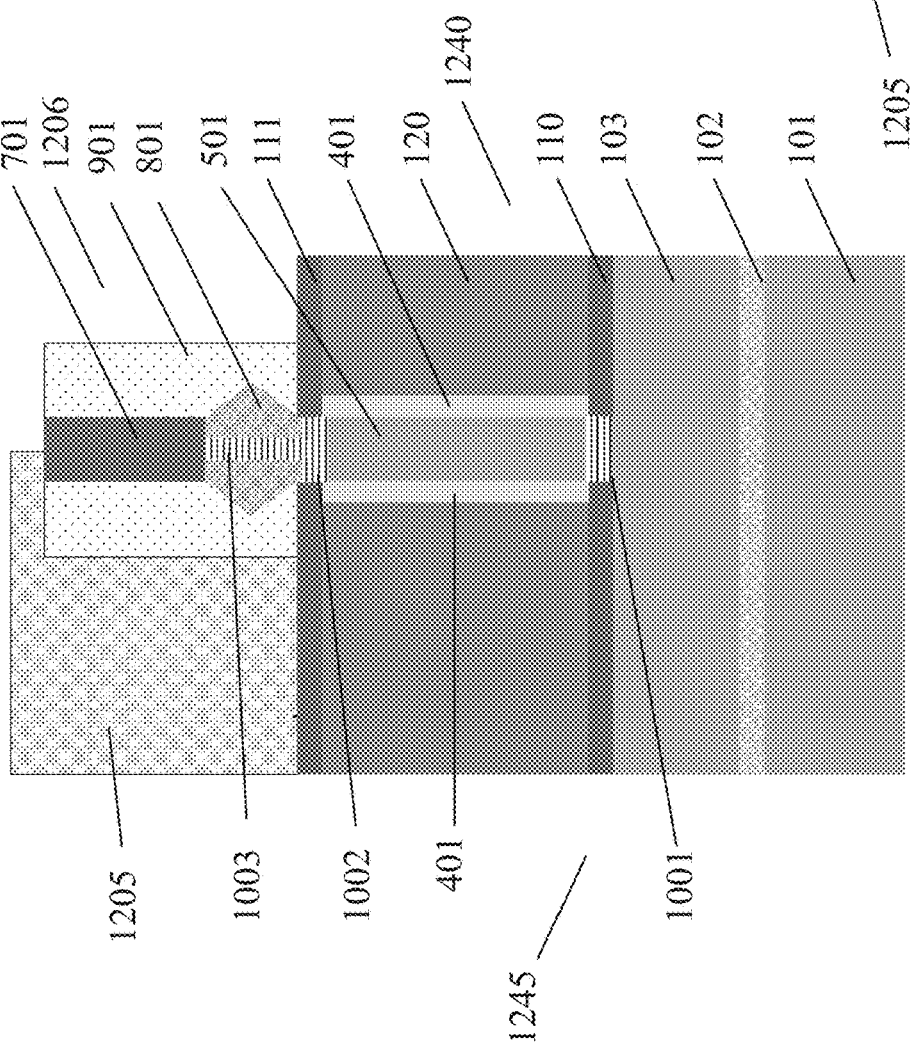
FIG. 12A is a cross section after opening a second mask side.

FIG. 12A is a cross section 1200 after opening 1206 a second mask side 1206 on a second side 1240 of the structure 1200. FIG. 12B is a top view showing the second mask side open 1206 and a remainder of the mask 1205 remaining on the first side 1245 of the structure 1200.

The mask 1105 is etched away on the second mask side 1206 by known lithographic processes like a masked RIE that is selective (and stops at) the top spacer 111. Opening 1206 the mask 1105 on the second side 1240 exposes part of the top spacer 111 and the dummy gate 120 region below the top spacer 111 that are not protected by the top protective spacer 901.

FIG. 13A is a cross section after performing a directional reactive ion etch (RH) 1300 to remove the exposed portion of the top spacer 111 and exposed part of the dummy gate 120. The directional ME 1300 stops at bottom spacer 110. FIG. 13B is a top view 1350 after the directional ME 1300 showing part of the surface of the dielectric fill 701, top protective spacer 901, and bottom spacer 110.

The directional RIE performed 1300 can occur in one or more steps. First, the portion of the top spacer 111 not protected by top protective spacer 901 is etched away. Next the dummy gate 120 not protected by the top protective spacer 901 is etched away by a process that is selective (does not substantially remove) the material making the bottom spacer 110. Accordingly, the directional RIE stops 1300 at the bottom spacer 110 and leaves the remainder of the dummy gate 120 exposed on the second side 1240.

FIG. 14A is a cross section after pulling 1400 the exposed remainder of the dummy gate 120 on the second side 1240 thereby exposing 1425 the oxidized layer 401 on the on the second side 1240. FIG. 14B is a top view 1450 after pulling 1400 the exposed part of the dummy gate 120 on the second side 1240. The dummy gate 120 material may be removed by a wet etch process, for example, exposing hot ammonia to the remaining dummy gate 120 material on the second side 1240.

Figure 15B:
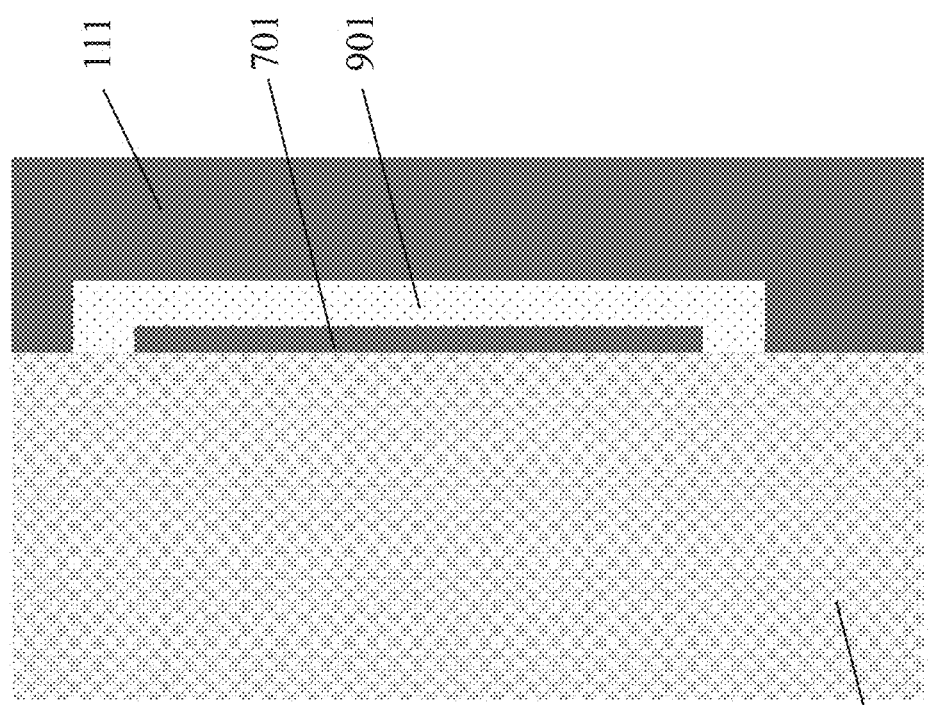
FIG. 15B is a top view after removing the exposed oxide layer.
Figure 15A:
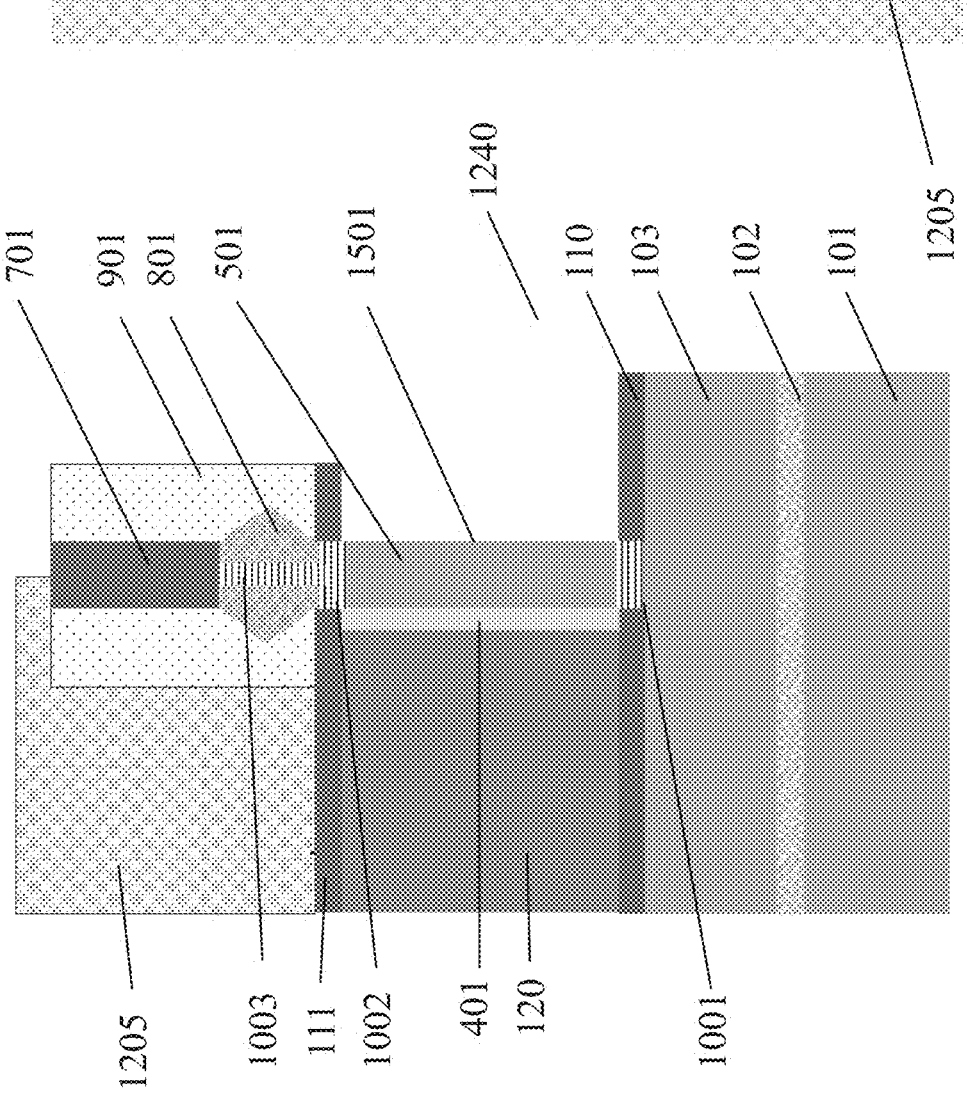
FIG. 15A is a cross section after removing the exposed oxide layer on the second channel side.

FIG. 15A is a cross section after removing 1500 the exposed oxide layer 401 and exposing a channel second side 1501 on the second side 1240 of the structure. FIG. 15B is a top view 1550 after removing 1500 the exposed oxide layer 401 on the second side 1240.

In some embodiments, the exposed oxide layer 401 is silicon dioxide that may be removed by a SiCoNi™ process chamber attached to an epitaxial reactor tool set. The SiCoNi process is made by Applied Materials, Inc. An example of a process like this is described in U.S. Pat. No. 6,454,860 issued on Sep. 24, 2002 to Metzner et al. entitled "Deposition Reactor Having Vaporizing, Mixing, and Cleaning Capabilities". An alternative process is described in U.S. Pat. No. 8,501,629 to Tang et al. entitled "Smooth SICONI Etch for Silicon-Containing Films".

FIG. 16A is a cross section after laterally recessing 1600 the channel 501 on the second side 1240. About one half of the channel 501 material, e.g. silicon, is laterally removed 1625 to expose a lateral center surface 1601 of the channel 501. Part of the top 1002 and bottom 1001 junctions are exposed. FIG. 16B is a top view 1650 after the lateral channel recess 1600.

In some embodiments, the channel 501 material is laterally removed 1625 by using a wet or gaseous etch (e.g., a HCl etch) for a time determined by experimentation so that approximately one half of the channel 501 is laterally removed 1625.

Figure 17B:
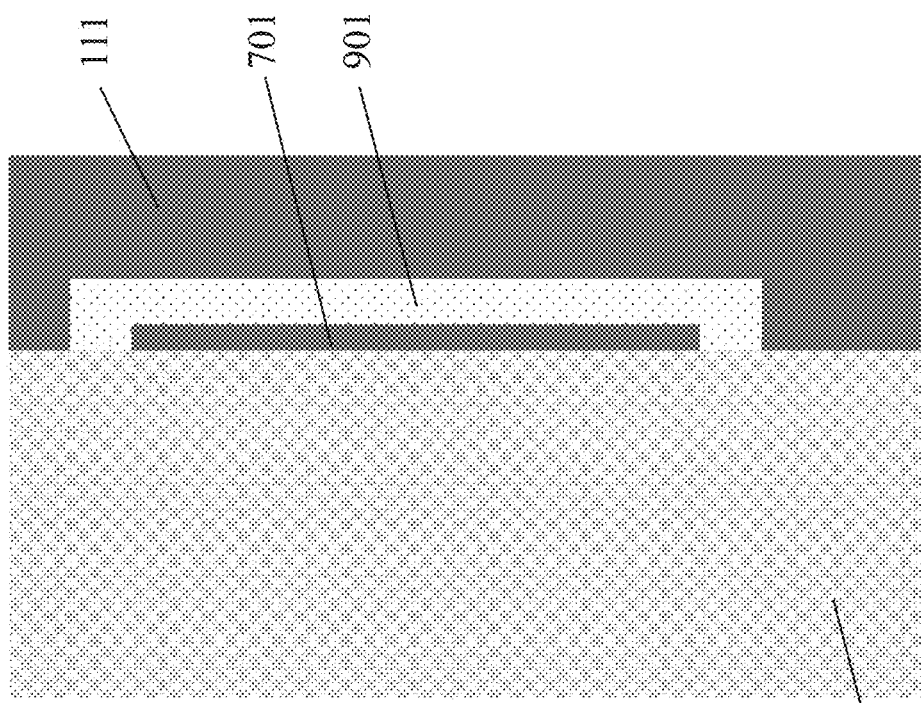
FIG. 17B is a top view after epitaxially growing the channel second side.
Figure 17A:
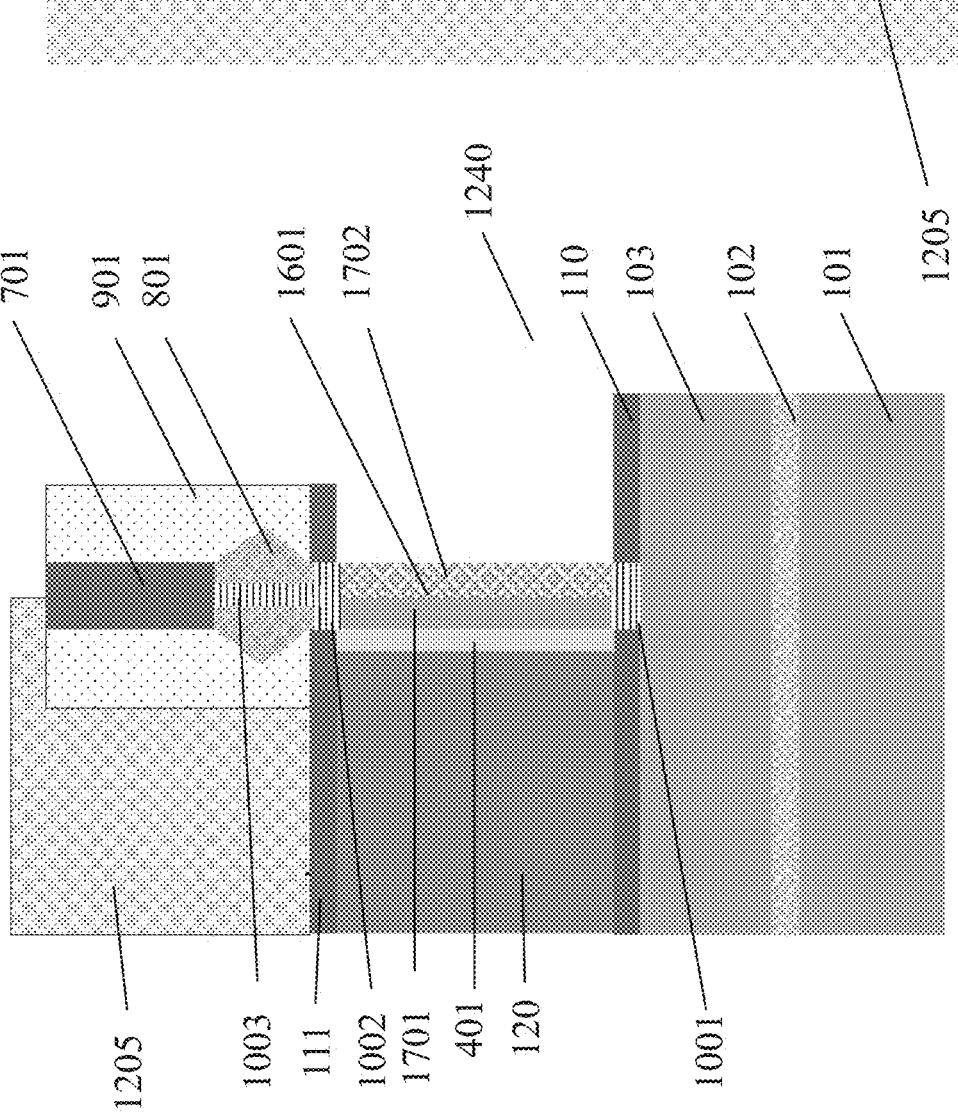
FIG. 17A is a cross section after epitaxially growing a channel second side.

FIG. 17A is a cross section after epitaxially growing 1700 of a channel second side 1702 on the exposed center lateral surface 1601 of the channel 501. FIG. 17B is a top view 1750 after epitaxially growing 1700 the channel second side 1702.

The channel second side 1702 is epitaxially grown 1700 using known methods, e.g. as described above. However, the epitaxial material of the channel second side 1702 will be different than the remaining epitaxial material originally in the channel 501 which is now a channel first side 1701.

For example, in some embodiments, the original channel 501 material is silicon which now remains as the material in the channel first side 1701. The channel second side 1702 is made of silicon germanium (SiGe) which is an epitaxially grown layer laterally grown on the exposed center layer surface 1601 of the recessed channel 501.

By choosing different materials for the channel first side 1701 and the channel second side 1702 a difference between the threshold voltage on each of the sides 1701/1702 exists. During the operation of the device, one channel side will be in accumulation while the other channel side will be in inversion with the same gate bias. A similar effect is seen when the first gate stack is made of different materials, e.g. having a different work function, than the materials making the second gate stack, as described for embodiments below.

FIG. 18A is a cross section after depositing 1800 a second gate stack materials 1825/1875, including a second high-k dielectric conformal layer 1825 and a second gate metal conformal layer (a second gate working function metal) 1875 on the exposed surfaces of the second side 1240. FIG. 18B is a top view 1850 after depositing the second gate stack 1800.

The second high-k dielectric conformal layer 1825 and the second gate metal conformal layer 1875 conformally cover the exposed surfaces and are deposited by known methods like atomic layer deposition (ALD). The conformal layers 1825/1875 are disposed on the first spacer 110, channel second side 1702, remaining exposed portions of the second spacer 111, top protective spacer 901, and over the top surfaces of the structure 1800.

The second high-k dielectric conformal layer 1825 can be a dielectric material having a dielectric constant greater than 3.9, 7.0, or 10.0. Non-limiting examples of suitable materials for the gate dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

In addition to ALD, the second high-k dielectric conformal layer 1825 may be formed by other deposition processes, for example, CVD, PECVD, evaporation, PVD, chemical solution deposition, or other like processes. The thickness of the second high-k dielectric conformal layer 1825 may vary depending on the deposition process as well as the composition and number of high-k dielectric materials used.

The second gate metal conformal layer (a second gate working function metal) 1875 is disposed over the second high-k dielectric conformal layer 1825. The type of work function metal(s) depends on the type of transistor. Non-limiting examples of suitable work function metals include p-type work function metal materials and n-type work function metal materials.

P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

In addition to ALD, the work function metal(s) can be deposited by a suitable deposition process, for example, CVD, PECVD, PVD, plating, thermal or e-beam evaporation, and sputtering.

Figure 19B:
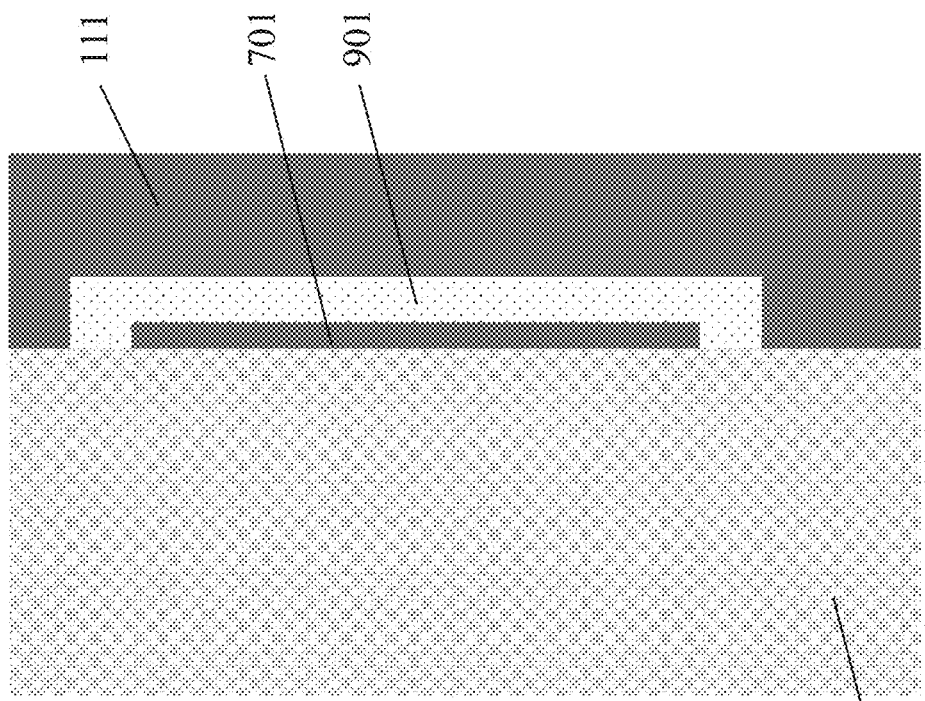
FIG. 19B is a top view after anisotropic etch.
Figure 19A:
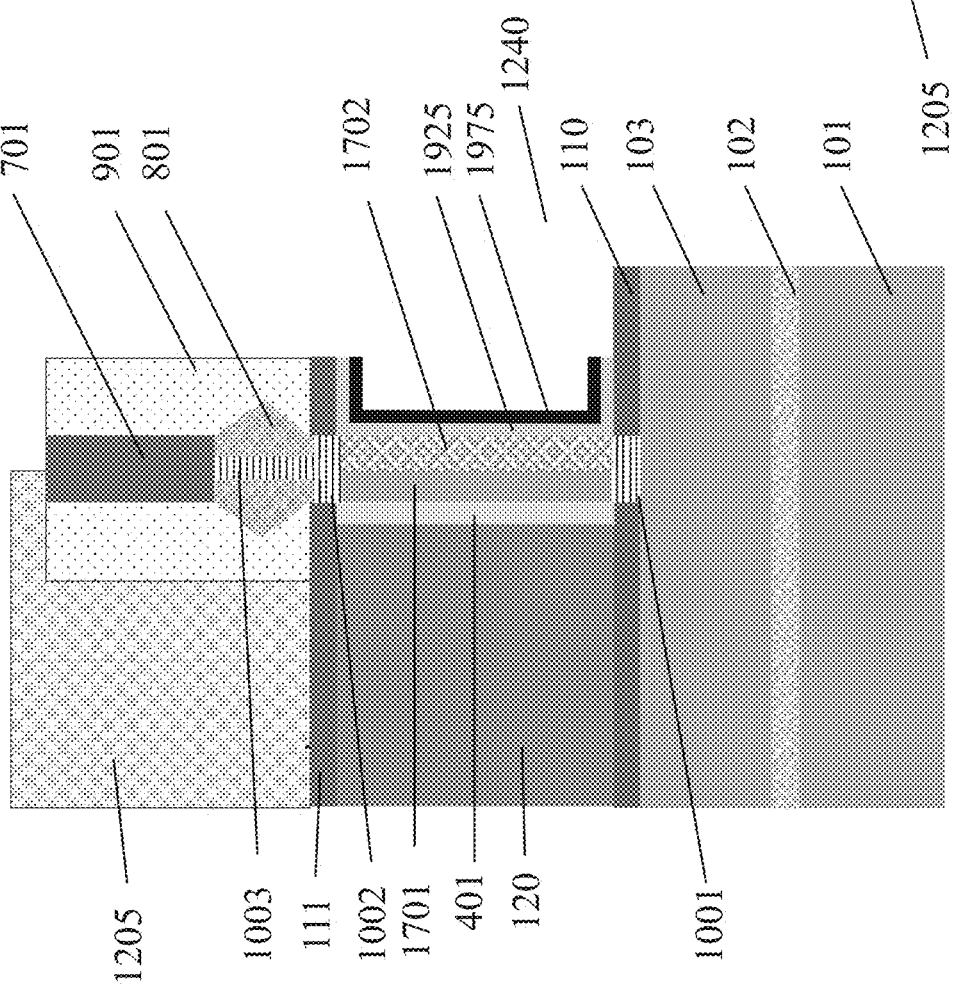
FIG. 19A is a cross section after an anisotropic etch of exposed portions of the second high-k dielectric layer and the second metal gate.

FIG. 19A is a cross section after an anisotropic etch of exposed portions 1900 of the second high-k dielectric conformal layer 1825 and the second gate metal conformal layer 1875. FIG. 19B is a top view 1950 after anisotropic etch.

The anisotropic etch is one or more direction etches that removes material not protected by the top protective spacer 901 (stopping at the bottom spacer 110) and the leaves materials of the second high-k dielectric conformal layer 1825 and the second gate metal conformal layer 1875 protected by the top protective spacer 901 remaining to form a second gate stack 1925/1975. The second gate stack 1925/1975 are the remains of the second high-k dielectric conformal layer 1825 and a second gate metal conformal layer (a second gate working function metal) 1875 after the anisotropic etch. The second gate stack overs the channel second side 1702 and portions of the first 110 and second 111 spacers on the second side 1240 that are protected from the anisotropic etch by the top protective spacer 901.

FIG. 20A is a cross section after a gate metal fill 2000 of the open spaces on the second side 1240 followed by a CMP. FIG. 20B is a top view 2050 after the metal fill 2000 followed by the CMP.

The gate metal fill material 2025 is a conductive gate metal that is deposited over the second gate working function metal 1875. Non-limiting examples of suitable conductive metals for the gate metal fill material 2025 include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, a CMP, is performed to polish the surface of the gate metal fill 2025. The CMP stops at the dielectric 701 surface.

FIG. 21A is a cross section after removing 2100 the remainder of the mask 1105 on the first side 1245. FIG. 21B is a top view 2150 after removing the mask 2100 on the first side 1245. The top view 2150 shows the top surfaces of the top spacer 111 on the first side 1245, the entire top of the top protective spacer 901, and the entire top of the fill dielectric 701.

As before, the remaining mask 1105/1205 is etched away on the first side 1245 by known lithographic processes like a masked RIE that is selective (and stops at) the top spacer 111. Opening the first side 1245 leaves an open space 2106 on the first side 1245 and exposes part of the top spacer 111 and the dummy gate 120 region below the top spacer 111 that are not protected by the top protective spacer 901 on the first side 1245.

FIG. 22A is a cross section after a directional RIE 2200 removes the exposed portion of the top spacer 111 and the exposed portion of the dummy gate 120 on the first side 1245. FIG. 22B is a top view 2250 after the RIE 2200. The directional RIE 2200 stops at bottom spacer 110.

The directional RIE performed 2200 can occur in one or more steps. First, the portion of the top spacer 111 on the first side 1245 and not protected by top protective spacer 901 is etched away. Next the dummy gate 120 on the first side 1245 and not protected by the top protective spacer 901 is etched away by a process that is selective (does not substantially remove) the material making the bottom spacer 110. Accordingly, the directional RIE stops 2200 at the bottom spacer 110 and leaves the remainder of the dummy gate 120 exposed on the first side 1245, Any inadvertent removal the gate metal fill material 2025 on the second side 1240 by these directions RIE 2200 steps is inconsequential because the gate metal fill material 2025 will be recessed later in the process flow.

FIG. 23A is a cross section 2300 after the dummy gate 120 on the first side 1245 is pulled and the oxide layer 401 is etched away from the channel first side 1701. FIG. 23B is a top view 2350 after the dummy gate 120 is pulled and the oxide 401 is etched away on the channel first side 1701. The top view 2350 shows top surfaces of the bottom spacer 110, top protective layer 901, fill dielectric 701, and gate metal fill material 2025 on the second side 1240.

The dummy gate 120 material may be removed by a wet etch process, for example, exposing hot ammonia to the remaining dummy gate 120 material on the first side 1245.

In some embodiments, the exposed oxide layer 401 on the channel first side 1701 is made of silicon dioxide that is removed by exposure to a dry etching process (e.g. SiCoNi in an epitaxial reactor), as described above.

FIG. 24A is a cross section after depositing 2400 a first conformal gate stack 2425/2475, including a first high-k dielectric conformal layer 2425 and a first gate meta conformal layer 2475. FIG. 24B is a top view after depositing the first conformal gate stack 2425/2475 showing the top view of the structure 2400 after the first gate metal conformal layer 2475 covers the top surface of the structure 2400.

In the embodiment represented 2400 the materials making the first high-k dielectric conformal layer 2425 and the first gate metal conformal layer 2475 are the same materials making the second high-k dielectric conformal layer 1825 and the second gate metal conformal layer 1875, respectively, and these materials can be deposited by any of the methods described above.

The first high-k dielectric conformal layer 2425 and the first gate metal conformal layer 2475 conformally cover on the first side 1245 the exposed surfaces the first spacer 110, channel first side 1701, remaining exposed portions of the second spacer 111, top protective spacer 901, and the top surfaces of the structure 2400.

Figure 25B:
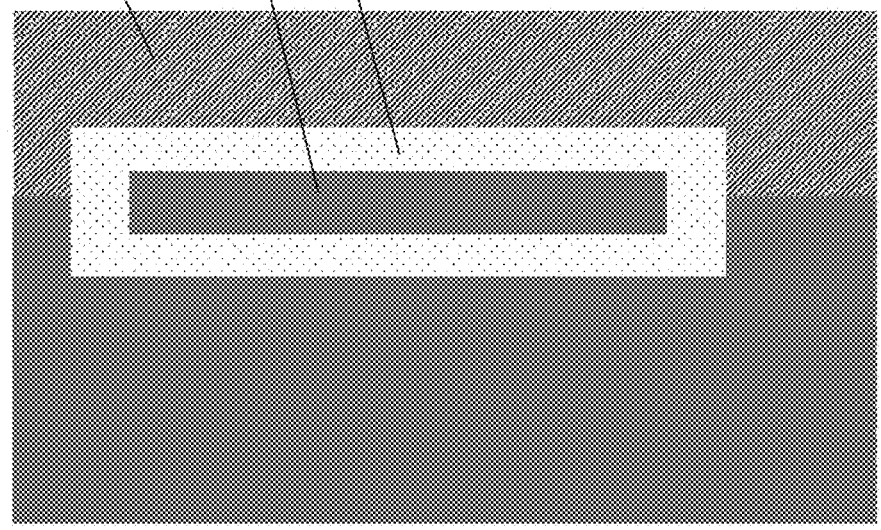
FIG. 25B is a top view after anisotropic etch.
Figure 25A:
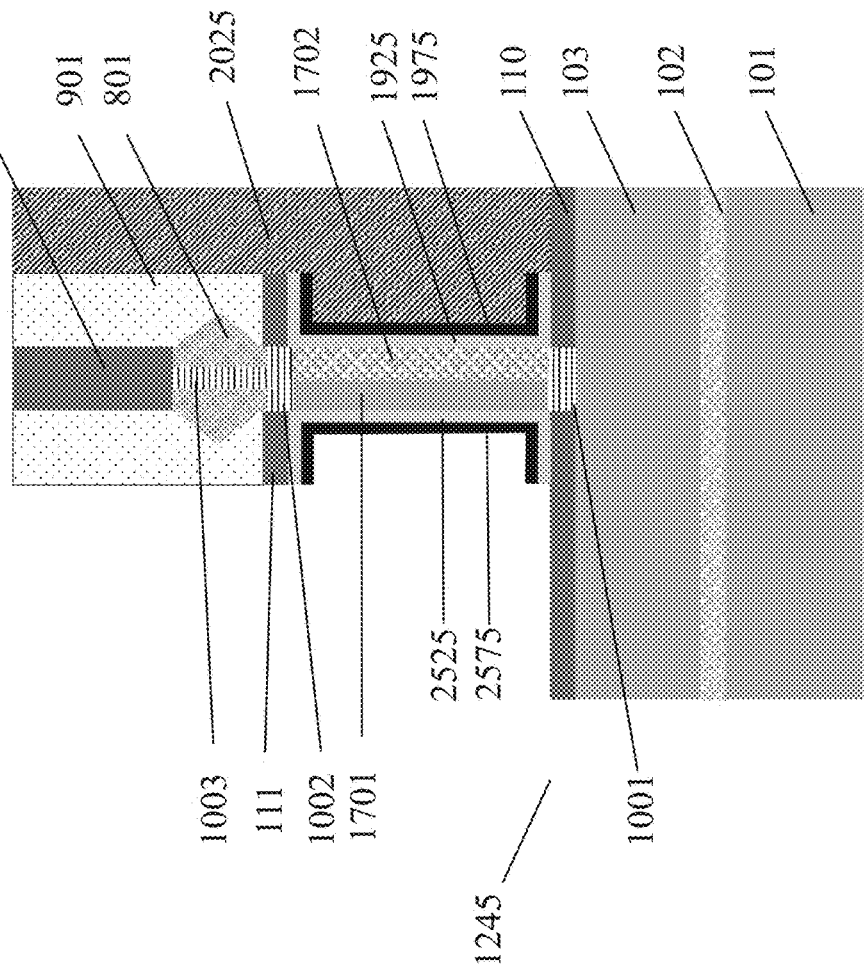
FIG. 25A is a cross section after an anisotropic etch of exposed portions of the first high-k and first metal gate etch.

FIG. 25A is a cross section after an anisotropic etch 2500 of exposed portions of the first high-k conformal layer 2425 and first gate metal conformal layer 2475 to create the first gate stack 2525/2575. FIG. 25B is a top view 2550 after anisotropic etch 2500.

The anisotropic etch 2500 is one or more directional etches that removes material not protected by the top protective spacer 901 (stopping at the bottom spacer 110) and the leaves materials of the first high-k dielectric conformal layer 2425 and the second gate metal conformal layer 2475 protected by the top protective spacer 901 remaining to form a first gate stack 2525/2575. The first gate stack 2525/2575 are the remains of the first high-k dielectric conformal layer 2525 and a first gate metal conformal layer (a second gate working function metal) 2575 after the anisotropic etch 2500. The first gate stack overs the channel first side 1701 and portions of the first 110 and second 111 spacers on the first side 1245 that are protected from the anisotropic etch 2500 by the top protective spacer 901.

Note that in the embodiment shown 2500, the first gate stack 2525/2575 is made from the same materials as the second gate stack 1925/1975. The first gate stack 2525/2575 interfaces with the channel first side 1701 and the second gate stack 1925/1975 interfaces with the channel second side 1702.

FIG. 26A is a cross section after a first side gate metal fill 2600 of the open spaces on the first side 1245 followed by a CMP. FIG. 26B is a top view 2650 after the first side gate metal fill 2600 followed by the CMP.

The first gate metal fill material 2625 is a conductive gate metal that is deposited over the first gate working function metal 2575. The first gate metal fill 2625 material can any material that can be used as a second gate metal file 2025 material that is deposited by any of the same methods. In some embodiments, the first gate metal fill 2625 material and the second gate metal file 2025 material are the same.

A planarization process, for example, a CMP, is performed to polish the surface of the first gate metal fill 2625. The CMP stops at the fill dielectric 701 surface.

Figure 27B:
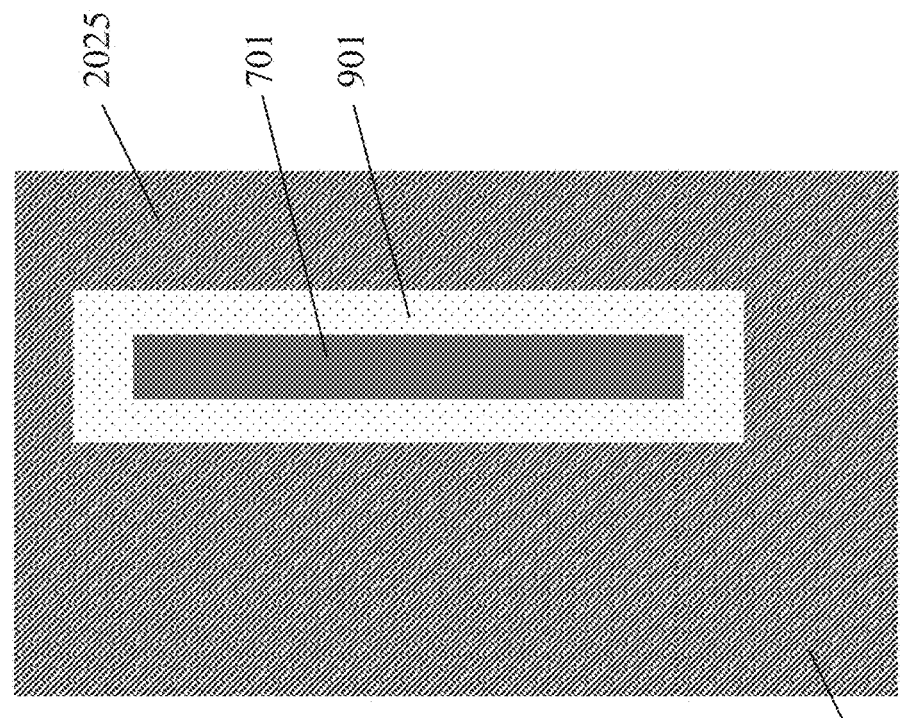
FIG. 27B is a top view after the recess of the first and second side metal fill.
Figure 27A:
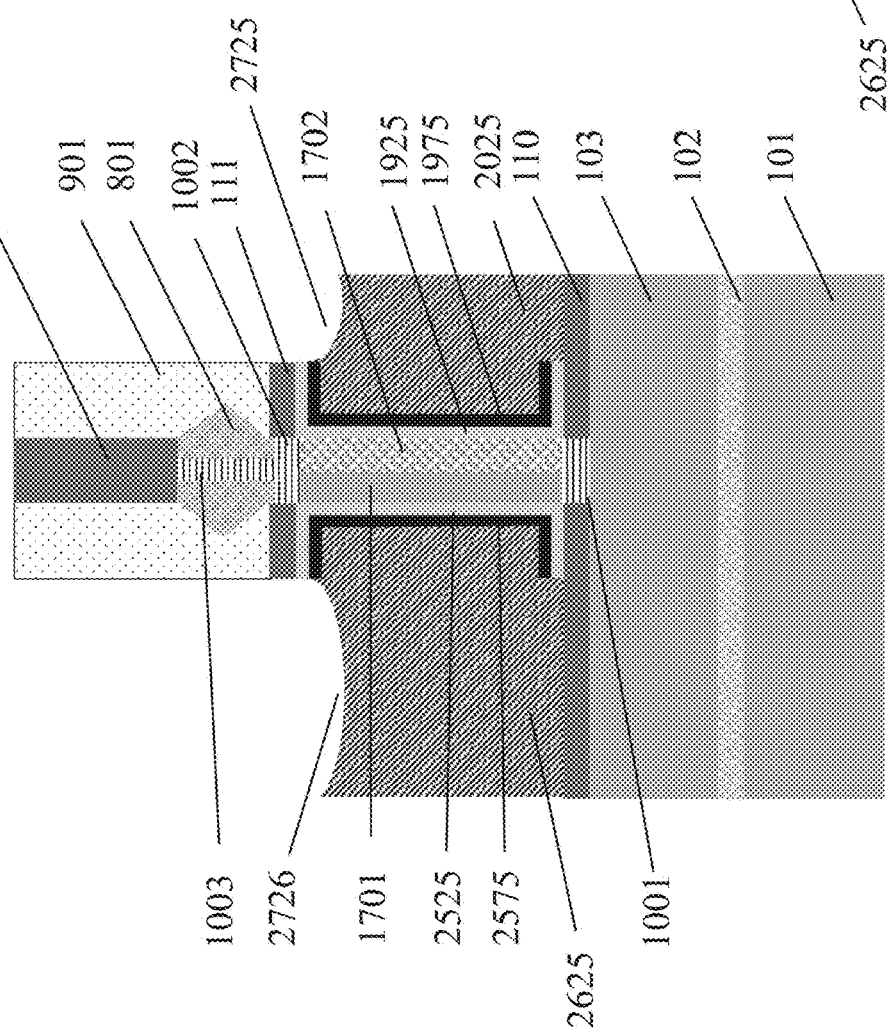
FIG. 27A is a cross section after a recess of the first and second side metal fill.

FIG. 27A is a cross section after a recess 2700 of the first 2625 and second 2025 gate metal fill. FIG. 27B is a top view 2750 after the recess 2700 of the first 2625 and second 2025 side metal fill.

The first 2625 and second 2025 gate metal fill is exposed to a directional recess RIE 2700 for a time determined by experiment that form a recessed the first 2726 and second 2725 gate metal fill below the top spacer 111. The materials protected by the top protective spacer are substantially not etched by this directional recess ME 2700. These are standard gate metal patterning processes, well known in the art.

FIG. 28A is a cross section after a gate lithography and RIE removes 2800 some of the first side metal fill 2625. FIG. 28B is a top view 2850 after the gate lithography and RIE removes 2800 some of the first side metal fill 225 exposing the bottom spacer 110 on the first side 1245. The structure is masked by known lithographic techniques and then exposed to a selective directional RIE that removes some of the first 2726 and/or second 2725 gate metal fill to define the final footprint of the structure and to expose a first end 2802 of the top protective spacer 901 and second end 2802 of the top protective spacer 901. An opening 2825 is shown in the cross section 2800 and a part of the exposed top surface of the bottom spacer 110 is shown in the top view 2850. The RIE used can be the same as that used to recess the first 2726 and second 2725 gate metal fill.

Figure 29B:
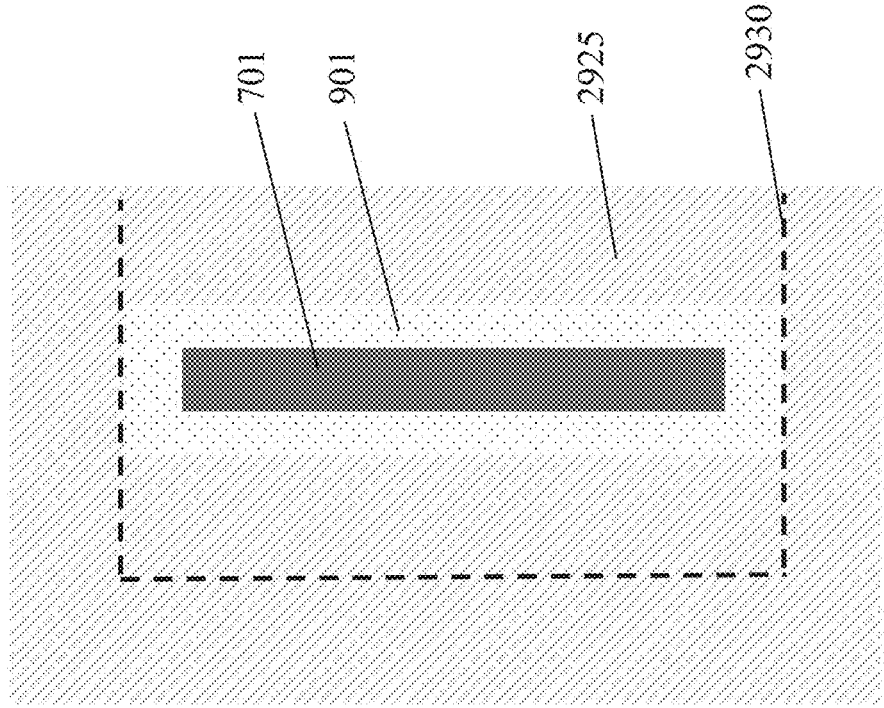
FIG. 29B is a top view after the deposition of an interlayer dielectric and a CMP.
Figure 29A:
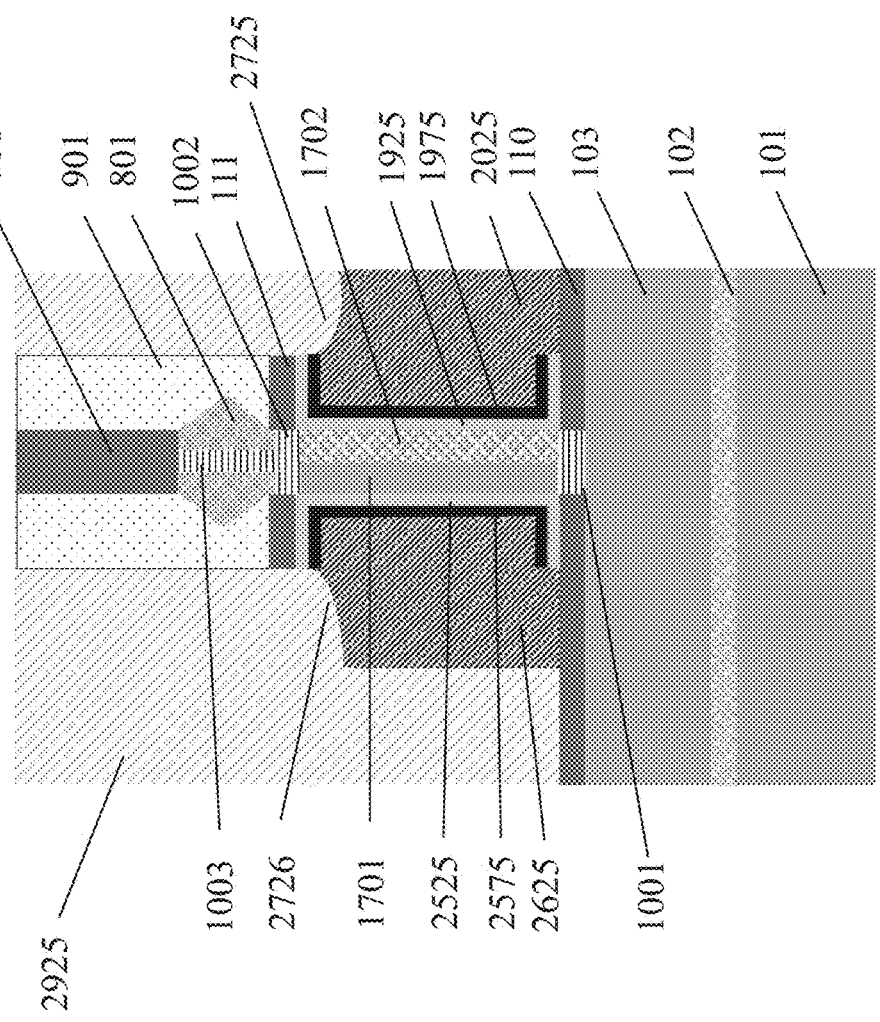
FIG. 29A is a cross section after a deposition of an interlayer dielectric and a CMP.

FIG. 29A is a cross section after a deposition 2900 of an interlayer dielectric (ILD) 2925 and a CMP. FIG. 29B is a top view 2950 after the deposition of the ILD 2925 and a CMP. The top view 2950 shows the top surface of the ILD 2950, top protective spacer 901, and fill dielectric 701 after the planarizing/CMP. The footprint 2930 of the structure 2900 is shown in phantom view 2930.

The ILD 2925 may be formed by depositing, for example, a low-k dielectric material (with k<4.0). The ILD 2925 material includes but is not limited to, silicon oxide, spin-on-glass, a flowable oxide, a high-density plasma oxide, borophosphosilicate glass (BPSG), or any combination thereof. The ILD layer 2925 is deposited by a deposition process, including, but not limited to CVD, PVD, PECVD, ALD, evaporation, chemical solution deposition, or like processes.

FIG. 30A is a cross section after the forming the external connections 3001/3025/3030 in a first embodiment 3000 of the completed device with two different channel sides 1701/1702 and the first 2525/2575 and second 1925/1975 gate stacks made with the same materials. FIG. 30B is a top view 3050 after the forming the external connections 3001/3025/3030 in the first embodiment 3000 of the completed device. The cross section in FIG. 30A is taken at cross section 3040 shown in the top view 3050.

Generally, for each of the external connections 3001/3025/3030, an etch process, such as a RIE, can be performed using the patterned resist as an etch mask (e.g. a photo resist) to remove material in a trench location and to a depth where the respective external connections 3001/3025/3030 will be located. The respective trench locations are then filled with a filled with a conductive material or a combination of conductive materials. The conductive material filling may be a conductive metal, for example, aluminum (Al), platinum (Pt), gold (Au), tungsten (W), titanium (Ti), Cobalt (Co) or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the structure 3000.

For example, one or more trenches in location(s) 3030 are formed through the ILD 2925 and the bottom spacer 110 until the doped source 103 layer is exposed at the bottom of each trench. Conductive material filling these trenches forms the external connection(s) to S/D (source) layer 103.

Similarly, one or more trenches in location(s) 3025 are formed through the ILD 2925 and into the first 2625 and/or second 2025 gate metal fill. Conductive material filling these trenches 3025 forms the external connection(s) to the single external gate connection 3025. Note that the first 2625 and/or second 2025 gate metal fill regions are electrically connected and in many embodiments are one continuous, homogenous material 2625/2025.

Also, one or more trenches in location(s) 3001 are formed through the fill dielectric 701 the S/D (Source/Drain) 801. Conductive material filling these trenches 3001 forms the external connection(s) to the S/D (Source/Drain) 3001.

FIGS. 31A, 31B, 32A, and 32B show method steps and structures that are altered in the process flow disclosed so far and that create a second embodiment of the VFET. The second embodiment has two different channel sides 1701/1702 and the first gate stack 3125/3175 that is different than the second gate stack 1925/1975.

Figure 31B:
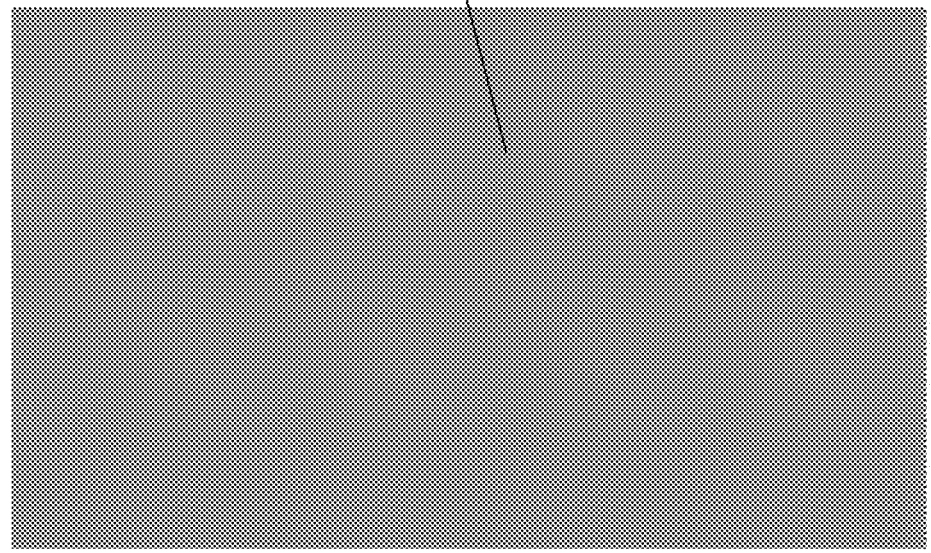
FIG. 31B is a top view of the second embodiment in FIG. 31A with different first and second gate stacks.
Figure 31A:
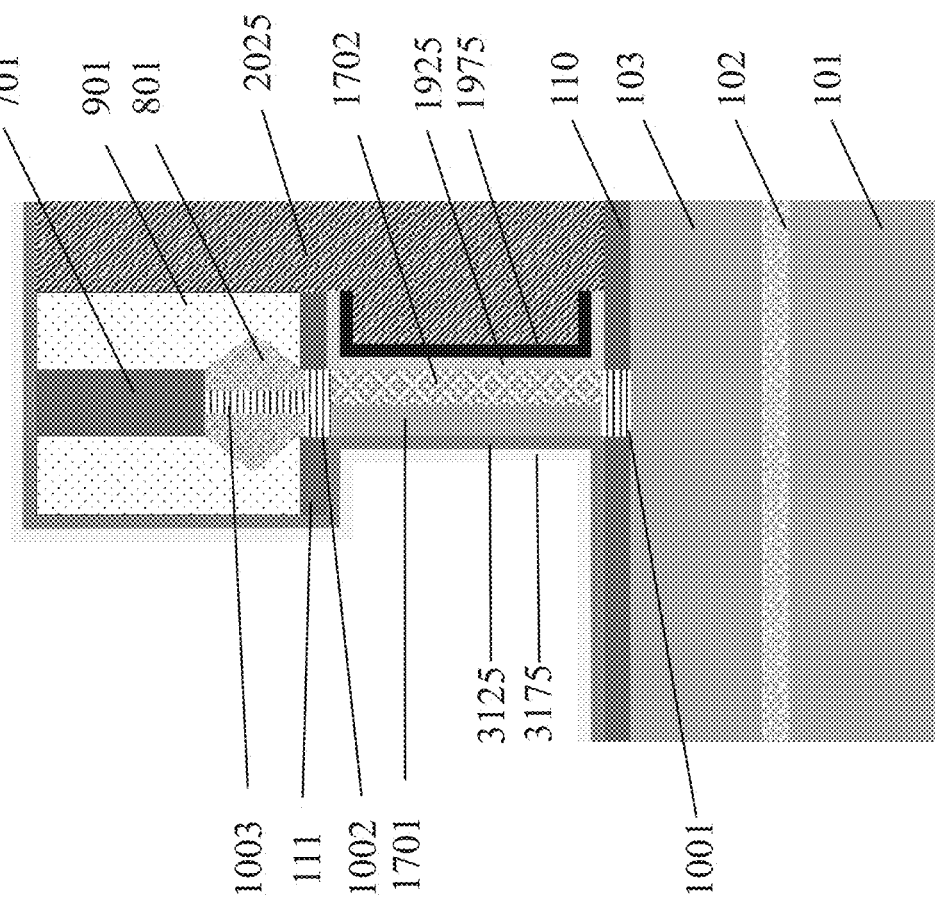
FIG. 31A is a cross section after depositing a first gate stack, including a first high-k dielectric layer and a first gate metal layer, replacing the steps shown in FIG. 24A, and creating a second embodiment with different first and second gate stacks and two different channel sides.

For the second embodiment, the process steps and structures shown in FIGS. 31A and 31B replace those shown in FIGS. 24A and 24B.

FIG. 31A is a cross section after depositing 3100 a first conformal gate stack 3125/3175, including a first high-k dielectric conformal layer 3125 and a first gate metal conformal layer 3175. The materials used in a first high-k dielectric conformal layer 3125 and a first gate metal conformal layer 3175 are different than those in the second high-k dielectric layer 1925 and the second gate metal layer 1975, respectively. Nevertheless, the layers in each the first conformal 3125/3175 and second 1925/1975 gate stacks can be deposited by the same processes, as described above.

FIG. 31B is a top view of the second embodiment in FIG. 31A with different first and second gate stacks showing the first conformal gate metal layer 3175 conformal disposed over all the horizontal surfaces.

After the process steps and strictures shown in FIGS. 31A and 31B replace those shown in FIGS. 24A and 24B, the process flow continues as described above and produces the second embodiment as shown in FIGS. 32A and 32B.

FIG. 32A is a cross section of a completed second embodiment 3200 of the device created by continuing the flow process after replacing the steps shown in FIG. 24A to create a device 3200 with different first 3225/3275 and second gate stacks 1925/1975 and two different channel sides 1701/1702.

FIG. 32B is a top view 3250 of the second embodiment in FIG. 31A with different first 3225/3275 and second gate stacks 1925/1975 and two different channel sides 1701/1702 and external connections 3001/3025/3030 shown.

Figure 33B:
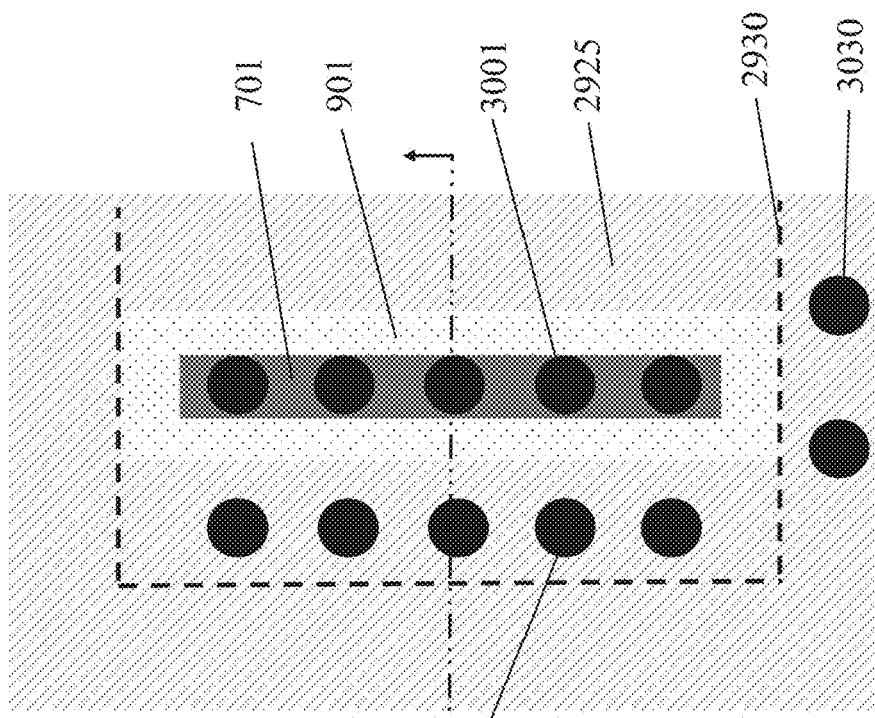
FIG. 33B is a top view of the third embodiment in FIG. 33A with different first and second gate stacks and a single channel material.
Figure 33A:
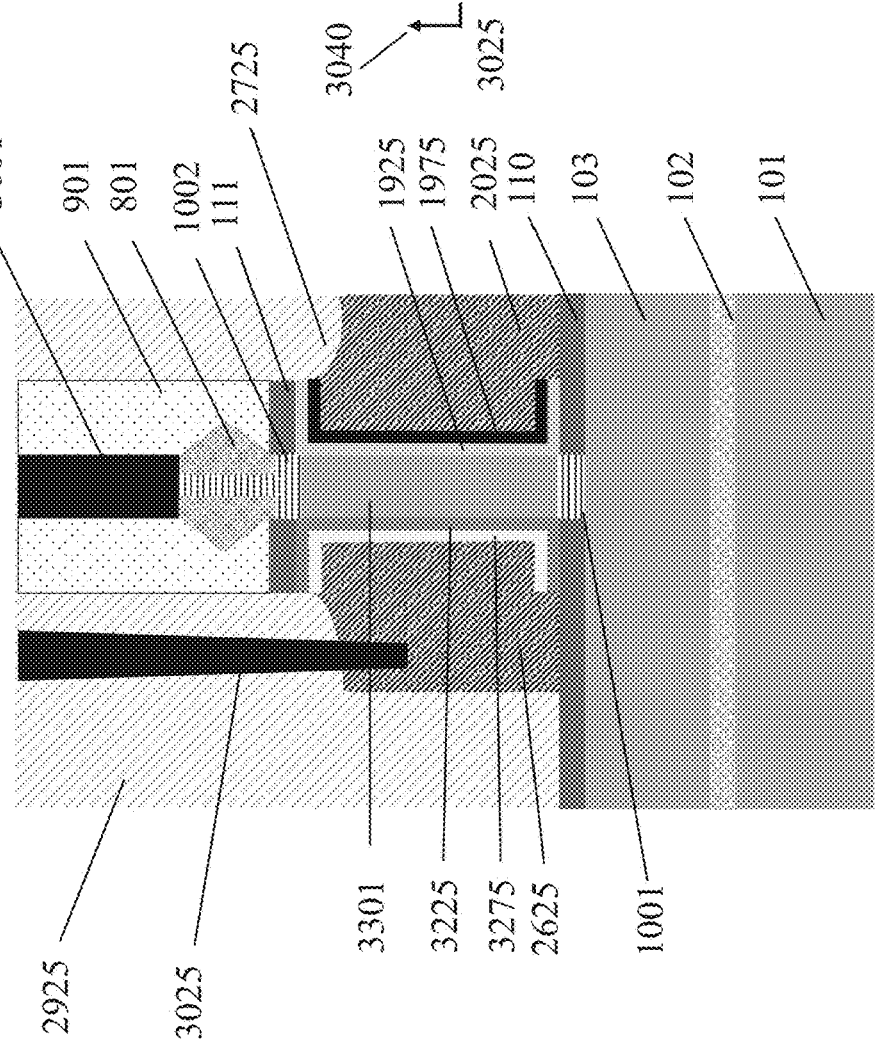
FIG. 33A is a cross section of a completed third embodiment of the device created by omitting the process steps shown in FIGS. 16A, 16B, 17A, and 17B, and the continuing the process flow while replacing the methods and structures in FIGS. 24A and 24B with those of shown in FIGS. 31A and 31B, respectively, to create a device with different first and second gate stacks and a single channel material.

FIG. 33A is a cross section of a completed third embodiment 3300 of the device created by omitting the process steps shown in FIGS. 16A, 16B, 17A, and 17B, and the continuing the process flow while replacing the methods and structures in FIGS. 24A and 24B with those of shown in FIGS. 31A and 31B, respectively, to create a device 3300 with different first 3225/3275 and second gate stacks 1925/1975 and only a single channel material 3301. In this embodiment there is no need to etch the side of the channel and epitaxially regrow it.

FIG. 33B is a top view of the third embodiment shown in FIG. 33A with different first 3225/3275 and second gate stacks 1925/1975 and only a single channel material 3301. As before, external connections 3001/3025/3030 shown.

Figure 34B:
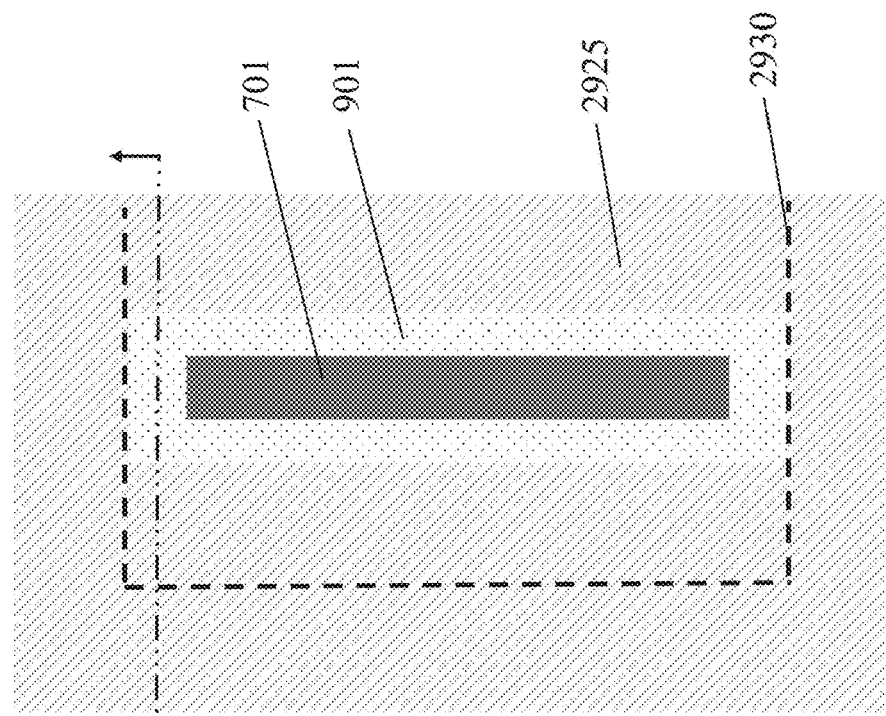
FIG. 34B is a top view showing the view of the cross section in FIG. 34A.
Figure 34A:
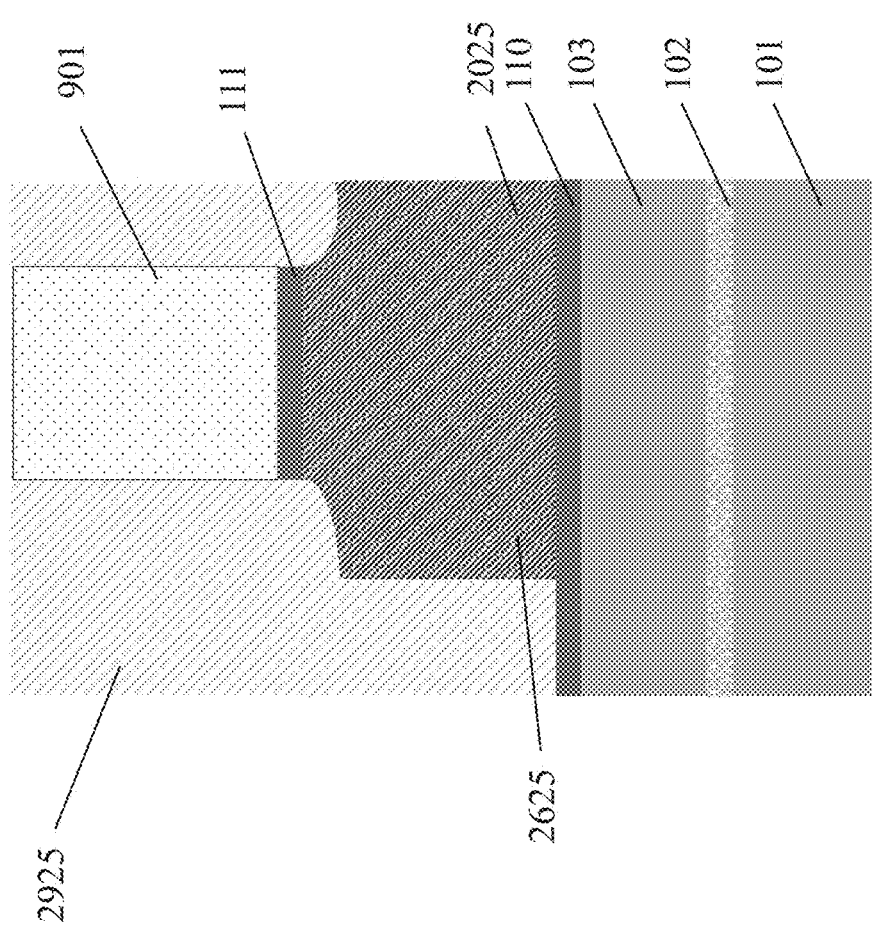
FIG. 34A is a cross section taken for any of the three embodiments taken from a different cross-section view of the structure as a starting point for the process flow of making a dielectric fill region.

FIG. 34A is a cross section taken for any of the three embodiments 3400 taken from a different cross-section view 3440 of the structure 3400 as a starting point for the process flow of making a dielectric fill region. The fill dielectric 701, channel 1701/1702/3301, S/D 801, and junctions 1001/1002 are not seen in the cross section 3400 from view 3440.

FIG. 34B is a top view showing the view 3440 of the cross section in FIG. 34A.

FIG. 35A is a cross section after the deposition 3500 of a floating-body mask 3525 with a floating-body window opening 3575. FIG. 35B is a top view 3550 showing the floating-body mask 3525 with the floating-body window opening 3575. A first end of the fill dielectric 701 and top protective spacer 901 is seen through the floating-body window opening 3575.

The floating-body mask 3525 with the floating-body window opening 3575 is deposited using known lithographic deposition techniques. The floating-body mask 3525 can be made of the same materials and deposited by the same methods as the mask 1105. In some embodiments, the floating-body mask 3525 is made of a nitride, an oxide, or an organic planarization layer (OPL).

Figure 36B:
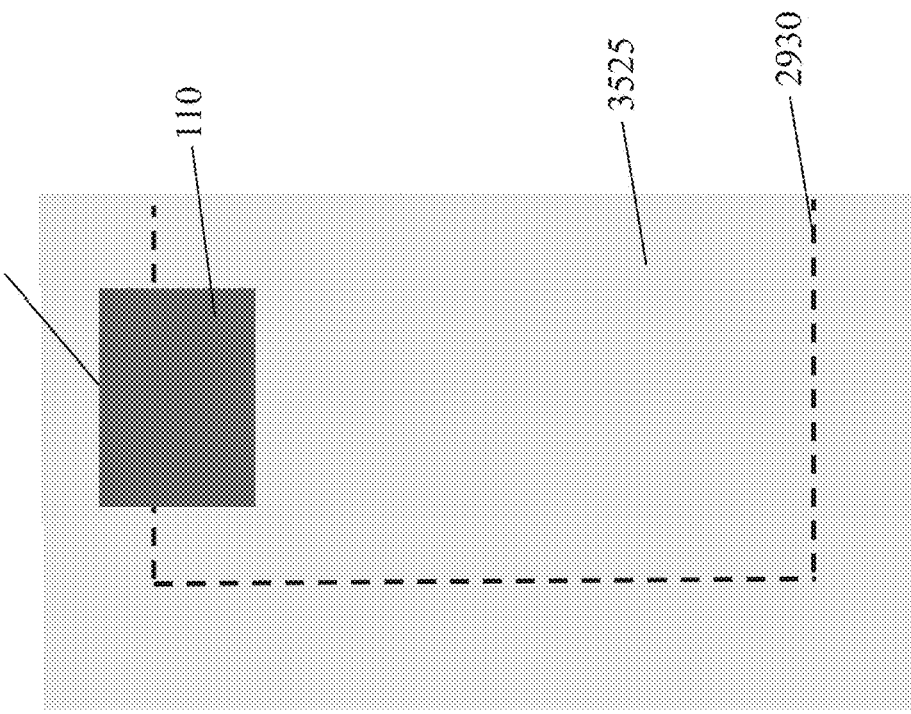
FIG. 36B is a top view of the opening.
Figure 36A:
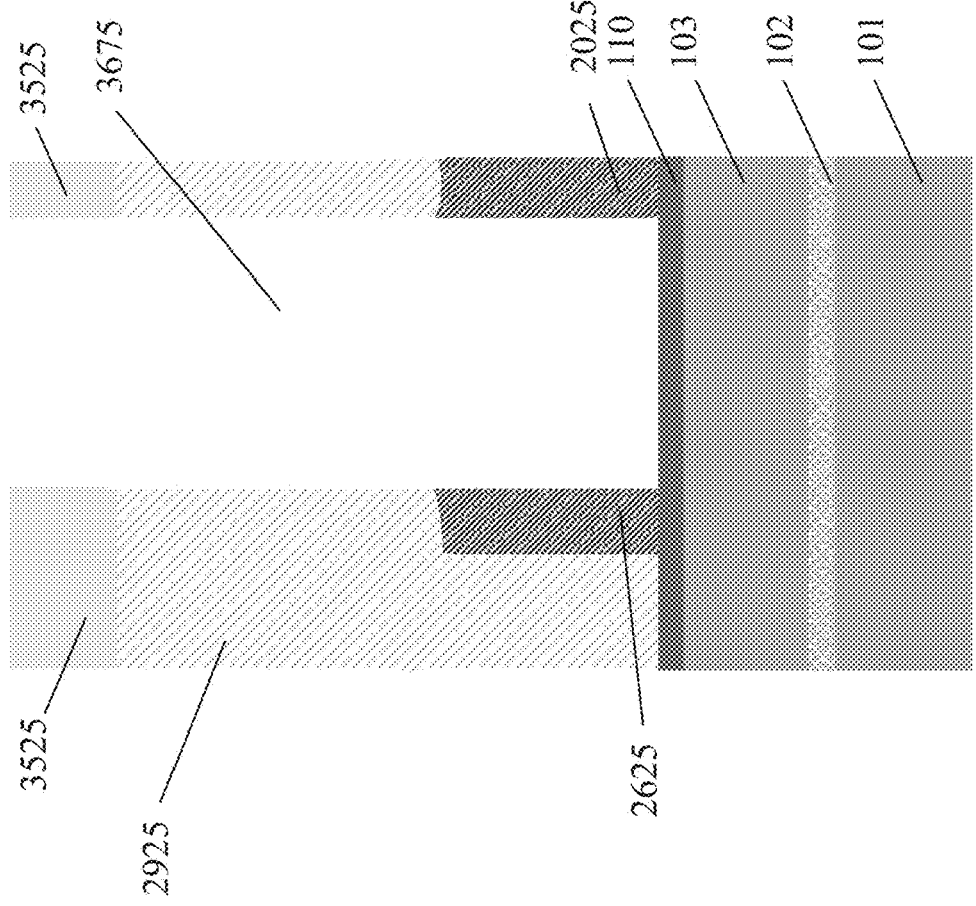
FIG. 36A is a cross section after a floating-body RIE forms an opening down to the bottom spacer.

FIG. 36A is a cross section after a floating-body RIE 3600 forms an opening 3675 exposing a first and/or a second channel end down to the bottom spacer 110. FIG. 36B is a top view 3650 showing an example trench/opening 3675 after the floating-body ME 3600.

The floating-body ME 3600 can be one or more RIE steps that are selective (do not etch) the material making the bottom spacer 110. The floating-body RIE 3600 removes the ILD 3525 and first 2625 and/or second 2025 gate metal fill material left unprotected by the floating-body window opening 3575 to create the trench/opening 3675. In alternative embodiments, the trench/opening, 3675 can be opened under the floating-body window openings 3575 at a second end of the channel 1701/1702/3301. By changing the ME steps, the window opening 3575 can be etched differently, as described below.

Figure 37B:
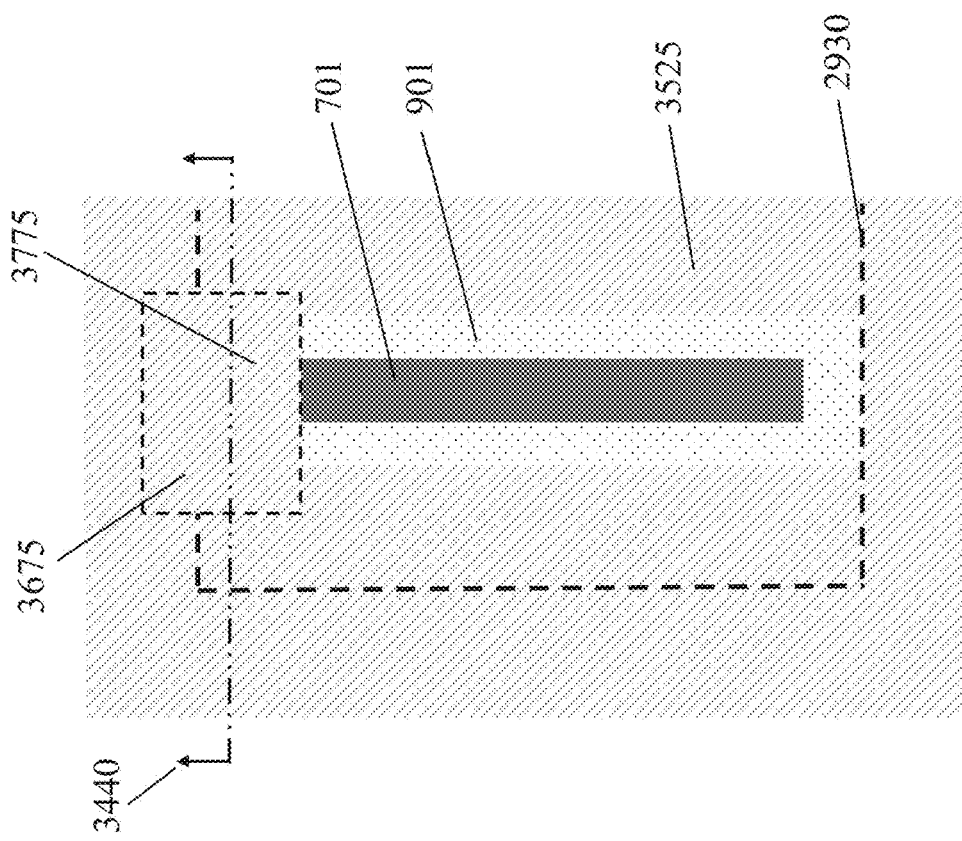
FIG. 37B is a top view showing the filled opening of the structure in FIG. 37A.
Figure 37A:
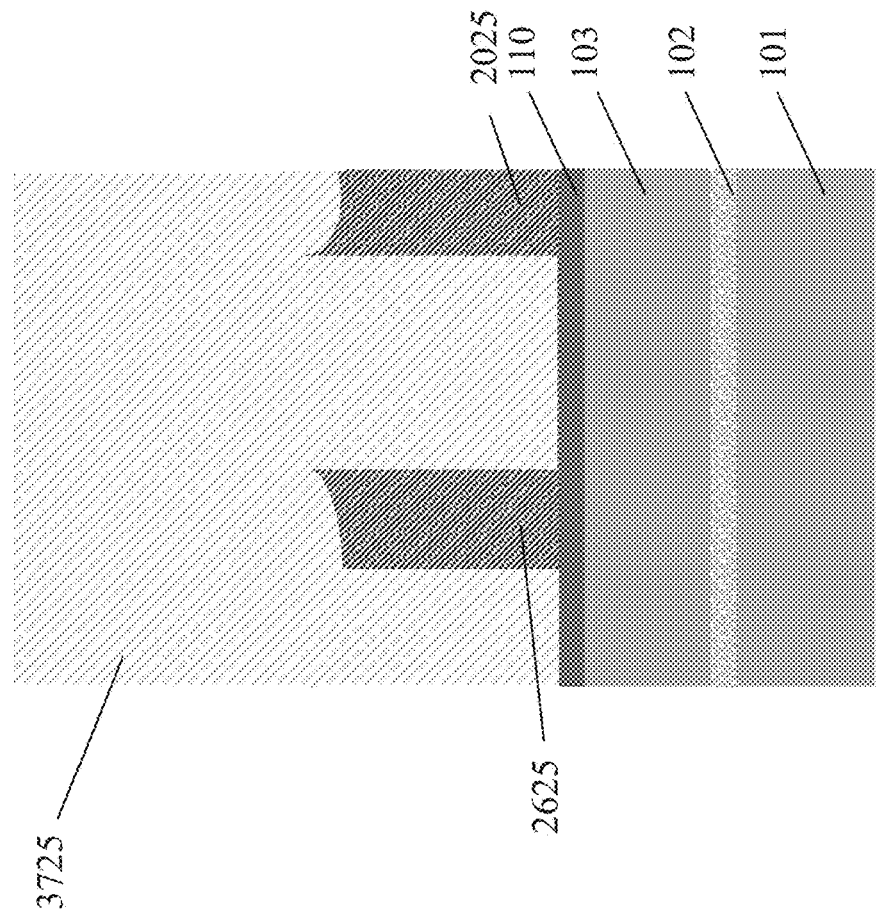
FIG. 37A is a cross section after the floating-body mask removal, an ILD fill of the opening, and a CMP.

FIG. 37A is a cross section 3700 after the floating-body mask 3525 removal, an ILD fill 3725, and a CMP. FIG. 37B is a top view 3750 showing the dielectric 701, top protective spacer 901, and trench/opening 3675 (in phantom view) of the structure 3700 in FIG. 37A. In this view 3750, the trench/opening 3675 is filled with dielectric 3775 which covers the channel end (not shown).

The floating-body mask 3525 is removed by known lithographic processes. The ILD fill 3725 is performed by known processes and can use the same materials and deposition methods as described above, e.g. the ILD 2925.

FIG. 38A is a cross section of a completed device 3800 with a dual side channel 1701/1702 first channel end (shown in view 3850) floating body region 3801 serving as a capacitor for the 1T DRAM. FIG. 38B is a top view 3850 at cross section 3840 showing the channel 1701/1702 end 3801 without gate stacks 1925/1975 and 2525/2575 forming the floating body region 3801. The channel end 3801 transitions 3805 into the dielectric filled trench 3675 to form the floating body region 3801 and resultant capacitance used by the 1T DRAM.

In alternative embodiments, there can be a floating-body region can be formed at the second channel end 3802 by changing the mask 3525 placement.

Figure 39B:
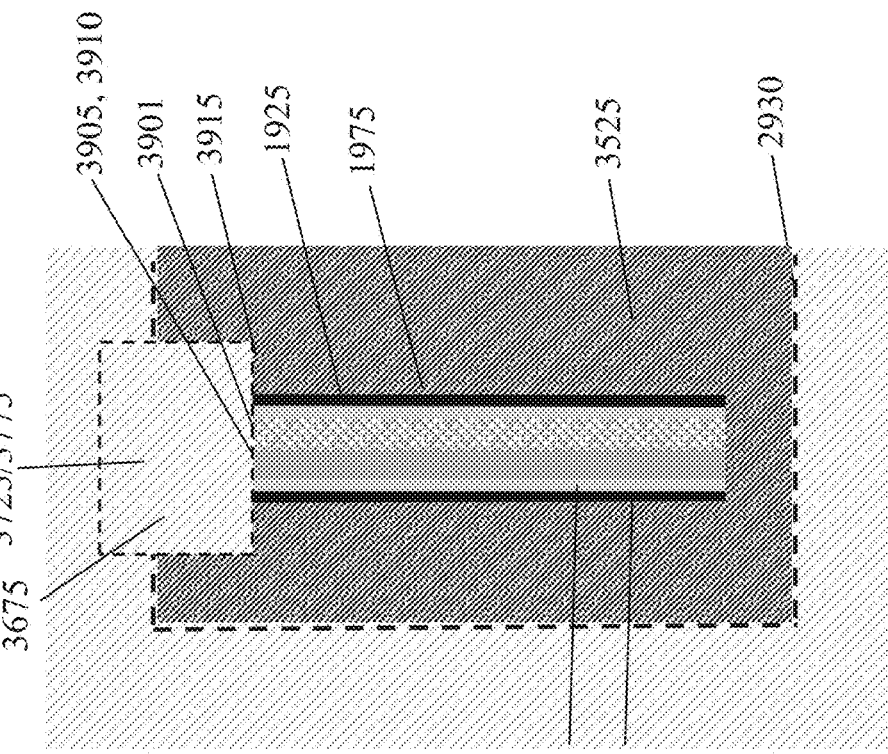
FIG. 39B is a top view at the higher cross section of FIG. 39A.
Figure 39A:
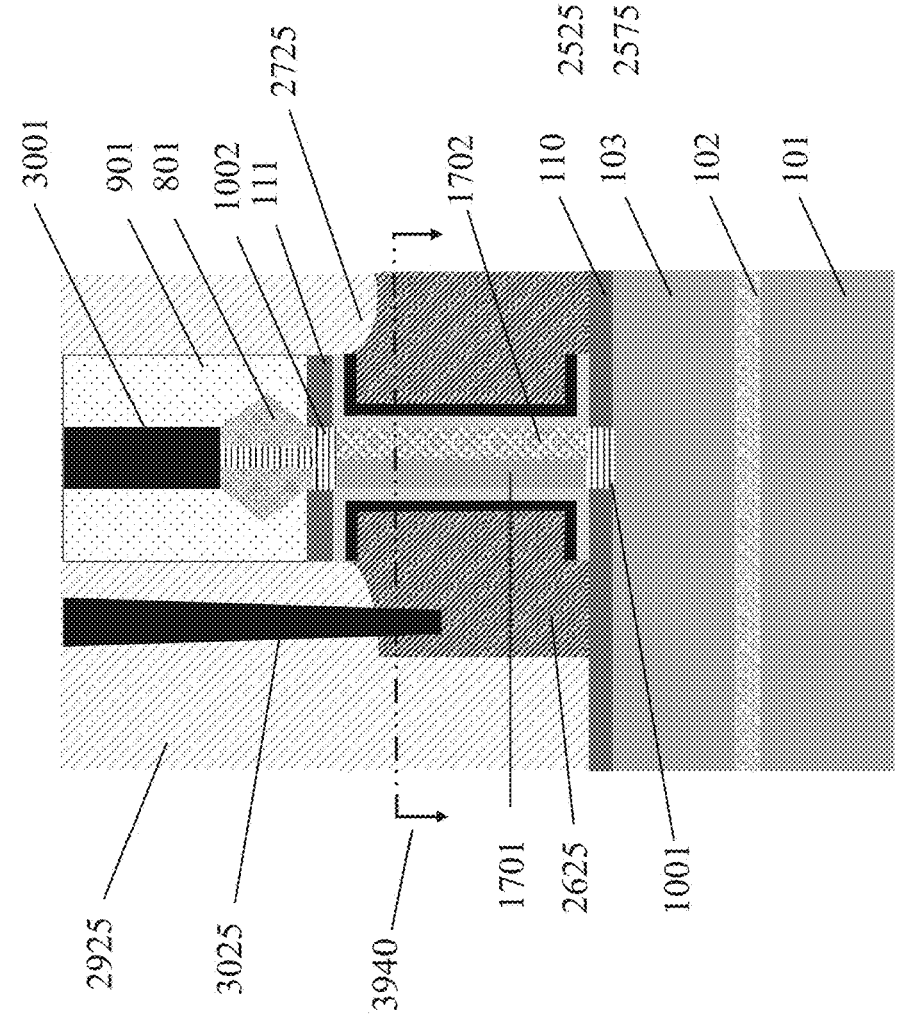

FIG. 39A is a cross section of the device in FIG. 38A with a cross section 3940 at a higher elevation. FIG. 39B is a top view showing the channel and floating-body region at the higher cross section 3940 showing the floating body region 3801 (not shown) covered with dielectric 3725/3775.

Figure 40:
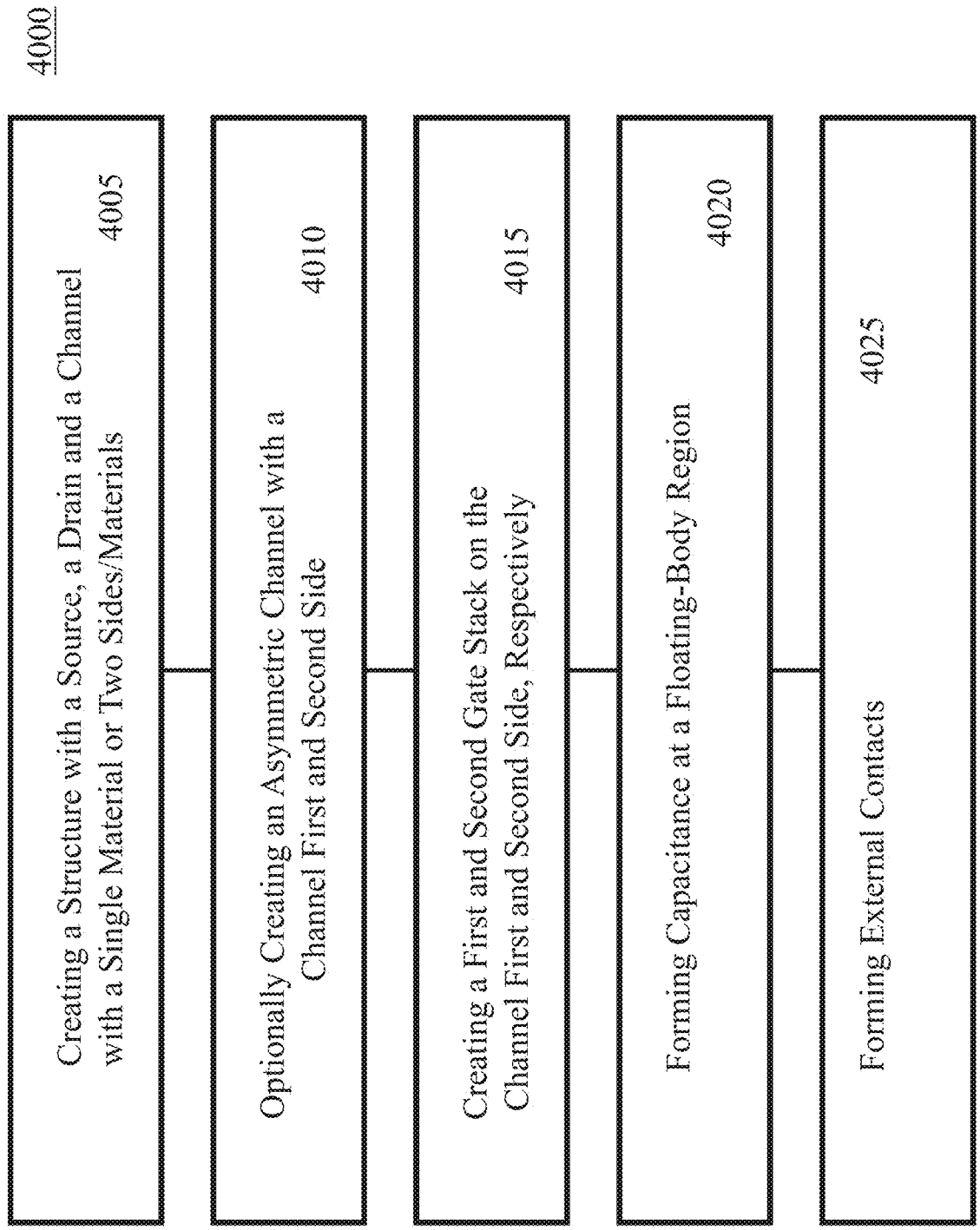
FIG. 40 is a flow chart showing the steps of one embodiment of a method of making the floating-body one transistor dynamic random-access memory (1T DRAM) storage device.

FIG. 40 is a flow chart showing the steps of one embodiment of a method of making 4000 various embodiments of the floating-body one transistor memory storage device.

The method 4000 begins with step 4005 which performs the steps described in FIGS. 1A through 17A where structures with a source 103, drain 801, and channel 501 are made. Embodiments with single material channels 3301 are made by omitting the steps/structures 1600 and 1700 as described in FIGS. 16A, 16B, 17A, and 17B.

In the optional step 4010 the asymmetric channels 1701/1702 are formed by performing the steps and creating the structures 1600/1700 as described in FIGS. 16A, 16B, 17A, and 17B. These asymmetric channels 1701/1702 have a channel first side 1701 and a channel second side 1702. The channel first side 1701 has have first channel work function and the channel second side 1702 has a second channel work function. The materials making the channel first side 1701 and the channel second side 1702 are chosen to be different so that work functions of the channel first 1701 and second 1702 sides will be different. In these asymmetric channel 1701/1702 embodiments, the materials are chosen so that any configuration of the gate stack(s) described below will result in a bias of the first (second) channel side in accumulation and a bias of the second (first) channel side in inversion when a gate bias is applied on the single external gate connection 3025.

In step 4015 different embodiments of gate stacks with a single connection are formed on a first and second side of the channel 1701/1702/3301 as described in FIGS. 18A through 26A and 31A. The first gate stack 2525/2575 has the first high-k dielectric layer 2525 and a first gate metal layer (a second gate working function metal) 2575 and has a first gate work function. The second gate stack 1925/1975 has the second high-k dielectric layer 1925 and a second gate metal layer (a second gate working function metal) 1975 and has a second gate work function.

Non-limiting method steps of creating the first 2525/2575 and second 1925/1975 gate stacks include but are not limited to:

1. Depositing the first high-k dielectric layer 2525 and the second high-k dielectric layer 1925 using the same dielectric material and depositing the first gate metal layer 2575 and second gate metal layer (work function metal) 1975 using the same conductive material.
2. Depositing the first high-k dielectric layer 2525 and the second high-k dielectric layer 1925 using the same dielectric material and depositing the first gate metal layer 2575 and second gate metal layer (work function metal) 1975 using a different same conductive material.
3. Depositing the first high-k dielectric layer 2525 and the second high-k dielectric layer 1925 using a different same dielectric material and depositing the first gate metal layer 2575 and second gate metal layer (work function metal) 1975 using the same conductive material.
4. Depositing the first high-k dielectric layer 2525 and the second high-k dielectric layer 1925 using a different dielectric material and depositing the first gate metal layer 2575 and second gate metal layer (work function metal) 1975 using a different conductive material.

Deposition methods are described above.

In step 4020, capacitance is formed at one of the channel ends in the floating-body region as described in FIGS. 34A through 39A.

In step 4025 voids in the structures are filled and external connections 3001/3025/3030 are made to the source 103, drain 801, and different gate stack embodiments as described in FIGS. 29A, 30A, 32A, and 33A.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A Vertical Field Effect Transistor (VFET) comprising:
a substrate with a horizontal substrate surface;
a semiconductor source disposed on the horizontal substrate surface;
a drain;
a channel with a channel top, a channel bottom, a first channel side, a second channel side, a two channel ends, the channel top connected to the drain, the channel bottom connected to the source, and the channel being vertical and perpendicular to the substrate surface, the channel further having a lateral center surface dividing the channel approximately in half axially, the first channel side being on a first side of the lateral center surface and the second channel side being on a second side of the lateral center surface, the first channel side and the second channel side interfacing one another at the lateral center surface;
a first gate stack interfacing with the first channel side across the first channel side from the lateral center surface;
a second gate stack interfacing with the second channel side across the second channel side from the lateral center surface; and
a single external gate connection electrically connecting the first gate stack and the second gate stack,
wherein a gate bias on the single external gate connection biases the first channel side in accumulation and biases the second channel side in inversion and wherein one of the channel ends is not interfacing with the first gate stack and second gate stack and is a floating body region forming a capacitance, and
wherein the channel, the first gate stack, and the second gate stack are asymmetrical about the lateral center surface.

2. The VFET, as in claim 1, where a VFET voltage threshold difference changes more than 500 millivolts when the gate bias changes from having a bias to having no bias.

3. The VFET, as in claim 1, where the channel first side and the channel second side are made of different materials, the channel first side having a first work function and the channel second side having a second work function.

4. The VFET, as in claim 3, where the channel first side is made of silicon (Si) and the channel second side is made of silicon-germanium (Site).

5. The VFET, as in claim 1, where the first gate stack is made of a first high-k dielectric layer and a first gate metal layer and the second gate stack is made of a second high-k dielectric layer and a second gate metal layer and the first gate metal layer and the second gate metal layer are electrically connected to the single external gate connection.

6. The VFET, as in claim 5, where first gate metal layer and the second gate metal layer are made of the same material and the channel first side and the channel second side are made of different materials, the channel first side having a first work function and the channel second side having a second work function.

7. The VFET, as in claim 5, where first gate metal layer and the second gate metal layer are made of the different materials and the channel first side and the channel second side are made of different materials.

8. The VFET, as in claim 5, where first gate metal layer and the second gate metal layer are made of the different materials and the channel first side and the channel second side are made of the same material.

9. The VFET, as in claim 8, where the channel first side and the channel second side are made of silicon.

10. A one transistor dynamic random access memory (1T DRAM) comprising:
   a Vertical Field Effect Transistor (VFET) comprising:
      a substrate with a horizontal substrate surface;
      a semiconductor source disposed on the horizontal substrate surface;
      a drain;
      a channel with two channel ends, a first channel side, a second channel side, a channel top, and a channel bottom, the channel top connected to the drain, the channel bottom connected to the source, and the channel being vertical and perpendicular to the substrate surface, the channel further having a lateral center surface dividing the channel approximately in half axially, the first channel side being on a first side of the lateral center surface and the second channel side being on a second side of the lateral center surface, the first channel side and the second channel side interfacing one another at the lateral center surface;
      a first gate stack interfacing with the first channel side across the first channel side from the lateral center surface;
      a second gate stack interfacing with the second channel side across the second channel side from the lateral center surface;
      a single external gate connection electrically connecting the first gate stack and the second gate stack; and
      a floating-body region at one of the channel ends, the floating-body region being a capacitance for the 1T DRAM,
   wherein a gate bias on the single external gate connection biases the first channel side in accumulation and biases the second channel side in inversion.

11. The 1T DRAM, as in claim 10, where the threshold voltage difference between the two channel sides is greater than 500 millivolts.

12. The 1T DRAM, as in claim 10, where the single external gate connection is connected to a bit line in a memory circuit.

13. The 1T DRAM, as in claim 10, where a charge stored on the capacitance represents a first memory state and no charge on the capacitance represents a second memory state.

14. The 1T DRAM, as in claim 10, where the channel first side and the channel second side are made of different materials, the channel first side having a first work function and the channel second side having a second work function.

15. The 1T DRAM, as in claim 10, where the first gate stack is made of a first high-k dielectric layer and a first gate metal layer and the second gate stack is made of a second high-k dielectric layer and a second gate metal layer and the first gate metal layer and the second gate metal layer are electrically connected to the single external gate connection.

16. The 1T DRAM, as in claim 15, where first gate metal layer and the second gate metal layer are made of the same material and the channel first side and the channel second side are made of different materials.

17. The VFET, as in claim 15, where first gate metal layer and the second gate metal layer are made of the different materials and the channel first side and the channel second side are made of different materials.

18. The WET, as in claim 15, where first gate metal layer and the second gate metal layer are made of the different materials and the channel first side and the channel second side are made of the same material.

19. A method of making a Vertical Field Effect Transistor (VFET) comprising the steps of:
   creating a semiconductor structure with a source, a drain, and a vertical channel, the vertical channel having two channel ends, a channel top connected to the drain, and a channel bottom connected to the source;
   making the vertical channel asymmetric by forming the first channel side with a first material and forming the second channel side with a second material, a lateral center
   surface dividing the channel approximately in half axially, the first channel side being on a first side of the lateral center surface and the second channel side being on a second side of the lateral center surface, where the first and second material are different;
   forming a first gate stack interfacing with the first channel side;
   forming a second gate stack interfacing with the second channel side;
   forming a capacitance at a floating body region at one of the channel ends; and
   making a single external gate connection to the first gate stack and the second gate stack.

20. The method, as in claim 19 where the first gate stack is made of a first high-k dielectric layer and a first gate metal layer and the second gate stack is made of a second high-k dielectric layer and a second gate metal layer and the first gate metal layer and the second gate metal layer are electrically connected to the single external gate connection.

* * * * *